(12) United States Patent
Ohnuma et al.

(10) Patent No.: US 7,259,110 B2
(45) Date of Patent: Aug. 21, 2007

(54) MANUFACTURING METHOD OF DISPLAY DEVICE AND SEMICONDUCTOR DEVICE

(75) Inventors: Hideto Ohnuma, Kanagawa (JP); Kiyofumi Ogino, Kanagawa (JP); Teruyuki Fujii, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 170 days.

(21) Appl. No.: 11/114,870

(22) Filed: Apr. 26, 2005

(65) Prior Publication Data

US 2005/0245078 A1 Nov. 3, 2005

(30) Foreign Application Priority Data

Apr. 28, 2004 (JP) .............................. 2004-134719

(51) Int. Cl.
*H01L 21/31* (2006.01)
*H01L 21/469* (2006.01)

(52) U.S. Cl. ...................... 438/782; 438/197; 438/584; 438/763; 257/E21.051; 257/E21.091; 257/E21.632

(58) Field of Classification Search ................ 438/782, 438/30, 70, 75, 91, 149, 197, 584, 585, 586, 438/589, 590, 311, 637, 700, 672, 673, 680, 438/706
See application file for complete search history.

(56) References Cited

U.S. PATENT DOCUMENTS 5,453,406 A * 9/1995 Chen ........................ 438/763

5,747,383 A * 5/1998 Chen et al. ................. 438/648
6,538,390 B2 * 3/2003 Fujita et al. ............. 315/169.3
6,710,387 B2 * 3/2004 Nakamura ................... 257/296
7,144,819 B2 * 12/2006 Sato et al. ................... 438/700
2002/0113248 A1 * 8/2002 Yamagata et al. .......... 257/187
2005/0045891 A1 * 3/2005 Yamazaki et al. ............. 257/72

FOREIGN PATENT DOCUMENTS

| JP | 10-010535 | 1/1998 |
|---|---|---|
| JP | 2002-363412 | 12/2002 |
| JP | 2003-264137 | 9/2003 |

* cited by examiner

*Primary Examiner*—David Nhu
(74) *Attorney, Agent, or Firm*—Cook, Alex, McFarron, Manzo, Cummings & Mehler, Ltd.

(57) ABSTRACT

It is an object of the present invention to improve the surface planarity of a film by uniforming the thickness of an insulating layer. Further, it is another object of the invention to provide a technology for manufacturing an electronic device typified by a high-definition and high-quality display device with high yield at low cost with the use of the insulating layer. In a method for manufacturing a semiconductor device according to the invention, a semiconductor layer is formed; an insulating layer is formed over the semiconductor layer; a wiring layer connected to the semiconductor layer is formed in an opening provided in the insulating layer; and an electrode layer connected to the wiring layer is formed. The insulating layer is formed by spin coating with a composition containing an insulating material, which has a viscosity of from 10 mPa·s to 50 mPa·s.

28 Claims, 24 Drawing Sheets

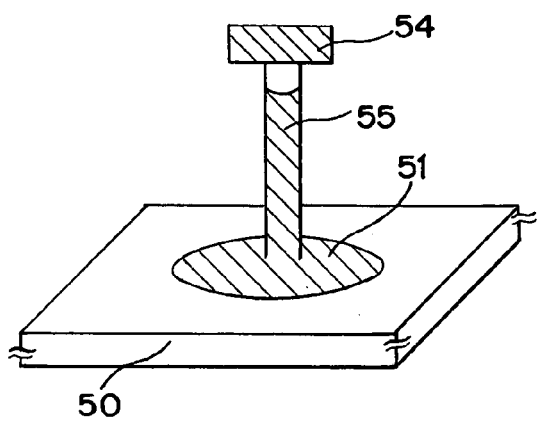
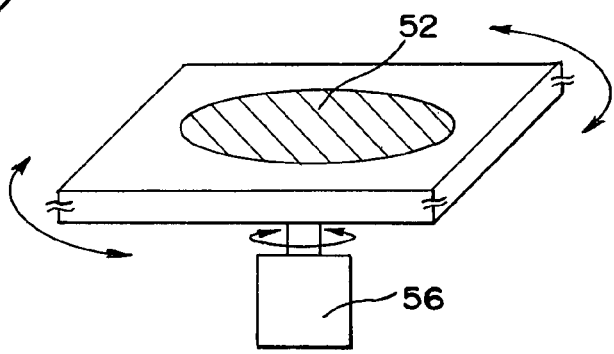
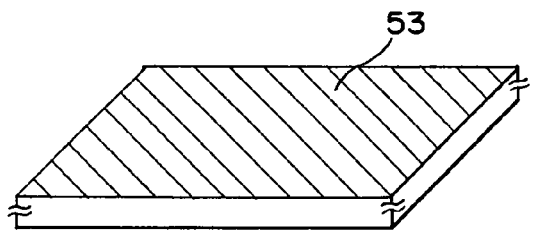
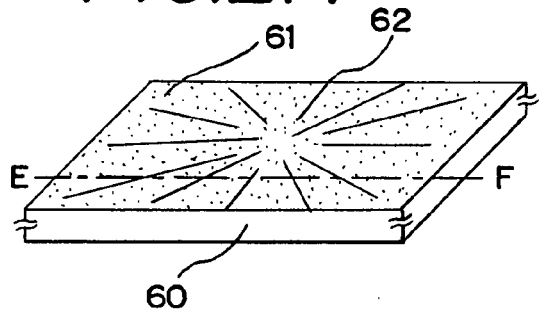
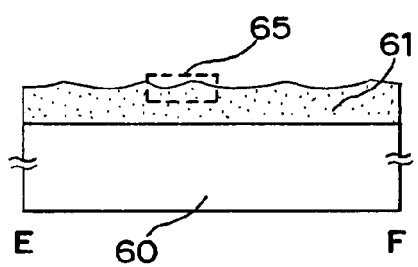

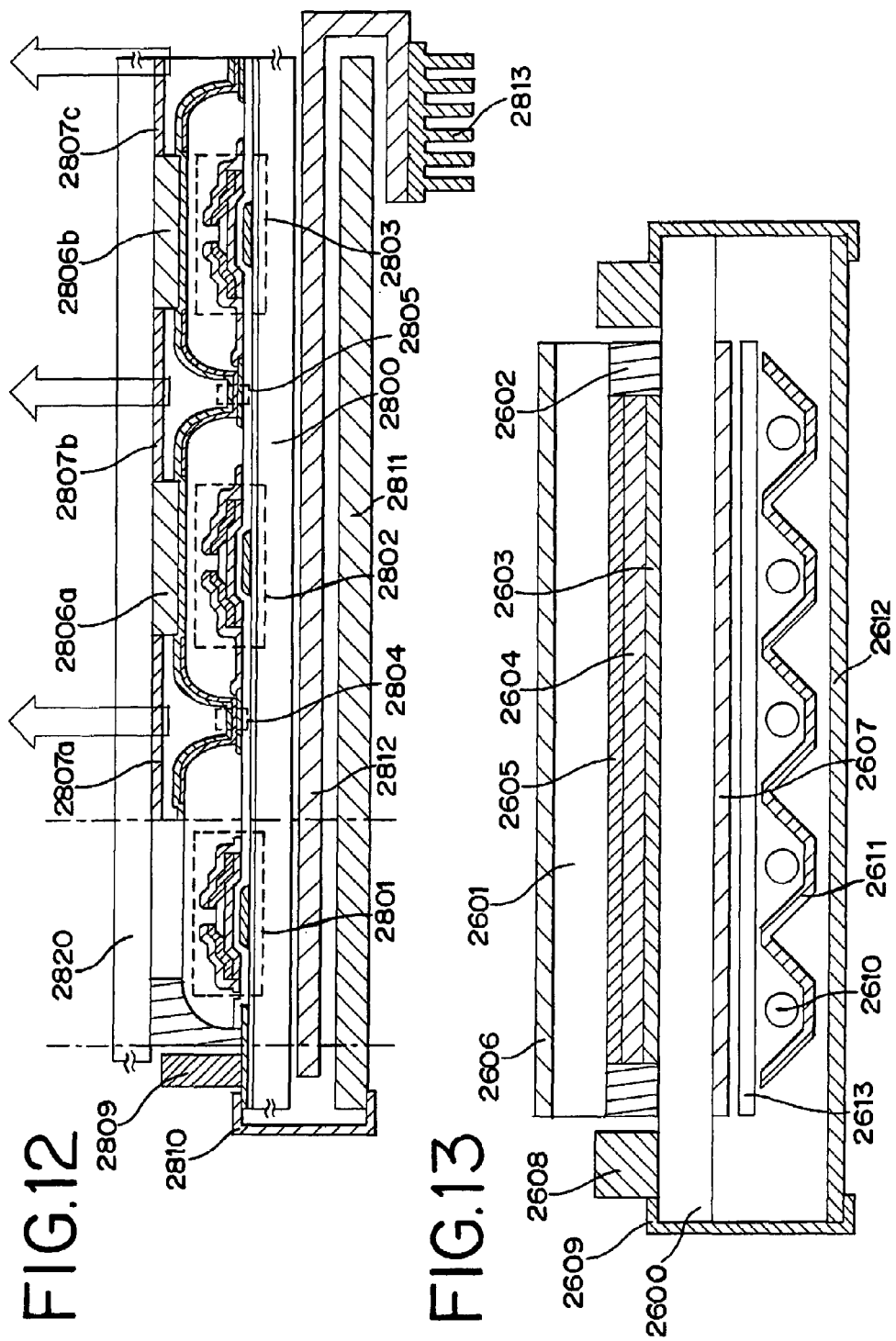

SPIN COATER

EDGE REMOVER

NOZZLE PORTION

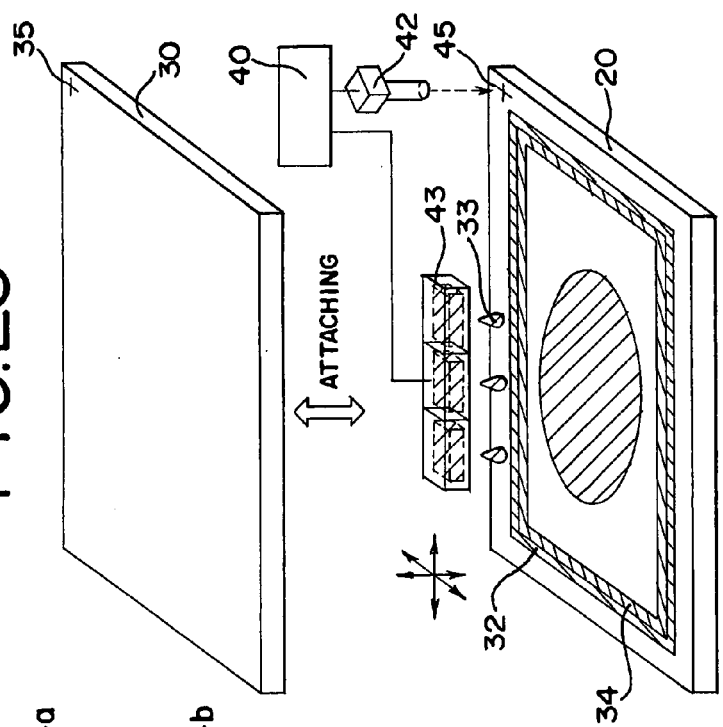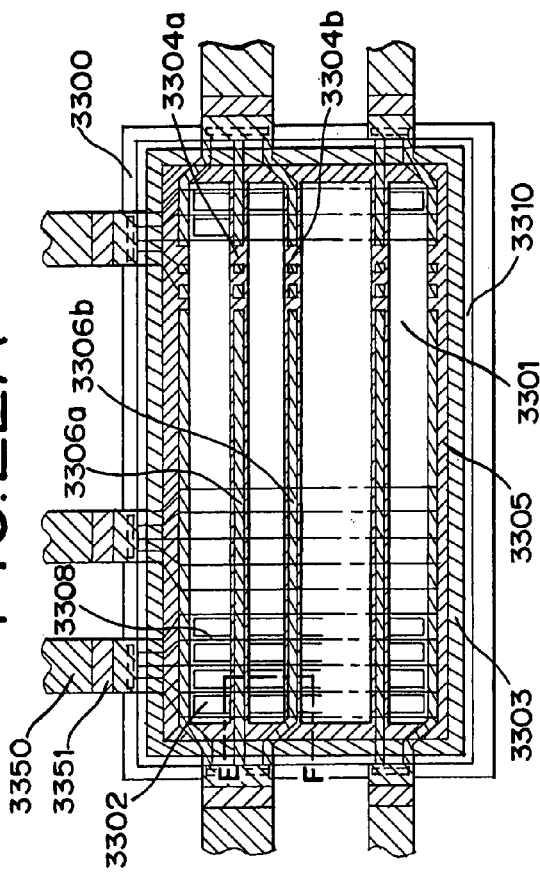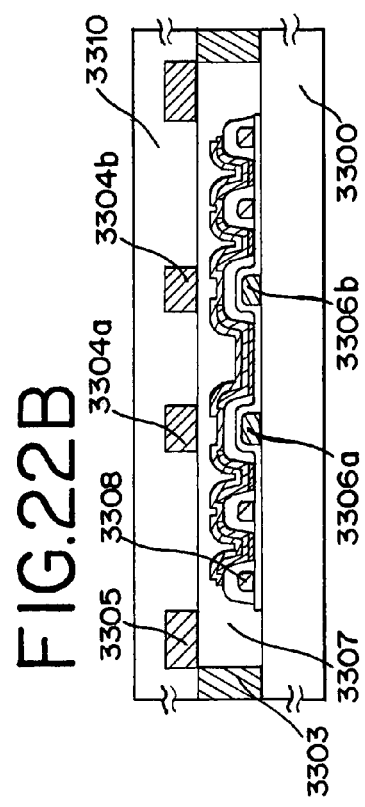

MANUFACTURING METHOD OF DISPLAY DEVICE AND SEMICONDUCTOR DEVICE

BACKGROUND OF THE INVENTION

1. Field of the Invention

The present invention relates to a manufacturing method of a semiconductor device and a display device.

2. Description of the Related Art

A wiring circuit, a thin film transistor (hereinafter referred to as a TFT), a display device and an electronic circuit using the same are manufactured by stacking various patterns such as a semiconductor layer, an insulating layer, and a conductive layer over a substrate. As a method for forming a film pattern for an interlayer film and a planarizing film, a coating method such as spin coating where a film can be formed by coating a surface with an insulating material, or the like can be used. As to a film formed as a planarizing film, the film is required to have uniform thickness and good surface planarity. Accordingly, technologies for forming a film with good thickness distribution are studied (for example, see Reference 1: Japanese Patent Laid-Open No. 2003-264137).

In Reference 1, a coating formed over a substrate by spin coating is heated in vacuum, and the film is cooled in vacuum after drying the solvent (flux) in order to prevent the thickness distribution and surface roughness from getting worse.

BRIEF SUMMARY OF THE INVENTION

It is an object of the present invention to improve a film (layer) to have uniform thickness and surface planarity without using complicated steps and apparatuses. Further, it is another object of the invention to provide a technology for manufacturing an electronic device typified by a high-definition and high-quality display device with high yield at low cost with the use of the film (layer).

An insulating layer formed by using the invention is formed by a coating method for coating with materials containing liquid. An insulating material is diluted in a liquid component, such as solvent (flux), to make a liquid composition containing an insulating material as a coating material solution. An insulating layer is formed by discharging (including spraying and dropping) the coating material solution from an application apparatus to attach and apply the coating material solution to the region in which the insulating layer is formed. A film (layer) to be eventually formed is an insulating layer that has insulating properties; accordingly, the coating material solution in liquid form which is used in the formation process may not show insulating properties. The shape of the insulating layer is greatly affected by manufacturing conditions of the composition containing an insulating material. The applicant found a method for forming a composition containing an insulating material with which the insulating layer can be formed with uniform thickness and a highly planar surface. An insulating layer of the invention is formed by spin coating according to a coating method with a composition containing an insulating material with a viscosity of 10 mPa·s (cP) to 50 mPa·s (cP), preferably, 20 mPa·s (cP) to 35 mPa·s (cP). The insulating layer (film) obtained by the invention has uniform thickness distribution and the surface thereof is highly planar.

Note that a semiconductor device in this specification means a device which can function with semiconductor properties. A multilayer wiring layer or an interlayer insulating layer of a semiconductor device such as an ID chip can be formed and used according to the invention.

Further, a planarizing film of a display device can be formed and used according to the invention. A display device according to the invention includes a light emitting display device including a TFT connected to a light emitting element in which an organic matter or a medium including a mixture of an organic matter and an inorganic matter producing luminescence referred to as electroluminescence (hereinafter also referred to as "EL") is interposed between electrodes, a liquid crystal display device in which a liquid crystal element having a liquid crystal material is used as a display element.

As to a method for manufacturing a semiconductor device according to the invention, a semiconductor layer is formed; an insulating layer is formed over the semiconductor layer; a wiring layer connected to the semiconductor layer is formed in an opening provided in the insulating layer; and an electrode layer connected to the wiring layer is formed. The insulating layer is formed by spin coating with a composition containing an insulating material, which has a viscosity of from 10 mP.s to 50 mP.s.

As to a method for manufacturing a semiconductor device according to the invention, a semiconductor layer is formed; a first insulating layer is formed over the semiconductor layer; a wiring layer connected to the semiconductor layer is formed in a first opening provided in the first insulating layer; a second insulating layer is formed over the first insulating layer and the wiring layer; and an electrode layer connected to the wiring layer is formed in a second opening provided in the second insulating layer. Each of the first and the second insulating layers is formed by spin coating with a composition containing an insulating material, which has a viscosity of from 10 mP.s to 50 mP.s.

As to a method for manufacturing a display device according to the invention, a semiconductor layer is formed; an insulating layer is formed over the semiconductor layer; a wiring layer connected to the semiconductor layer is formed in an opening provided in the insulating layer; and an electrode layer connected to the wiring layer is formed. The insulating layer is formed by spin coating with a composition containing an insulating material, which has a viscosity of from 10 mP.s. to 50 mP.s.

As to a method for manufacturing a display device according to the invention, a semiconductor layer is formed; a first insulating layer is formed over the semiconductor layer; a wiring layer connected to the semiconductor layer is formed in a first opening provided in the first insulating layer; a second insulating layer is formed over the first insulating layer and the wiring layer; and an electrode layer which functions as a pixel electrode and is connected to the wiring layer is formed in a second opening in the second insulating layer. Each of the first and the second insulating layers is formed by spin coating with a composition containing an insulating material, which has a viscosity of from 10 mPa·s to 50 mPa·s.

In the above structure, the electrode layer formed over the insulating layer can be used as a pixel electrode layer. If an electroluminescent layer is formed over the pixel electrode layer, a light emitting display device can be manufactured, and if a liquid crystal element including a liquid crystal layer is formed instead, a liquid crystal display device can be manufactured.

A semiconductor device according to the invention includes an insulating layer containing a siloxane polymer formed of a composition containing an insulating material with a viscosity of 10 mPa·s to 50 mPa·s. The insulating layer has a thickness of 0.1 μm to 10 μm.

A semiconductor device according to the invention includes an insulating layer formed of a siloxane polymer including a composition containing an insulating material with a viscosity of from 10 mPa·s to 50 mPa·s. The insulating layer has a thickness of 0.1 μm to 10 μm, and the average of film thickness difference is 1.3 nm or less in case that the film is formed on a flat surface.

A display device according to the invention includes an insulating layer containing a siloxane polymer formed from a composition containing an insulating material with a viscosity of 10 mPa·s to 50 mPa·s. The insulating layer has a thickness of 0.1 μm to 10 μm.

A display device according to the invention includes an insulating layer containing a siloxane polymer formed from a composition containing an insulating material with a viscosity of 10 mPa·s to 50 mPa·s. The insulating layer has a thickness of 0.1 μm to 10 μm, and the average of film thickness difference is 1.3 nm or less in case that the film is formed on a flat surface.

A display device with a display function which is manufactured according to the invention can be used for a display screen of a television device.

According to the invention, the thickness of an insulating layer (film) can be made uniform, thereby improving the planarity of the insulating layer surface. Consequently, an electronic device typified by a high-definition and high-quality display device can be manufactured with high yield at low cost using the insulating layer.

BRIEF DESCRIPTION OF THE DRAWING

FIGS. 1A to 1C are figures for explaining the present invention.

FIGS. 2A and 2B are figures which show a conventional embodiment.

FIG. 12 is a cross-sectional view of a structural example of an electroluminescent display module of the invention.

FIG. 13 is a cross-sectional view of a structural example of a liquid crystal display module of the invention.

FIGS. 22A and 22B are a top view and a cross-sectional view of a structural example of an electroluminescent display module of the invention.

FIG. 23 is a figure showing a liquid crystal droplet discharge method which is applicable to the invention.

DETAILED DESCRIPTION OF THE INVENTION

Figure 3A:
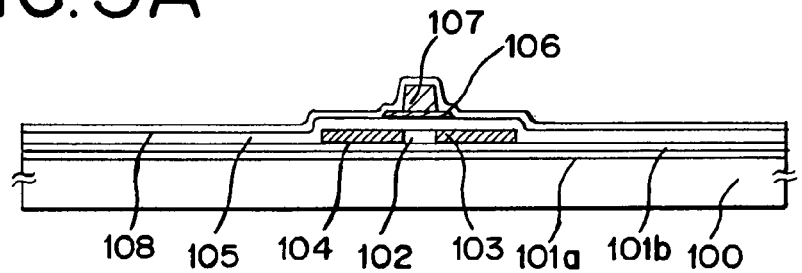
FIGS. 3A to 3D are figures showing a manufacturing method of a display device of the invention.
Figure 3B:
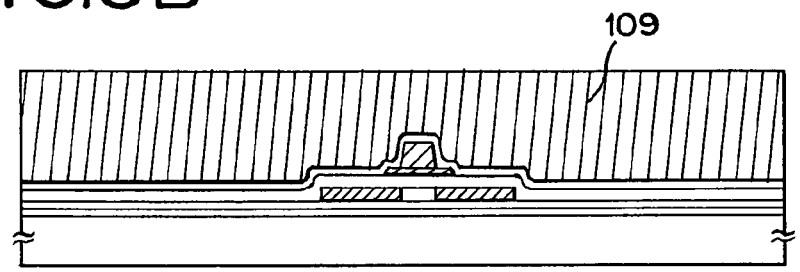

Embodiment Modes and Example of the present invention will be described in detail with reference to the accompanying drawings. However, the invention is not limited to the following description and it is easily understood by those skilled in the art that various changes and modifications are possible, unless such changes and modifications depart from the content and the scope of the invention. Therefore, the invention is to be interpreted without limitation to the description in Embodiment Modes and the Example shown below. Note that, in the structure of the invention described hereinafter, the same reference numerals denote the same parts or parts having the similar functions in different drawings and the explanation will not be repeated.

EMBODIMENT MODE 1

In this embodiment mode, an insulating material is diluted in liquid, such as a solvent, to make a composition containing an insulating material for forming an insulating layer (film). The composition is applied (by discharging, spraying, dropping, or the like) onto a region to form an insulating film.

In this embodiment mode, spin coating is used as an application method. As to an insulating layer formed by such an application method, nonuniformity of the thickness distribution may be caused or minute irregularities may be formed in the surface thereof; thus, the planarity may be reduced. When light is reflected by such irregularities and interfered on the surface of an insulating layer, radial or striped unevenness (interference fringes) in accordance with the irregularities is generated in the surface of the insulating layer. As to the unevenness due to planarity defect, even minute irregularities can be observed as the frequency range is narrow. For example, when light from a sodium lamp, which has almost a single wavelength is applied, unevenness (interference fringes) due to the minute irregularities which can not be visually seen can be observed.

Schematic diagrams of radial unevenness (interference fringes) due to the irregularities of the insulating layer surface are shown in FIGS. 2A and 2B. FIG. 2A is a perspective diagram, and FIG. 2B is a cross-sectional view taken along line E-F in FIG. 2A. An insulating layer 61 is formed over a substrate 60, and an irregularity portion 65 is provided in the surface of the insulating layer 61. Radial unevenness (interference fringes) 62 due to the reflection or interference of light is caused by the irregularity portion 65 in the surface of the insulating layer 61. When irregularities are formed in the surface of an insulating layer as shown in FIGS. 2A and 2B, if such an insulating layer is used as an interlayer film or a planarizing film, the coverage of another film formed in contact therewith may not be high and that may cause formation defect. Further, as to a display device, in the case of applying the insulating layer as a planarizing film, the shape of the irregularities is reflected on a pixel electrode layer to be formed thereover; thus, the surface of the pixel electrode layer would also have irregularities. When light is emitted for display, the light may scatter or interfere due to the irregularities; thereby causing display unevenness.

As described above, in the invention, an insulating layer is formed in a formation area by applying a composition containing an insulating material diluted in liquid, such as a solvent, in liquid form in order to control the thickness or the formation area. Then, the liquid in the composition is eliminated by drying or heating to form the insulating layer. Marangoni convection is thought to be a major cause of such nonuniformity of the thickness distribution of the insulating layer. The Marangoni convection is generated due to nonuniformity of surface tension on the liquid insulating material applied to the formation area by discharging, spraying, dropping, or the like. The surface tension varies in accordance with the temperature or the chemical composition (impurity concentration or the like) of the fluid of the composition containing an insulating material. When the liquid in the composition containing an insulating material is vaporized, temperature difference is caused in the composition, and surface tension difference is caused accordingly. If the surface tension difference exceeds the viscosity, a flow (convection) is generated in the fluid and the composition containing an insulating material and deformed into the shape to reflect the convection in the film thickness direction, or the surface direction (the direction parallel to the plane). Consequently, the film thickness distribution of the insulating layer to be formed becomes nonuniform and irregularities are formed in the surface of the insulating layer, which results in poor planarity.

Marangoni convection in a fluid is expressed in Marangoni number and defined by Formula 1. In Formula 1, Ma is Marangoni number, $\sigma$ is surface tension, T is temperature, $\mu$ is viscosity, $\alpha$ is thermal conductivity, h is film thickness, $\Delta T$ is temperature distribution in the fluid.

$$Ma = \left[\frac{\partial \sigma}{\partial T}\right]\frac{\Delta T \cdot h}{\mu \cdot \alpha} \qquad \text{[Formula 1]}$$

As the value of Marangoni number is smaller, Marangoni convection is suppressed. Therefore, it is important to lower the Marangoni number for uniforming the thickness distribution. Marangoni number is determined by the surface tension difference caused by the temperature gradient in the fluid that is a liquid composition containing an insulating material, the viscosity and thermal conductivity of the fluid, the length of the fluid (film thickness of an insulating layer in the invention) as shown in Formula 1. Surface intensity difference and the length (thickness) of the fluid that are factors in increasing Marangoni number are reduced for reducing Marangoni number. Here, the surface intensity difference can be reduced by lowering the temperature difference. Further, Marangoni number is reduced by increasing viscosity and thermal conductivity that are factors in reducing Marangoni convection.

The applicant found the optimum viscosity of the composition containing an insulating material for forming a desired insulating layer with good planarity. The composition containing an insulating material to be applied includes an insulating material and a liquid component. The viscosity can be controlled to be high by increasing the concentration of a nonvolatile component (insulating material) in the composition containing an insulating material and to be low by reducing the concentration of the nonvolatile component (insulating material). The viscosity can be controlled to be higher or lower also by changing the material of the liquid component for diluting the insulating material (changing the boiling point of the liquid component or the like).

In the invention, the viscosity of the composition containing an insulating material is set at 10 mPa·s (cP) to 50 mPa·s (cP), preferably, 20 mPa·s (cP) to 35 mPa·s (cP). The film thicknesses may be 1 μm to 10 μm, preferably, 0.2 μm to 5 μm. When a composition containing an insulating material with the above viscosity, the insulating layer having a highly planar surface with uniform thickness distribution, where even minute irregularities on the surface are reduced, can be formed. The surface of an insulating layer formed with a viscosity within the range set in the invention has high planarity such that unevenness (interference fringes) is not confirmed even if the insulating layer is exposed to even single color light, with which even the surface roughness due to minute irregularities can be observed as unevenness (interference fringes).

A composition 55 containing an insulating material is discharged from a discharge device 54 to a substrate 50 (FIG. 1A). The viscosity of the compound 55 containing an insulating material is at 10 mPa·s (cP) to 50 mPa·s (cP), preferably, 20 mPa·s (cP) to 35 mPa·s (cP).

The substrate 50 onto which a composition 51 containing an insulating material is discharged is fixed to a spinning base having a motor 56, and is spun (FIG. 1B). The composition 52 containing an insulating material is spread over the substrate 50 by spinning. Thereafter, an insulating layer 53 is formed by baking or drying.

The insulating layer formed in this embodiment mode has uniform film thickness distribution, and extremely high surface planarity.

In the invention, in forming a liquid composition containing an insulating material, the viscosity can be controlled by selecting the concentration of the nonvolatile component (insulating material) and the melting point of the insulating material or the like. Therefore, a large vacuum apparatus or a large heating apparatus is not required; further, time and cost can be reduced. According to the invention, a highly planar insulating layer with uniform thickness distribution can be formed through a simple process with high yield.

EMBODIMENT MODE 2

A manufacturing method of a display device will be described in details with reference to FIGS. 3A to 5 and FIGS. 14A to 15B.

Figure 14A:
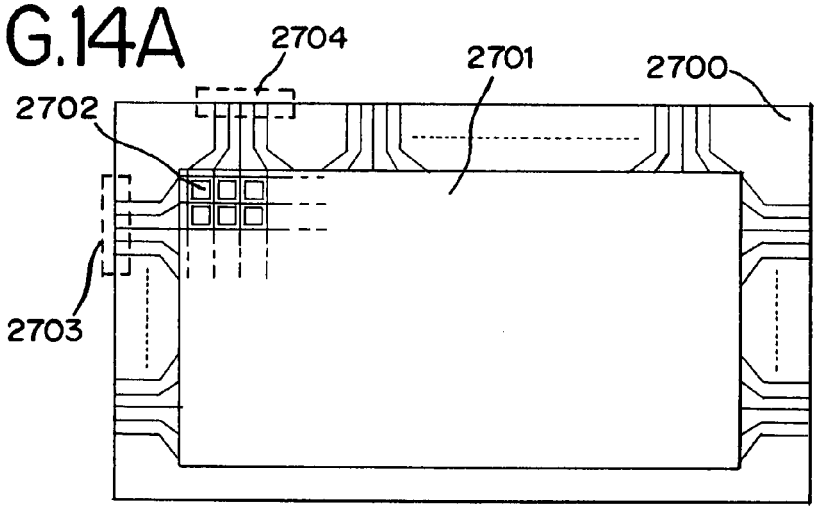
FIGS. 14A to 14C are top views of a display device of the invention.

FIG. 14A is a top view showing a structure of a display panel according to the invention. A pixel area 2701 in which pixels 2702 are arranged in matrix, a scan line input terminal 2703, and a signal line input terminal 2704 are formed over a substrate 2700 having an insulating surface. The number of the pixels may be determined in accordance with various standards (parameters). The number of pixels of XGA may be 1024×768×3 (RGB), that of UXGA may be 1600×1200×3 (RGB), and that of a full-spec high vision may be 1920×1080×3 (RGB).

The pixels 2702 are arranged in matrix by intersecting a scan line extended from the scan line input terminal 2703 and a signal line extended from the signal line input terminal 2704. Each of the pixels 2702 is provided with a switching element and a pixel electrode layer connected thereto. A typical example of the switching element is a TFT. The gate electrode layer of the TFT is connected to the scan line, and the source or drain thereof is connected to the signal line, which enables each pixel to be controlled independently by a signal input from outside.

The TFT includes a semiconductor layer, a gate insulating layer, and a gate electrode layer as its main components. A wiring layer connected to a source or drain region formed in the semiconductor layer is also included in the TFT. A top gate type in which a semiconductor layer, a gate insulating layer, and a gate electrode layer are arranged from the substrate side, a bottom gate type in which a gate electrode layer, a gate insulating layer, and a semiconductor layer are arranged from the substrate side, and the like are known as typical structure of a TFT. Any one of the structures may be applied to the invention.

Figure 15A:
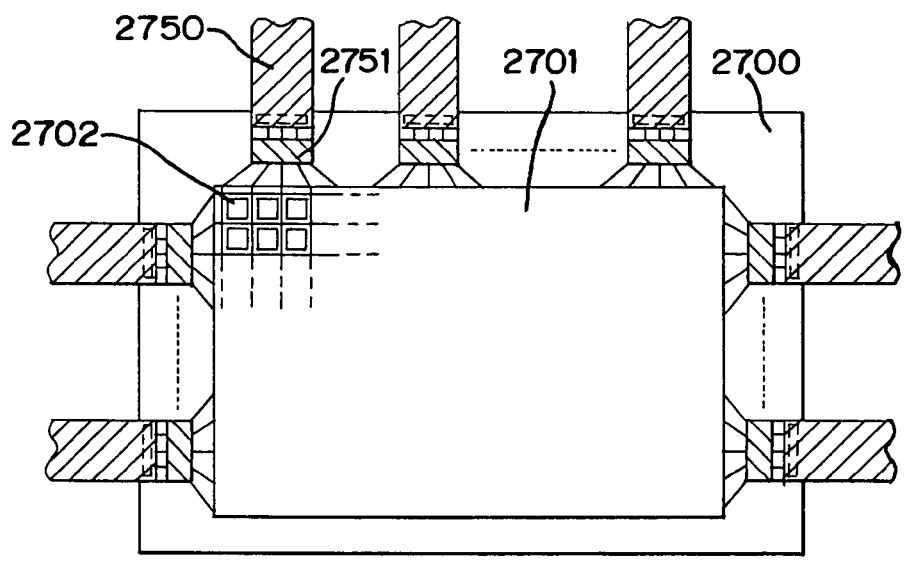
FIGS. 15A and 15B are top views of a display device of the invention.
Figure 15B:
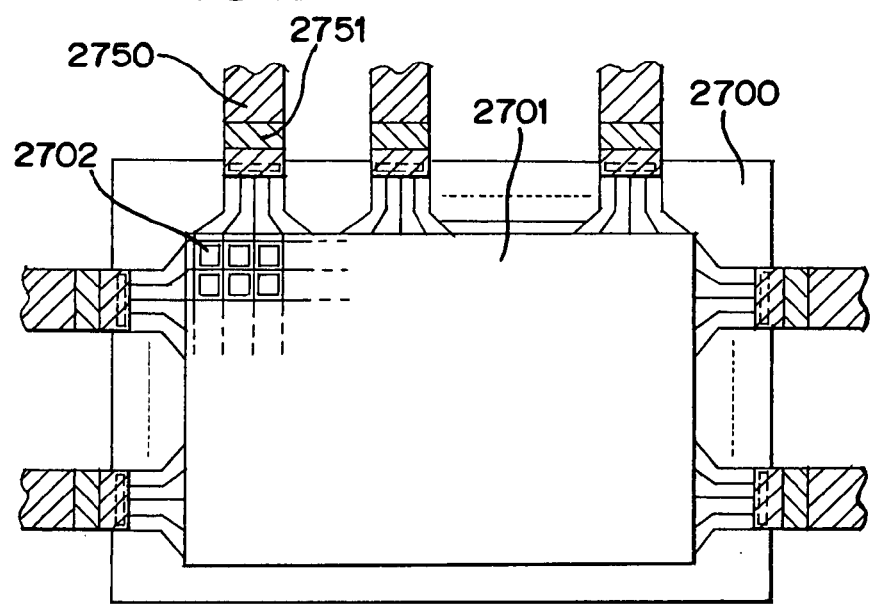

FIG. 14A shows a structure of a display panel in which a signal to be input to a scan line and a signal line is controlled by an external driver circuit. Alternatively, a driver IC 2751 may be mounted on a substrate 2700 by COG (Chip on Glass) method as shown in FIG. 15A. As another mounting mode, TAB (Tape Automated Bonding) may be also used as shown in FIG. 15B. The driver IC may be formed over a single crystal semiconductor substrate or may be formed with a TFT, over a glass substrate. In FIGS. 15A and 15B, a driver IC 2751 is connected to an FPC (Flexible Printed Circuit) 2750.

Figure 14B:
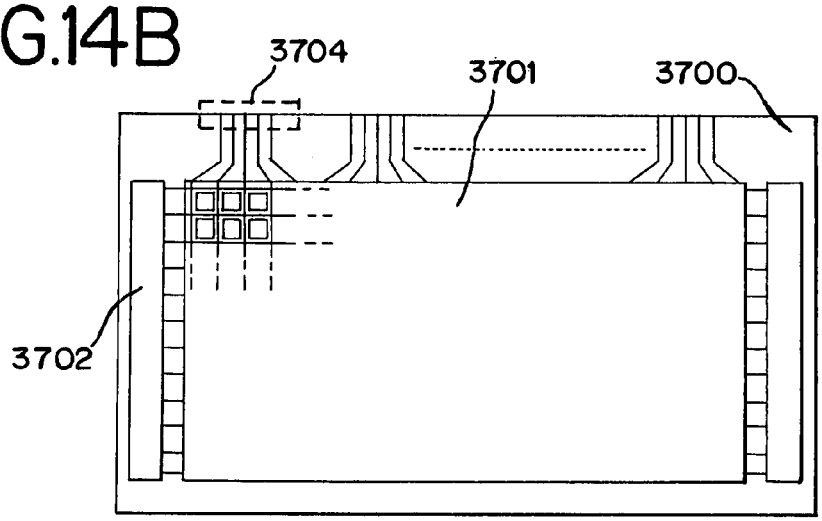
Figure 14C:
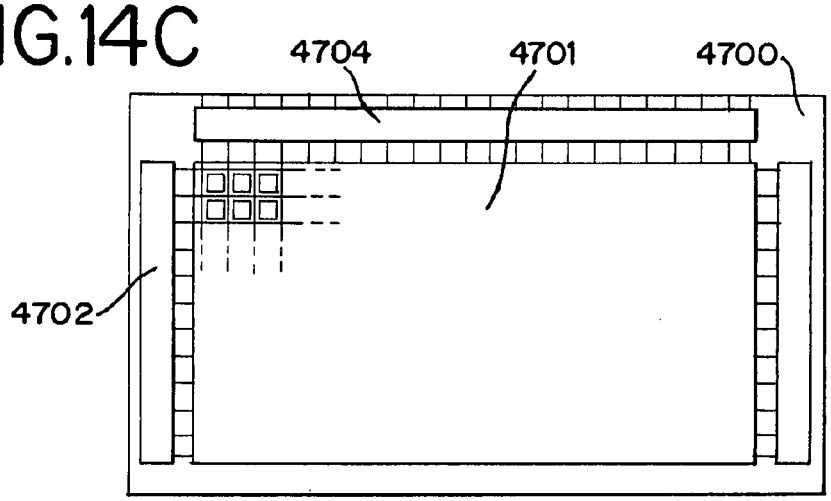

When a TFT provided in a pixel is formed of a SAS, a scan line driver circuit 3702 may be integrally formed over a substrate 3700 as shown in FIG. 14B. In FIG. 14B, a pixel area 3701 is controlled by an external driver circuit which is connected to a signal line input terminal 3704 in the same manner as in FIG. 14A. When a TFT provided in a pixel is formed of a polycrystalline (microcrystalline) semiconductor, a single crystal semiconductor, or the like having high electron mobility, a pixel area 4701, a scan line driver circuit 4702 and a signal line driver circuit 4704 can be integrally formed over a substrate 4700 as shown in FIG. 14C.

A base film 101a is formed using a silicon nitride oxide (SiNO) film to a thickness of 10 to 200 nm (preferably, 50 to 100 nm) by sputtering, LPCVD, or plasma CVD, or the like over the substrate 100 having an insulating surface. Further, a base film 101b is formed thereover using a silicon oxynitride film (SiON) to a thickness of 50 to 200 nm (preferably, 100 to 150 nm). In this embodiment mode, the base film 101a and the base film 101b are formed by plasma CVD. A glass substrate, a quartz substrate, a silicon substrate, a metal substrate, or a stainless steel substrate where an insulating film is formed over the surface thereof may be used as the substrate 100. Alternatively, a plastic substrate or a flexible substrate like a film which is resistant to the processing temperature of this embodiment mode may be used. Further, a two-layer structure may be used for a base film, or a single layer structure or a layered structure having two or more layers with the used of base (insulating) film (s) may be used.

Next, a semiconductor layer is formed over the base film. The semiconductor layer may be formed to a thickness of 25 to 200 nm (preferably, 30 to 150 nm) by known technique (sputtering, LPCVD, plasma CVD, or the like).

An amorphous semiconductor (hereinafter also referred to as a "AS") manufactured by a vapor phase growth method or sputtering using a semiconductor material gas typified by silane or germane; a polycrystalline semiconductor that is formed by crystallizing the amorphous semiconductor by utilizing light energy or thermal energy; a semiamorphous (also referred to as microcrystalline or microcrystal) semiconductor (hereinafter also referred to as a "SAS"); or the like can be used as a material for forming the semiconductor layer.

The SAS is a semiconductor having an intermediate structure between an amorphous structure and a crystalline structure (including a single crystal and a polycrystal) and having a third state which is stable in terms of free energy, and includes a crystalline region having short-range order and lattice distortion. A crystalline region of 0.5 nm to 20 nm can be observed in at least a part of the film. When silicon is contained as the main component, a Raman spectrum is shifted to a lower frequency side than 520 $cm^{-1}$. A diffraction peak of (111) or (220) to be caused by a crystal lattice of silicon is observed in X-ray diffraction. Hydrogen or halogen of at least 1 atomic % or more is contained to terminate a dangling bond. The SAS is formed by glow discharge decomposition (plasma CVD) of a silicide gas. $SiH_4$ is used as a typical silicide gas. In addition, $Si_2H_6$, $SiH_2Cl_2$, $SiHCl_3$, $SiCl_4$, $SiF_4$, or the like can also be used as the silicide gas. Further, $F_2$ or $GeF_4$ may be mixed. This silicide gas may be diluted with $H_2$, or $H_2$ and one or more rare gas elements selected from He, Ar, Kr, and Ne. The dilution ratio ranges from 1:2 to 1:1000. The pressure ranges approximately from 0.1 Pa to 133 Pa, and the power frequency ranges from 1 MHz to 120 MHz, preferably from 13 MHz to 60 MHz. The substrate heating temperature may be 300° C. or less, and the film can also be formed according to a substrate heating temperature of 100° C. to 200° C. It is desirable that an atmospheric constituent impurity such as oxygen, nitrogen, or carbon is $1×10^{20}$ $atoms/cm^3$ or less as an impurity element in the film; specifically, an oxygen concentration is $5×10^{19}$ $atoms/cm^3$ or less, preferably $1×10^{19}$ $atoms/cm^3$ or less. A preferable SAS can be obtained by further promoting lattice distortion by adding a rare gas element such as helium, argon, krypton, or neon to enhance stability. Additionally, a SAS layer formed from a gas containing hydrogen may be stacked over a SAS layer formed from a gas containing fluorine to form a semiconductor layer.

Hydrogenated amorphous silicon may be typically used as an amorphous semiconductor, and polysilicon may be typically used as a crystalline semiconductor. Polysilicon (polycrystalline silicon) includes a so-called high temperature polysilicon using polysilicon which is formed at a temperature of 800° C. or more as a main material, a so-called low temperature polysilicon using polysilicon which is formed at a temperatures of 600° C. or less as a main material, polysilicon crystallized by being added with an element or the like which promotes crystallization. As described above, a semiamorphous semiconductor or a semiconductor which partially includes a crystalline region may be used.

When a crystalline semiconductor layer is used as the semiconductor layer, a known method (laser crystallization, heat crystallization, a heat crystallization method using an element promoting crystallization such as nickel, or the like) may be employed as a method for manufacturing the crystalline semiconductor layer. A microcrystal which is a SAS can be crystallized by being irradiated with laser light to enhance the crystallinity. In the case where an element promoting crystallization is not used, the hydrogen is released until hydrogen concentration contained in an amorphous silicon film becomes $1 \times 10^{20}$ atoms/cm$^3$ or less by heating the amorphous silicon film for one hour at a temperature of 500° C. in a nitrogen atmosphere before irradiating the amorphous silicon film with laser light. This is because the amorphous film is damaged when the amorphous silicon film containing much hydrogen is irradiated with laser light.

Any method can be used for introducing a metal element into the amorphous semiconductor layer without limitation as long as the method is capable of making the metal element exist on the surface or inside the amorphous semiconductor layer. For example, a sputtering method, CVD, plasma treatment (including plasma CVD), an adsorption method, or a method for applying a metal salt solution can be employed. Among them, the method using a solution is simple and easy and is advantageous in terms of easy concentration adjustment of the metal element. It is preferable to form an oxide film by UV light irradiation in oxygen atmosphere, a thermal oxidation method, treatment with ozone water or hydrogen peroxide including a hydroxyl radical, or the like in order to improve wettability of the surface of the amorphous semiconductor layer and to spread an aqueous solution over the entire surface of the amorphous semiconductor layer.

In addition, heat treatment and laser light irradiation may be combined to crystallize the amorphous semiconductor layer. Alternatively, the heat treatment and/or the laser light irradiation may be independently performed plural times.

Alternatively, a crystalline semiconductor layer may be selectively formed over the substrate by a plasma method.

A semiconductor region can be formed from an organic semiconductor material by a printing method, a spray method, spin coating, a droplet discharge method, or the like. In this case, since the above etching step is not required, the number of steps can be reduced. A low molecular weight material, a high molecular weight material, or the like is used for the organic semiconductor material, and in addition, a material such as an organic pigment, a conductive high molecular weight material can be used. A π-electron conjugated high molecular weight material having a skeleton constituted by a conjugated double bonds is preferably used as an organic semiconductor material used in the present invention. Typically, a soluble high molecular weight material such as polythiophene, polyfluoren, poly(3-alkylthiophene), a polythiophene derivative or pentacene can be used.

A material with which a semiconductor region can be formed by performing treatment after depositing a soluble precursor is given as an example of an organic semiconductor material which can be applied to the invention. Note that polythienylenevinylene, poly(2,5-thienylenevinylene), polyacetyrene, a polyacetyrene derivative, polyallylenevinylene or the like is given as an example of such an organic semiconductor material.

In converting the precursor to an organic semiconductor, a reaction catalyst such as a hydrogen chloride gas is added additionally to a heat treatment. The following can be applied as a typical solvent which dissolves the organic semiconductor material having solubility: toluene, xylene, chlorobenzene, dichlorobenzene, anisole, chloroform, dichloromethane, butyl lactone, butyl cellosolve, cyclohexane, NMP (N-methyl-2-pyrrolidone), cyclohexanone, 2-butanone, dioxane, dimethylformamide (DMF), THF (tetrahydrofuran) or the like.

A minute amount of an impurity element (boron or phosphorous) is added into thus obtained semiconductor layer to control the threshold voltage of a TFT. In this embodiment mode, a crystalline semiconductor layer is used.

A first photomask is prepared to form a semiconductor layer 102 by patterning using photolithography.

A gate insulating film 105 covering the semiconductor layer 102 is formed. The gate insulating film 105 is formed of an insulating film containing silicon with thickness of 40 nm to 150 nm by using a plasma CVD method or a sputtering method. The gate insulating film 105 may be formed of a known material such as an oxide material or nitride material of silicon, and may be a laminated layer or a single layer. In this embodiment mode, a laminated layer of three-layer: a silicon nitride film, a silicon oxide film, and a silicon nitride film is used. Alternatively, a single layer or a laminated layer of two layers formed of thereof and a silicon oxynitride film may be also used. Preferably, a precise silicon nitride film may be used. Note that a rare gas element such as argon may be added to a reactive gas to mix in an insulating film to be formed in order to form a precise insulating film having little gate leak current, at low film formation temperature.

A first conductive film with film thicknesses of 20 nm to 100 nm and a second conductive film with film thicknesses of 100 nm to 400 nm, each of which serves as a gate electrode layer are formed and stacked over the gate insulating film 105. The first and the second conductive films may be formed of an element of Ta, W, Ti, Mo, Al, and Cu, or an alloy material or a compound material having the foregoing element as a main component. A semiconductor film represented by a polycrystalline silicon film that is doped with an impurity element such as phosphorus or an AgPdCu alloy may be used as the first and second conductive films. The conductive film is not limited to the two-layer structure, and, for example, a three-layer structure in which a 50 nm thick tungsten film, a 500 nm thick alloy film of aluminum and silicon (Al—Si), and a 30 nm thick titanium nitride film are sequentially stacked may be applied. In the case of the three-layer structure, tungsten nitride may be used in stead of tungsten of the first conductive film; an alloy film of aluminum and titanium (Al—Ti) may be used in stead of an alloy film of aluminum and silicon (Al—Si) of the second conductive film; or a titanium film may be used in stead of a titanium nitride film of a third conductive film. Further, a single layer structure may be also used.

Then, a second photomask formed of a resist is manufactured by using a photolithography method to perform first etching to form an electrode layer and a wiring. The first conductive film and the second conductive film can be etched to have a desired tapered shape by appropriately adjusting an etching condition (electric power applied to a coil-shaped electrode layer, electric power applied to an electrode layer on a substrate side, electrode temperature on a substrate side or the like) by using an ICP (Inductively Coupled Plasma) etching method. As an etching gas, a chlorine-based gas typified by $Cl_2$, $BCl_3$, $SiCl_4$, $CCl_4$ or the like, a gas containing fluorine typified by $CF_4$, $SF_6$, $NF_3$ or the like, or $O_2$ can be appropriately used.

A first shape conductive layer (a first conductive layer and a second conductive layer) having the first conductive layer and the second conductive layer is formed by first etching.

Figure 5:
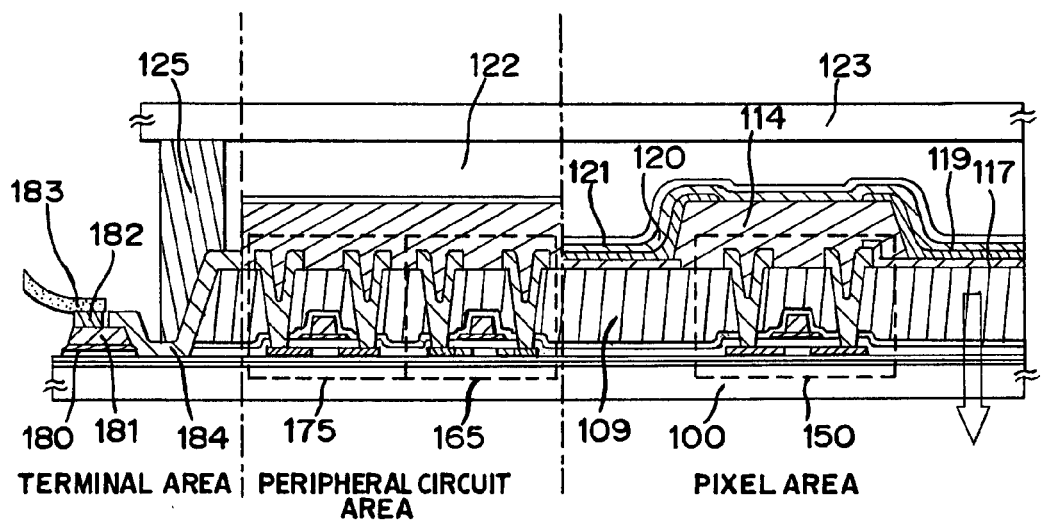
FIG. 5 is a figure showing a manufacturing method of a display device of the invention.

Then, second etching is performed without removing a mask formed of a resist. Here, a W film is selectively etched. At this time, the second conductive layer is formed by the second etching. On the other hand, the first conductive layer is hardly etched to form a second shape conductive layer. Hence, conductive layers 106 and 107 are formed. In a terminal area where electrical connection with the external is performed, conductive layers 180 and 181 functioning as a terminal electrode layer are also formed in this process (FIG. 5). In this embodiment mode, the conductive layer is formed by dry etching. However, the conductive layer may be also formed by wet etching.

Then, an impurity region is formed in the semiconductor layer. In this embodiment mode, an example of using a p-channel TFT having a p-type impurity region as a TFT in the pixel area; however, an n-channel TFT having an n-type impurity region may be used. Although an n-type impurity region is not shown in FIGS. 3A to 4F, since only a pixel area is shown in the views, this embodiment mode includes a TFT of a peripheral circuit area which has an n-type impurity region as shown in FIG. 5 which is a further detailed view of a display device. A resist mask is newly formed by using a third photomask after removing the resist mask. A first doping step is performed to dope an impurity element which imparts n-type conductivity (typically, phosphorus (P) or arsenic (As)) to a semiconductor at the low concentration to form an n-channel type TFT. The resist mask covers a region which is to be a p-channel type TFT and a region adjacent to the conductive layer. A low concentration impurity region is formed by performing through-doping via the insulating layer in the first doping step. A plurality of TFTs are used to drive one light emitting element. The above-mentioned doping step is not necessary when the light emitting element is driven only by a p-channel type TFT.

Then, a resist mask is newly formed by using a fourth photomask after removing the resist mask. A second doping step is performed to dope an impurity element which imparts p-type (typically, boron (B)) to a semiconductor at the high concentration. P-type impurity regions 103 and 104 are formed by performing through-doping via the gate insulating film 105 by the second doping step.

Then, a resist mask is newly formed by using a fifth photomask. Here, a third doping step is performed to dope an impurity element which imparts n-type conductivity (typically, phosphorus or arsenic) to a semiconductor at the high concentration to form an n-channel type TFT. Ion doping in the third doping step is performed under the condition that the amount of doze is set at from $1 \times 10^{13}$ atoms/cm$^2$ to $5 \times 10^{15}$ atoms/cm$^2$; and the acceleration voltage, from 60 to 100 kV. The resist mask covers a region to be a p-channel type TFT. An n-type low concentration impurity region and high concentration impurity region are formed by performing through-doping via the gate insulating film 105 by the third doping step.

Through the above-mentioned steps, the impurity region is formed in each semiconductor layer.

Subsequently, an insulating film 108 containing hydrogen is formed as a passivation film after removing the mask formed of a resist (FIG. 3A). The insulating film 108 is formed of an insulating film containing silicon with thickness of 100 nm to 200 nm by using a plasma CVD method or a sputtering method. The insulating film 108 is not limited to a silicon nitride film. The insulating film 108 may be a silicon nitride oxide (SiNO) film using a plasma CVD method and other insulating films containing silicon may be also used in a single layer or a layered structure.

Further, heat treatment is carried out at 300° C. to 550° C., preferably, 400 to 500° C. for 1 to 12 hours to hydrogenate the semiconductor layer. This is a step for terminating a dangling bond in the semiconductor layer with the use of hydrogen contained in the insulating film 108.

The insulating film 108 can be formed of a material containing a substance of silicon nitride, silicon oxide, silicon oxynitride (SiON), silicon nitride oxide (SiNO), aluminum nitride (AlN), aluminum oxynitride (AlON), aluminum nitride oxide (AlNO) having more nitrogen content than oxygen content (AlNO), aluminum oxide, diamond like carbon (DLC), or a nitrogen-containing carbon film (CN) film. Alternatively, a material in which a skeleton is configured by the bond of silicon (Si) and oxygen (O) and which contains at least hydrogen as a substituent, or a material having at least one of fluorine, an alkyl group, and aromatic hydrocarbon as a substituent may be used.

Heat treatment, intense light irradiation, or laser light irradiation may be performed to activate the impurity element. Plasma damage to the gate insulating film and plasma damage to an interface between the gate insulating film and the semiconductor layer can be recovered at the same time of the activation.

An insulating layer 109 which serves as an interlayer insulating film is then formed. As the interlayer insulating film provided for planarization in the invention, a film having high heat resistance and insulating properties as well as high planarity ratio is required. Therefore, a thermostable planarizing film is preferable. In this embodiment mode, spin coating is used as a formation method of such an insulating layer.

In this embodiment mode, as a material of the insulating layer 109, siloxane resin is used. The skeleton of siloxane is configured by the bond of silicon (Si) and oxygen (O). An organic group which includes at least hydrogen (for example, an alkyl group and aromatic hydrocarbon) is used as the substituent. A fluoro group may be used as the substituent. Alternatively, both an organic group which includes at least hydrogen and a fluoro group may be used. In this embodiment mode, a film which is baked can be referred to as a silicon oxide (SiOx) film containing an alkyl group. The silicon oxide (SiOx) film containing an alkyl group has high light-transmitting properties and can withstand heat treatment at 300° C. or higher.

In the embodiment mode, the formation method of the insulating layer 109 by an application method is as follows. Initially, thinner, thinner pre-wet treatment is performed to improve wettability after performing washing with pure water. Then, a composition, in which a low molecular weight ingredient (a precursor) having the bond of silicon (Si) and oxygen (O) is dissolved into a solvent is applied over the substrate using an application apparatus. Afterwards, a thin film can be obtained by forwarding volatilization (evaporation) of the solvent and crosslinking reaction of the low molecular weight ingredient by heating the composition along with a substrate. Then, the coating formed in a circumference of the substrate is removed. When an insulating layer (a partition wall) is formed, a patterning for forming in a desired shape may be performed. In addition, a film thickness is controlled by a spin rotation rate, rotation time, and the concentration and viscosity of the composition containing an insulating material, which is coating material solution.

Here, a formation procedure of the insulating layer 109 is described in detail with reference to FIGS. 16A to 17.

First, a substrate over which the insulating film is to be formed is washed with pure water. Megasonic washing may be also performed on the substrate. Next, after performing dehydrobaking for 110 seconds at 140° C., the temperature of the substrate is stabilized by cooling for 120 seconds with a water-cooled plate. Next, the substrate is transferred to and placed in a spin coater as shown in FIG. 16A.

Figure 16A:
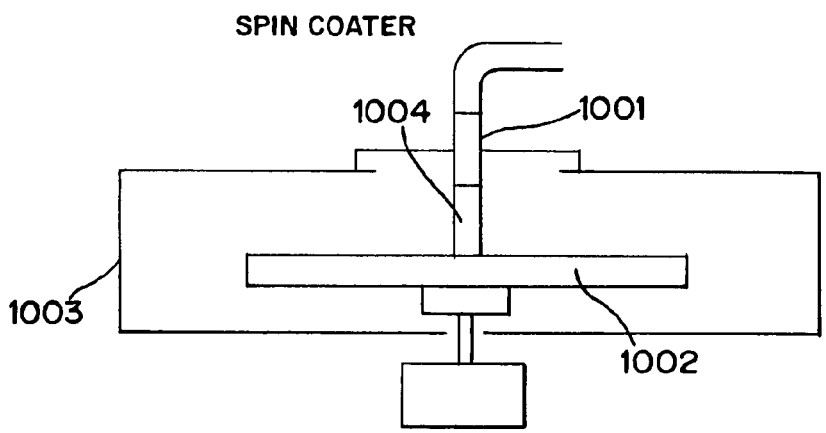
FIGS. 16A to 16C are figures showing a formation method of an insulating layer of the invention.

FIG. 16A shows a section schematic block diagram of a spin coater. In FIG. 16A, reference numeral 1001 denotes a nozzle, 1002 denotes a substrate, 1003 denotes an application cup, 1004 denotes a coating material solution. In this embodiment mode, a composition containing an insulating material is used as the coating material solution.

The spin coater has mechanism in which the coating material solution is dropped from the nozzle 1001, the substrate 1002 is horizontally loaded in the application cup 1003, and the whole application cup is rotated. Further, the pressure of the atmosphere inside the application cup 1003 can be controlled.

Next, pre-wet application is performed to improve wettability with the use of an organic solvent such as thinner (a volatile mixture solvent formed by mixing aromatic hydrocarbon (toluene or the like), alcohols, ester acetate, or the like). Thinner is thrown off by spinning the substrate with high speed (rotation rate, 450 rpm), after spreading the thinner thoroughly with centrifugal force by spinning the substrate (rotation rate, 100 rpm) as dropping 70 ml of the thinner.

Subsequently, the solution in which siloxane polymer is dissolved in a solvent is thoroughly spread by centrifugal force by gradually spinning the substrate (rotation rate from 0 rpm to 1000 rpm) while dropping the solution in which siloxane polymer is dissolved from the nozzle and hold the state for 5 seconds. As the solvent for siloxane polymer, propylene glycolmonomethyl ether, propylene glycolmonomethyl ether acetate (also referred to as PGMEA), 3-methoxy-3-methyl-1-butanol (also referred to as MMB), or the like can be used. MMB is used in this embodiment mode. The viscosity of the coating material solution that is the composition containing an insulating material is set at 10 mPa·s (cP) to 50 mPa·s (cP), preferably, 20 mPa·s (cP) to 35 mPa·s (cP) according to the invention. When an insulating layer is formed by using a composition containing an insulating material with the above viscosity as the coating material solution, the insulating layer having a highly planar surface with uniform thickness distribution, where even minute irregularities on the surface are reduced, can be formed. In this embodiment mode, the viscosity of the composition containing an insulating material is set at 28 mPa·s (cP), and the concentration of nonvolatile solute is set at 30%. Concentration of nonvolatile solute in this embodiment mode is the ratio of the mass of the component which remains after volatilization to the composition containing an insulating material and its dilution solvent.

The coating material solution can be classified into, for example, silica glass, alkyl siloxane polymer, alkyl silsesquioxane polymer, hydrogenated silsesquioxane polymer, hydrogenated alkyl silsesquioxane polymer or the like according to a structure of siloxane. Then, after holding the substrate for 30 seconds in the state where the rotation is stopped, the substrate is gradually spun again (rotation rate from 0 rpm to 1400 rpm) and the rotation rate of 1400 rpm is kept for 25 seconds for leveling the coating.

Subsequently, the inside of the application cup is exhausted to be decompressed. Then, reduced pressure drying may be performed for within 1 minute.

Figure 16B:
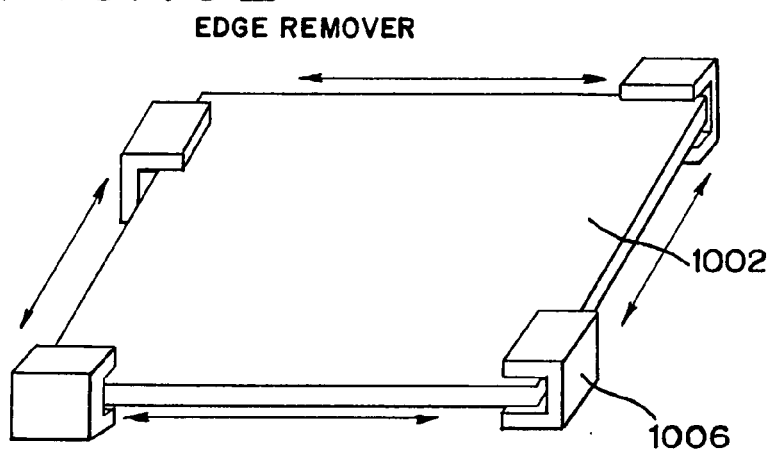
Figure 16C:
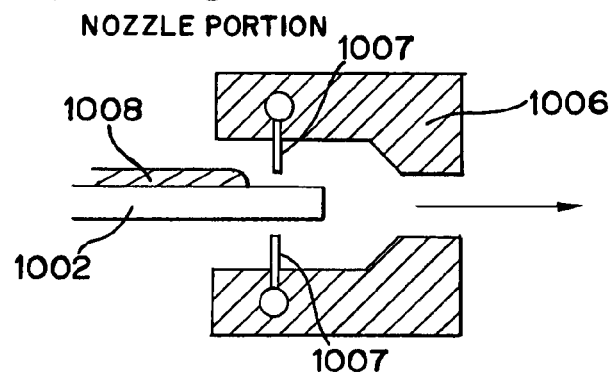

Edge removing treatment is performed using an edge remover equipped in the spin coater shown in FIG. 16A. FIG. 16B shows the edge remover 1006 equipped with a moving means which is moved in parallel along the periphery of the substrate 1002. In the edge remover 1006, thinner discharging nozzles 1007 shown in FIG. 16C are provided to sandwich one side of the substrate, and the perimeter of the coating 1008 is dissolved in the thinner; thereby removing the coating around the substrate edge face by exhausting liquid and gas in the direction of the arrow in the figure.

Then, prebaking is performed by conducting baking at 110° C. for 170 seconds.

The substrate is transferred out of the spin coater and cooled. Then, baking is further performed at 270° C. for 1 hour.

Figure 17:
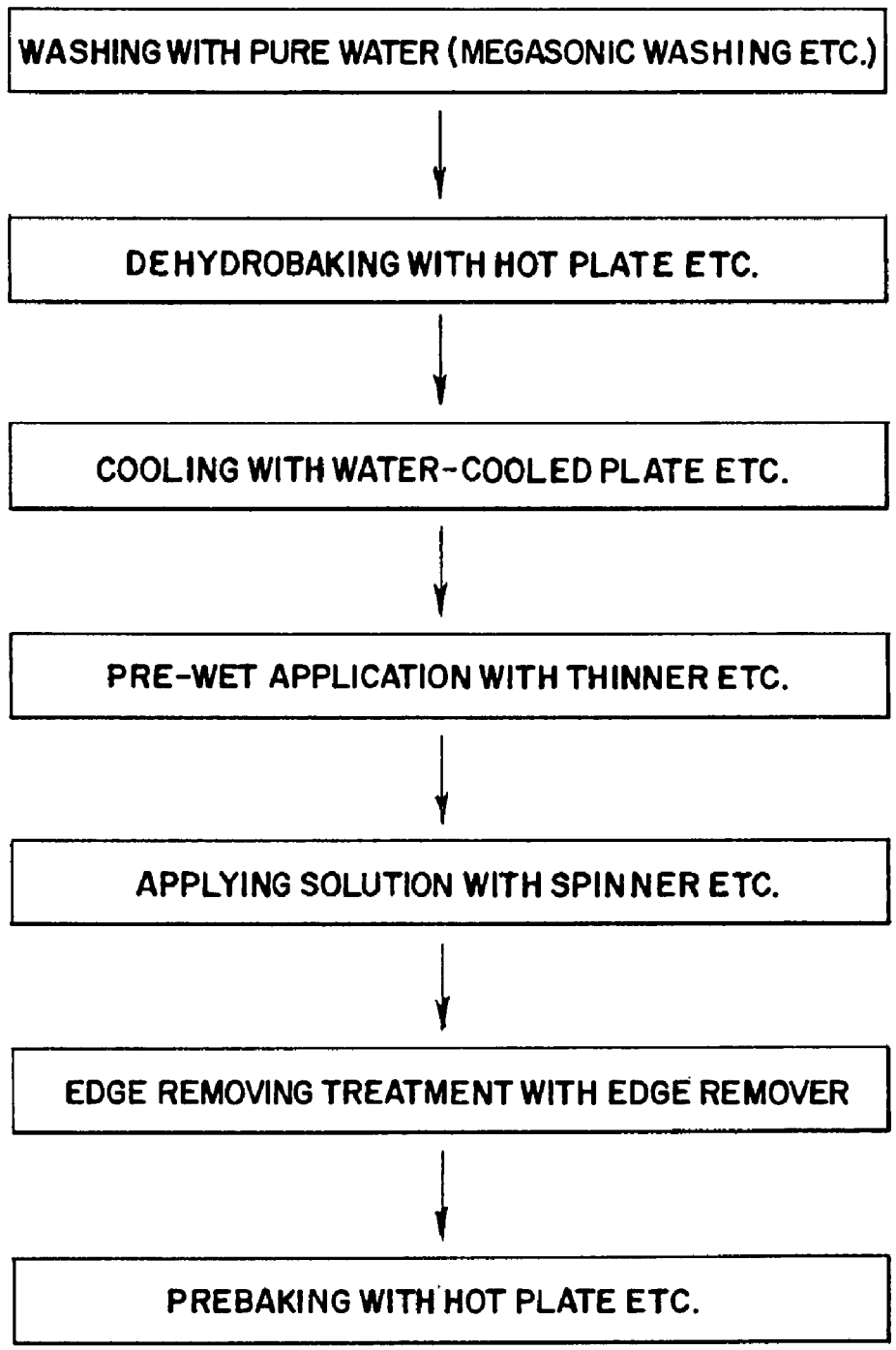
FIG. 17 is a figure showing a formation method of an insulating layer of the invention.

FIG. 17 is a flow chart showing the above steps. In this way, the insulating film 109 is formed (see FIG. 3B). The thickness may be 0.1 μm to 10 μm, preferably, 0.2 μm to 5 μm, depending on the irregularities in the region where the insulating film is to be formed.

According to the invention, a conductive layer, which forms a wiring layer or an electrode layer, and a mask layer for forming a predetermined pattern may be formed by a method capable of selectively forming a pattern, like a droplet discharge method. A predetermined pattern (a conductive layer, an insulating layer, or the like) can be formed by a droplet discharge (spray) method (which may include an ink-jet method depending on the method) by selectively discharging (spraying) a droplet of a composition mixed for a particular object. At this time, pretreatment to form a titanium oxide film or the like in a formation region may be carried out. In addition, a method in which the pattern can be transferred or drawn, for example, a printing method (a method in which a pattern is formed such as screen printing or offset printing) or the like can be also used.

The insulating layer 109 may be formed with the use of an inorganic insulating material, or acrylic acid, methacrylic acid, or a derivative thereof, or a heat resistant high molecular weight compound such as polyimide, an aromatic polyamide, or polybenzimidazole. Alternatively, an insulating compound including silicon, oxygen, and hydrogen, which includes a Si—O—Si bond, which is an inorganic siloxane or an organic siloxane in which hydrogen bonded to silicon is substituted by an organic group such as methyl or phenyl, may be used. A photosensitive or nonphotosensitive material such as acrylic or polyimide, or a Low-k material having low dielectric constant may be used instead to form the insulating layer 109.

Then, a contact hole (an opening portion) is formed in the insulating layer 109 by using a resist mask and at the same time, the insulating layer at a periphery region is removed. Etching (wet etching or dry etching) is performed under the condition where selectivity of the insulating layer 109 and the insulating film formed thereunder can be obtained. Inert gas may be added to an etching gas to be used. One or more elements of He, Ne, Ar, Kr and Xe can be used for an inert element to be added. Specifically, it is preferable to use argon having a comparatively large atomic radius and which is inexpensive. In this embodiment mode, $CF_4$, $O_2$, He, and Ar are used. An etching condition during dry etching is as follows: a flow rate of $CF_4$ is 380 sccm; a flow rate of $O_2$, 290 sccm; a flow rate of He, 500 sccm; a flow rate of Ar, 500 sccm; an RF power, 3000 W; and a pressure, 25 Pa. According to the above-mentioned condition, an etching residue can be decreased.

In addition, the etching time may be increased at the rate of about from 10% to 20% and over-etching may be performed for etching the gate insulating film 105 without leaving a residue on its surface. One time etching or plural times of etching may be conducted to obtain a tapered shape. The tapered shape may be obtained by further performing the second time dry etching with the use of $CF_4$, $O_2$ and He by setting a flow rate of $CF_4$ at 550 sccm; a flow rate of $O_2$, 450 sccm; a flow rate of He, 350 sccm; an RF power, 3000 W; and a pressure, 25 Pa.

The gate insulating film 105 is etched to form an opening portion that reaches a source region or a drain region. The opening portion may be formed by etching the insulating film 108 and the gate insulating film 105 using a mask which is newly formed after etching the insulating layer 109 or by using the etched insulating layer 109 as a mask. The gate insulating film 105 is etched by using $CHF_3$ and Ar as an etching gas. By the etching step under such conditions, the contact hole that has a surface with few projections and has a high planarization rate can be obtained while reducing etching residues. It is to be noted that the etching time may be increased at the rate of approximately from 10% to 20% to perform the etching while further reducing residues on the semiconductor layer.

A conductive film is formed and etched to form an electrode layer 112 that is electrically connected to each impurity region. The electrode layer 112 is a wiring which is in contact with a first electrode layer of a light emitting element to be formed later, and electrically connects a thin film transistor to the light emitting element. The electrode layer 112 functions also as a source electrode or a drain electrode. For the conductive film, a film formed of an element of aluminum (Al), titanium (Ti), molybdenum (Mo), tungsten (W) and silicon (Si) may be used as well as an alloy film using these elements. In this embodiment mode, Ti, TiN, Al, TiN are stacked in order with thicknesses of 60 nm, 40 nm, 350 nm, and 100 nm, respectively, and then patterned to have a desired shape, thereby forming the electrode layer 112. Note that TiN is one of the materials having excellent adhesiveness with an insulating layer. Therefore, a film is not easily peeled. When the above-mentioned structure is employed, TiN functions also as a barrier layer in which Al is hardly diffused. In addition, TiN preferably contains N with concentrations of 44 atomic % or less in order to form a contact with the source region or the drain region of the TFT. More preferably, the concentration of N in TiN is in the range between 7 atomic % and 44 atomic %. The conductive film may have a two-layer structure of TiN and Al, leading to simplification of the manufacturing step.

Etching is carried out by ICP (Inductively Coupled Plasma) etching method using $BCl_3$ and $Cl_2$. Etching conditions are such that the amount of electric power applied to a coiled electrode is 450 W; the amount of electric power applied to an electrode on the substrate side is 100 W; and a pressure is 1.9 Pa.

In addition, the insulating layer in a terminal area is simultaneously removed by etching during patterning of the insulating film 108 and the insulating layers 109, and thus, the conductive layers 180 and 181 are exposed. A wiring layer 184 is simultaneously formed from the same material in a step of forming the electrode layer 112 in this embodiment mode. When the outside end faces of the insulating film 108 and the insulating layer 109 are formed to have inclination (a taper shape), the coverage of the wiring layer 184 is improved. A taper angle thereof is preferably more than 30° and less than 70°.

Through the above-mentioned steps, an (active matrix) element substrate provided with a TFTs 150, 165 and 175 is completed. In this embodiment mode, only the p-channel type TFT is shown in a pixel region, however, it may have an n-channel type TFT. Alternatively, the TFT may be a single-gate structure in which one channel-formation region is formed, a double-gate structure in which two channel-formation regions are formed, or a triple-gate structure in which three channel-formation regions are formed. In addition, the TFT in a driver circuit area may be a single-gate structure, a double-gate structure or a triple-gate structure, too.

Note that a method for manufacturing a TFT is not limited to the one shown in this embodiment mode, and the invention is also applicable to a top gate type (a planar type), a bottom gate type (an inverse stagger type), a dual-gate type having two gate electrode layers disposed over and below a channel region with a gate insulating film therebetween, or other structures.

Next, a first electrode layer (also referred to as a pixel electrode layer) 117 is formed to be in contact with the electrode layer 112. The first electrode layer functions as an anode or a cathode, and a film containing an element of Ti, TiN, $TiSi_xN_y$, Ni, W, $WSi_x$, $WN_x$, $WSi_xN_y$, NbN, Cr, Pt, Zn, Sn, In, and Mo or a film including an alloy material or a compound material containing the elements as the main component or a laminated film thereof may be used with a film thickness ranging from 100 nm to 800 nm in total.

Figure 3C:
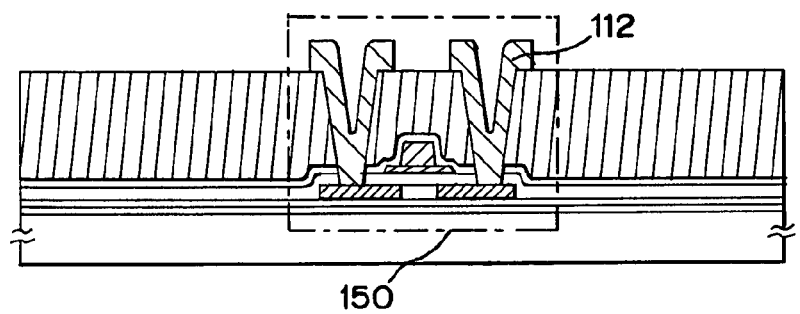
Figure 3D:
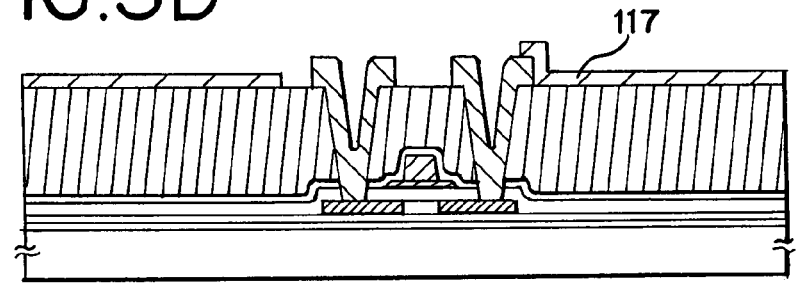

The first electrode layer 117 has light-transmitting properties since the display device has a structure in which a light emitting element is used as a display element and light from the light emitting element is extracted from the side of the first electrode layer in this embodiment mode. The first electrode layer 117 is formed by forming a transparent conductive film and etching to have a desired shape (FIG. 3D). As the first electrode layer 117 used in the invention, indium tin oxide containing silicon oxide (hereinafter, referred to as "ITSO"), zinc oxide, tin oxide, indium oxide or the like can be used. In addition, a transparent conductive film such as an indium oxide zinc oxide alloy in which 2% to 20% of zinc oxide (ZnO) is mixed into indium oxide can be used as the first electrode layer 117. In addition to the above-mentioned transparent conductive film, a titanium nitride film or a titanium film may be used as the first electrode layer 117. In this case, the titanium nitride film or the titanium film is formed in a film thickness that transmits light (preferably, approximately from 5 nm to 30 nm) after forming the transparent conductive film. In this embodiment mode, as the first electrode layer 117, ITSO using indium tin oxide and silicon oxide. In this embodiment mode, an ITSO film is formed by using a target in which from 1% to 10% of silicon oxide ($SiO_2$) is added to indium tin oxide, and setting a flow rate of Ar gas to be 120 sccm; a flow rate of O₂ gas, 5 sccm; a pressure, 0.25 Pa; an electric power, 3.2 kW with the use of a sputtering method to have a film thickness of 110 nm. The first electrode layer 117 may be cleaned or polished by CMP or by using a porous material such as polyvinyl alcohol so that the surface thereof is planarized. In addition, after polishing using a CMP method, ultraviolet ray irradiation, oxygen plasma treatment, or the like may be carried out on the surface of the first electrode layer 117.

In the invention, heat treatment may be performed after forming the first electrode layer 117. With the heat treatment, moisture included in the first electrode layer 117 is released. Accordingly, degasification or the like is not generated from the first electrode layer. Even when a light emitting material which is easily deteriorated by moisture is formed over the first electrode layer, the light emitting material is not deteriorated; therefore, a highly reliable display device can be manufactured. In this embodiment mode, ITSO is used for the first electrode layer, and it remains an amorphous state even when baking is performed unlike ITO which is crystallized by being baked. Hence, ITSO has higher planarity than ITO and short-circuit with a cathode is not easily generated even when a layer containing an organic compound is thin.

Figure 4A:
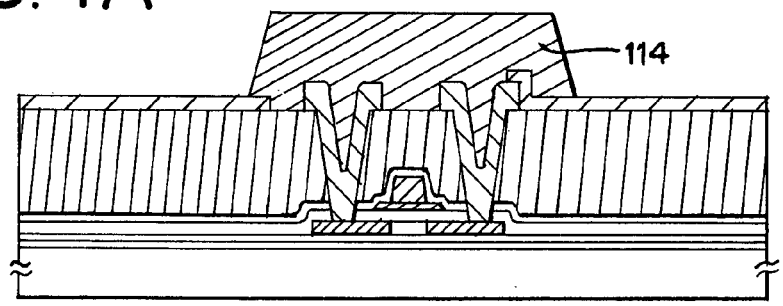
FIGS. 4A and 4B are figures showing a manufacturing method of a display device of the invention.

Next, an insulating layer (an insulator) 114 (referred to as a bank, a partition wall, a wall, an embankment, and the like) covering an end portion of the first electrode layer 117 and the electrode layer 112 is formed. The invention can be applied to the formation of the insulating layer 114. In this embodiment mode, the insulating layer 114 can be formed with the same material, through the same steps, and in the same manner as the insulating layer 109. Therefore, a composition containing an insulating material, which is a coating material solution, shall have a viscosity of 10 mPa·s (cP) to 50 mPa·s (cP), preferably, 20 mPa·s (cP) to 35 mPa·s (cP). As the coating material solution, a composition containing an insulating material is made with the above viscosity to form an insulating layer by an application apparatus; thus, the insulating layer having a highly planar surface with uniform thickness distribution, where even minute irregularities on the surface are reduced, can be formed. The thickness may be 0.5 μm to 1.5 μm depending on the irregularities in the region where the insulating layer is to be formed. Either dry etching or wet etching can be used for etching. Here, the insulating layer 114 is formed by dry etching with the use of a mixed gas of $CF_4$, $O_2$ and He (FIG. 4A). The dry etching is performed by setting a pressure at 5 Pa; a power, 1500 W; a flow rate of $CF_4$, 25 sccm; a flow rate of $O_2$, 25 sccm; and a flow rate of He, 50 sccm. In the dry etching, the etching rate of the SiOx film containing an alkyl group is from 500 nm/min to 600 nm/min. On the other hand, the etching rate of the ITSO film is 10 nm/min or less; therefore, sufficient selectivity can be obtained. The TiN film which has high adhesion to the insulating 114 is the outermost surface since the electrode layer 112 is covered with the insulating layer 114.

The insulating layer 114 is formed with an inorganic insulating material such as silicon oxide, silicon nitride, silicon oxynitride, aluminum oxide, aluminum nitride, aluminum oxynitride, or acrylic acid, methacrylic acid, or a derivative thereof, or a heat resistant high molecular weight compound such as polyimide, an aromatic polyamide, or polybenzimidazole. Alternatively, an insulating compound including silicon, oxygen, and hydrogen, which includes a Si—O—Si bond, which is an inorganic siloxane or an organic siloxane in which hydrogen bonded to silicon is substituted by an organic group such as methyl or phenyl, may be used. A photosensitive or nonphotosensitive material such as acrylic or polyimide may be used instead to form the insulating layer 114. The insulating layer 114 preferably has a shape in which a radius curvature changes continuously. Accordingly, the coverage of an electroluminescent layer 119 and a second electrode layer 120 which are formed over the insulating layer 114 is enhanced. When the same material is used for the insulating layer 109 that is an interlayer insulating film and the insulating layer 114 that is a partition wall, the manufacturing cost can be reduced. Further, costs can be reduced if an application film formation apparatus, an etching device, and the like are commonly used.

It is preferable to further perform deaeration by carrying out vacuum heating before forming an electroluminescent layer (a layer including an organic compound) 119 to further improve reliability. For example, it is desirable to perform heat treatment at 200° C. to 400° C., preferably, 250° C. to 350° C. under a reduced pressure atmosphere or inert atmosphere before evaporating an organic compound material in order to eliminated the gas contained in the substrate. It is preferable to form the electroluminescent layer 119 by vacuum deposition or a droplet discharge method under reduced pressure without being exposed to the atmosphere. According to the heat treatment, moisture contained in or adhering a conductive film which is to be the first electrode layer or the insulating layer (the partition wall) can be released. The heat treatment can be combined with the above-mentioned heat treatment when vacuum is kept and the substrate can be transferred within a vacuum chamber, and the above-mentioned heat treatment may be performed once after forming the insulating layer (the partition wall). Here, the interlayer insulating film and the insulating layer (the partition wall) are formed of an SiOx films having high heat resistance; therefore, there is no problem even when high heat treatment is carried out. Accordingly, a step for enhancing reliability by heat treatment can be sufficient performed.

Figure 4B:
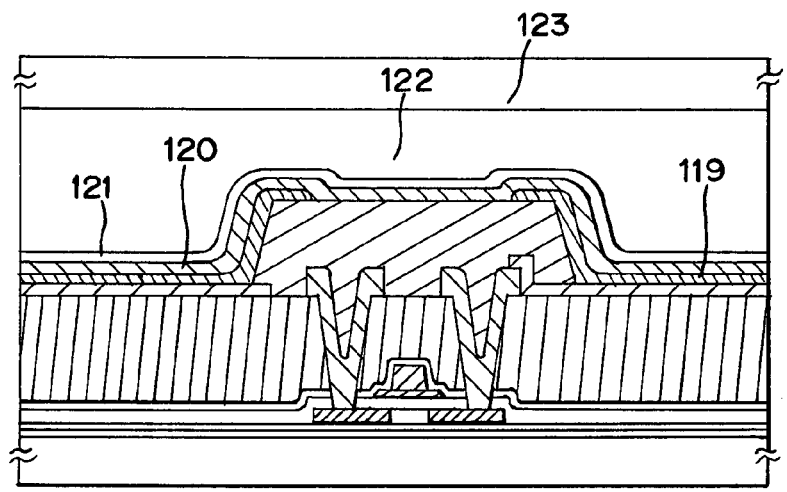

An electroluminescent layer 119 is formed over the first electrode layer 117. Note that although only one pixel is shown in FIGS. 4A and 4B, electroluminescent layers corresponding to each color of R (red), G (green) and B (blue) are separately formed in this embodiment mode. In this embodiment mode, as the electroluminescent layer 119, materials which show luminescence of each color of red (R), green (G) and blue (B), are selectively formed by a vapor deposition method using a vapor-deposition mask for each, or the like. The materials, which show luminescence of each color red (R), green (G) and blue (B), can be also formed by a droplet discharge method (a low molecular or high molecular weight materials or the like) and, in this case, separate coating of RGB can be carried out without using a mask, which is preferable.

Next, a second electrode layer 120 formed with a conductive film is provided over the electroluminescent layer 119. As the second electrode layer 120, a material with a low work function (Al, Ag, Li, Ca, or an alloy or a compound thereof, such as MgAg, MgIn, AlLi, $CaF_2$, or CaN) may be used.

In display devices according to this embodiment mode shown in FIG. 4B and FIG. 5, light emitted from a light emitting element is emitted by transmitting through the side of the first electrode layer 117.

It is effective to provide a passivation film 121 so as to cover the second electrode layer 120. The passivation film 121 is formed of an insulating film containing silicon nitride, silicon oxide, silicon oxynitride (SiON), silicon nitride oxide (SiNO), aluminum nitride (AlN), aluminum oxynitride (AlON), aluminum nitride oxide (AlNO) of which nitrogen content is higher than oxygen content, aluminum oxide, diamond like carbon (DLC), or a carbon film containing nitrogen (CN), and a single layer of the insulating film or a laminate combining them can be used. In addition, a material, in which a skeleton is configured by the bond of silicon (Si) and oxygen (O), and which at least contains hydrogen as a substituent or which includes at least one kind of fluorine, an alkyl group, and aromatic hydrocarbon as the substituent may be used.

In this case, it is preferable to use a film with good coverage as the passivation film, and a carbon film, a DLC film, in particular, is effective to be used. Since a DLC film can be formed at temperatures ranging from a room temperature to 100° C. or less, it can be easily formed even over the electroluminescent layer 119 with low heat resistance. A DLC film can be formed by a plasma CVD method (typically, an RF plasma CVD method, a microwave CVD method, an electron cyclotron resonance (ECR) CVD method, a hot-filament CVD method, or the like), a combustion flame method, a sputtering method, an ion beam vapor deposition method, a laser vapor deposition method, or the like. As a reactive gas to be used for deposition, a hydrogen gas and a hydrocarbon gas (for example, $CH_4$, $C_2H_2$, $C_6H_6$ or the like) is used and ionized by glow discharge, and then deposition is carried out with accelerative collision of ion with a cathode to which a negative self-bias is applied. In addition, the CN film may be formed by using $C_2H_4$ gas and $N_2$ gas as a reactive gas. A DLC film has high blocking effect to oxygen and thus can control oxidation of the electroluminescent layer 119. Therefore, a problem that the electroluminescent layer 119 oxidizes can be prevented during a subsequent sealing step.

The light emitting element is sealed by bonding the substrate 100 where the light emitting element is formed in such a manner to a sealing substrate 123 with a sealant 125 (see FIG. 5). Moisture is prevented from entering through a cross-section by the sealant; therefore, the light emitting element is prevented from deteriorating, which leads to the higher reliability of a display device. As the sealant, a visible light curing, ultraviolet curing or heat curing resin is preferably used. For example, an epoxy resin such as a bisphenol A liquid resin, a bisphenol A solid resin, a resin containing bromo-epoxy, a bisphenol F resin, a bisphenol AD resin, a phenol resin, a cresol resin, a novolac resin, a cyclic aliphatic epoxy resin, an epibis epoxy resin, a glycidyl ester resin, a glycidyl amine resin, a heterocyclic epoxy resin, or a modified epoxy resin can be used. Note that a filler 122 may be filled in a region surrounded with the sealant, and nitrogen or the like may be filled by sealing the light emitting element under a nitrogen atmosphere. The filler 122 does not necessarily have light-transmitting properties, since a bottom emission type is employed in this embodiment mode. In the case of a structure in which light is extracted by transmitting the filler 122, the filler needs to have light-transmitting properties. Typically, a visible light cured, ultraviolet curable, or thermosetting epoxy resin may be used. Through the above steps, a display device having a display function using a light emitting element according to this embodiment mode is completed.

A completion drawing of an EL display panel manufactured according to the invention is shown in FIGS. 22A and 22B. FIG. 22A shows a top view of the EL display panel and FIG. 22B shows a cross-sectional view taken along line E-F in FIG. 22A. In FIGS. 22A and 22B, a pixel area 3301 formed over an element substrate 3300 includes a pixel 3302, gate wiring layers 3306a and 3306b, and a source wiring layer 3308, and the element substrate 3300 is fixed with a sealing substrate 3310 by being bonded with a sealant 3303. In this embodiment mode, a driver IC 3351 is provided over an FPC 3350 and mounted by TAB.

As shown in FIGS. 22A and 22B, desiccants 3305, 3304a, and 3304b are provided in a display panel in order to prevent the element from being deteriorated due to moisture. The desiccant 3305 is formed so as to encircle the circumference of the pixel area, and the desiccants 3304a and 3304b are formed in a region corresponding to the gate wiring layers 3306a and 3306b. In this embodiment mode, the desiccants are provided in a depression formed in the sealing substrate as shown in FIG. 22B, which does not prevent an EL display panel from being thinned. A large water absorption area can be obtained since a desiccant is formed also in a region corresponding to a gate wiring layer, thereby enhancing absorption efficiency. Additionally, since the desiccants are formed over the gate wiring layer which does not emit light directly, a light extraction efficiency is not deteriorated. In this embodiment mode, a filler 3307 is filled in the display panel. When a hygroscopic substance such as a desiccant is used as the filler, further absorption effect can be obtained and the element can be prevented from being deteriorated.

In this embodiment mode, the case where a light emitting element is sealed with a glass substrate is shown. Sealing treatment is treatment to protect a light emitting element from moisture. Therefore, any of a method in which a light emitting element is mechanically sealed with a cover material, a method in which a light emitting element is sealed with a thermosetting resin or an ultraviolet curable resin, and a method in which a light emitting element is sealed with a thin film of such as metal oxide, nitride or the like having high barrier capabilities, can be used. As for the cover material, glass, ceramics, plastic, or metal can be used. However, when light is emitted to the cover material side, the cover material needs to have light-transmitting properties. Enclosed space is formed by attaching the cover material to the substrate over which the above-mentioned light emitting element is formed with a sealant such as a thermosetting resin or an ultraviolet curable resin and then by curing the resin with heat treatment or ultraviolet irradiation treatment. It is also effective to provide a hydroscopic absorbent material typified by barium oxide in the enclosed space. The absorbent material may be provided on the sealant or over a partition wall or the peripheral part so as not to block light emitted from a light emitting element. Further, it is also possible to fill the space between the cover material and the substrate over which the light emitting element is formed with a thermosetting resin or an ultraviolet curable resin. In this case, it is effective to add a hydroscopic material typified by barium oxide in the thermosetting resin or the ultraviolet curable resin.

In this embodiment mode, in the terminal area, an FPC 183 is connected to conductive film layers 180 and 181 which are to be a terminal electrode layer with an anisotropic conductive layer 182, so as to have electrical connection to the outside.

In this embodiment mode, a display device is formed of the above-mentioned circuits. However, the invention is not limited thereto, and either a passive matrix circuit or an active matrix circuit may be used. As a peripheral driver circuit, an IC chip may be mounted by the above-mentioned COG method or TAB method. Additionally, a single or a plurality of gate wiring driver circuits and source wiring driver circuits may be used.

In the display device of the invention, a method for driving a screen is not specifically limited, and a dot sequential driving system, a line sequential driving system, a plane sequential driving system, or the like may be employed. Typically, the line sequential driving system is employed, and a time division gradation driving system or an area gradation driving system may be utilized as needed. The video signal to be inputted into a source wiring of the display device may be either an analogue signal or a digital signal, and the driver circuit or the like may be designed corresponding to the video signal as needed.

Further, in a display device using a digital video signal, there are two kinds of driving systems in which video signals inputted into a pixel are ones with constant voltage (CV) and in which video signals inputted into a pixel are ones with constant current (CC). Further, as for the driving system using video signals with constant voltage (CV), there are two kinds of systems in which voltage applied to a light emitting element is constant (CVCV), and in which current applied to a light emitting element is constant (CVCC). In addition, as for the driving system using video signals with constant current (CC), there are two kinds of systems in which voltage applied to a light emitting element is constant (CCCV), and in which current applied to a light emitting element is constant (CCCC).

By applying the invention, the thickness distribution of an insulating layer constituting a display device can be uniform and the planarity is improved. Accordingly, by using such an insulating layer, a high-definition and high-quality display device can be manufactured with high yield at low cost.

EMBODIMENT MODE 3

An embodiment mode of the invention will be described with reference to FIGS. 3A to 3D and FIGS. 18A to 18C. In this embodiment mode, another example of a display device manufactured according to Embodiment Mode 2, which has a different structure for the connection between the electrode layer 112 and the first electrode layer. Accordingly, descriptions on the same components or the components having similar functions will not be repeated.

As described in Embodiment Mode 2, base films 101a and 101b are formed on a substrate 100, and a semiconductor layer 102 having impurity regions 103 and 104 is formed. Conductive layers 106 and 107 that are gate electrode layers are formed over the semiconductor layer 102 with a gate insulating film 105 therebetween, and an insulating film 108 is formed as a passivation film. An insulating layer 109 is formed as an interlayer film, and a source electrode layer and a drain electrode layer are formed in openings provided in the insulating layer 109 so as to be connected to the semiconductor layer 102 (FIG. 3C). In this embodiment mode, an insulating layer in which the skeleton includes a silicon (Si)—oxygen (O) bond is used as the insulating layer 109.

Figure 18A:
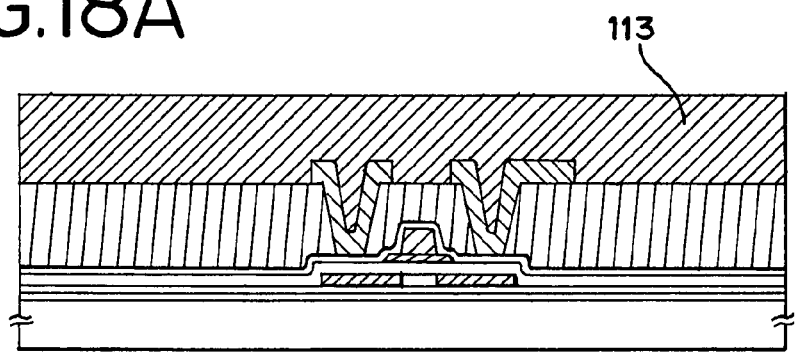
FIGS. 18A to 18C are figures showing a manufacturing method of a display device of the invention.
Figure 18B:
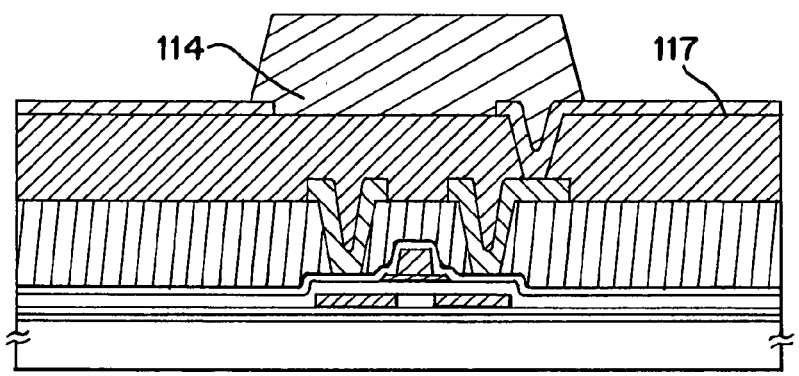

In this embodiment mode, an insulating layer 113 is further formed over the source electrode layer, the drain electrode layer, and the insulating layer 109, as an interlayer film (FIG. 18A). The insulating layer 113 is formed in the like manner as the insulating layer 109 according to the invention. In this embodiment mode, the insulating layer 113 is formed by spin coating as in Embodiment Mode 2. As described in Embodiment Mode 2, a composition containing an insulating material, which is a coating material solution is applied by an application apparatus. Here, the viscosity of the composition containing an insulating material is set at 10 mPa·s (cP) to 50 mPa·s (cP), preferably, 20 mPa·s (cP) to 35 mPa·s (cP). As the coating material solution, a composition containing an insulating material is made with the above viscosity to form an insulating layer by an application apparatus; thus, the insulating layer 113 having a highly planar surface with uniform thickness distribution, where even minute irregularities on the surface are reduced, can be formed. The thickness may be 0.1 µm to 10 µm, preferably, 0.2 µm to 5 µm depending on the irregularities in the region where the insulating film is to be formed. When an insulating layer is formed by using a composition containing an insulating material with the above viscosity for a coating solution, the insulating layer having a highly planar surface with uniform thickness distribution, where even minute irregularities on the surface are reduced, can be formed. The surface of an insulating layer formed with a viscosity within the range set in the invention has high planarity such that unevenness (interference fringes) is not confirmed even if the insulating layer is exposed to even single color light, with which even the surface roughness due to minute irregularities can be observed as unevenness (interference fringes).

An opening is formed as a contact hole reaching the source electrode layer or the drain electrode layer in the insulating layer 113. A first electrode layer 117 is formed to be electrically connected to the source electrode layer or the drain electrode layer through the contact hole.

Figure 18C:
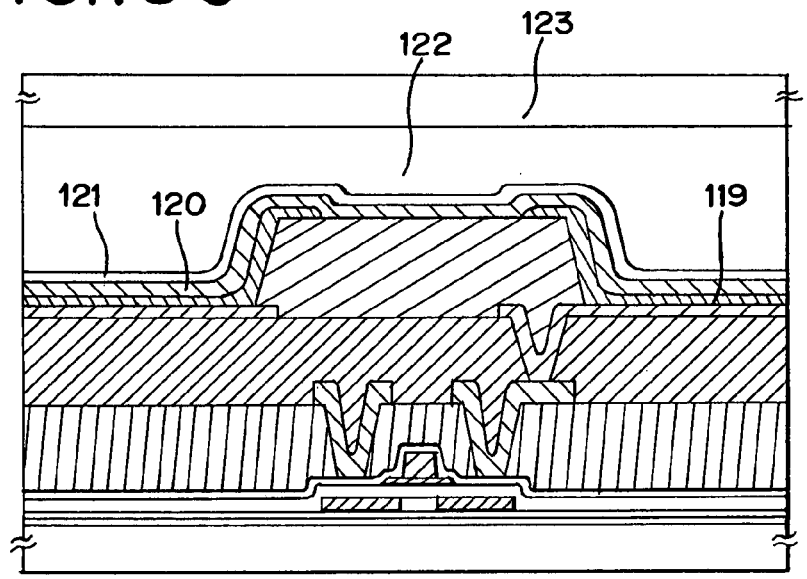

An insulating layer 114 which functions as a bank for separating each pixel is formed over the selectively provided first electrode layer 117 and the insulating layer 113 as shown in Embodiment Mode 2 according to the invention. An electroluminescent layer 119 and a second electrode layer 120 are stacked thereover. A passivation film 121 is formed to cover the second electrode layer 120, and the substrate 100 and the sealing substrate 123 are fixed by being adhered with a sealant (FIG. 18C). In this embodiment mode, the space between the substrates is filled with a filler 122.

As to a display device according to the embodiment mode, irregularities formed due to the source electrode layer and the drain electrode layer are planarized with the insulating layer 113 in addition to the planarization by the insulating layer 109. Accordingly, the surface of the formation region of the first electrode layer 117 is highly planarized; thus, a light emitting element including the stacked films can be formed with good coverage. Consequently, unevenness in light emitting display due to minute irregularities can be reduced; thus, a high-definition and high-quality display device can be manufactured.

EMBODIMENT MODE 4

Figure 19A:
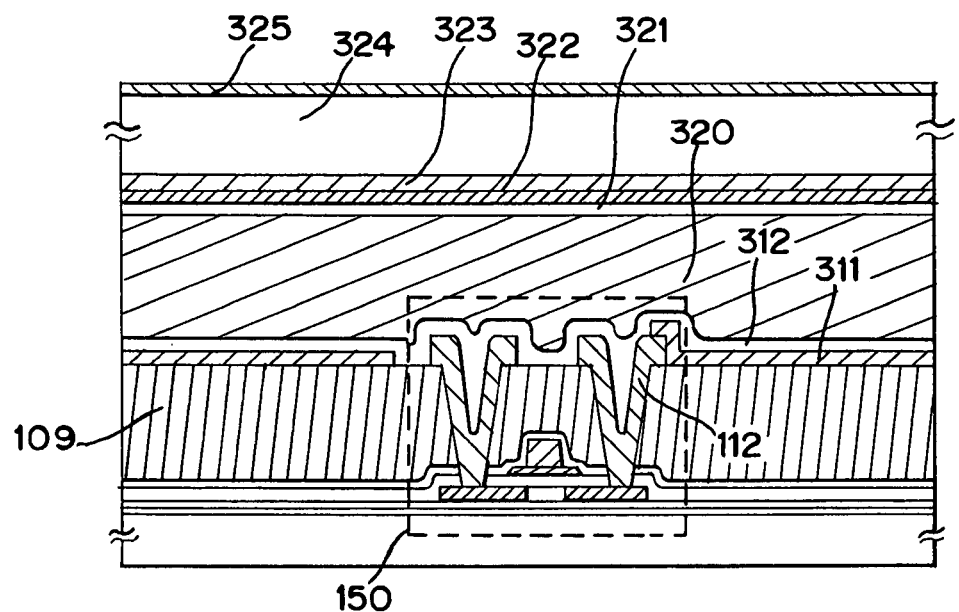
FIGS. 19A and 19B are figures showing a manufacturing method of a display device of the invention.

An embodiment mode of the invention will be described with reference to FIGS. 19A and 19B. In this embodiment mode, an example of a display device manufactured according to Embodiment Mode 2 and Embodiment Mode 3, which is a liquid crystal display device using a crystal liquid material instead of a light emitting element for a display element will be described. FIG. 19A corresponds to the display device manufactured according to Embodiment Mode 2, and FIG. 19B corresponds to Embodiment Mode 3. Accordingly, descriptions on the same components or the components having similar functions will not be repeated.

A TFT 150 is formed as in Embodiment Mode 2, and an insulating layer 109 is formed (FIG. 19A). A pixel electrode layer 311 is formed in contact with the electrode layer 112 thereby electrically connecting to each other. In the structure of the display device formed according to Embodiment Mode 3, which is shown in FIG. 19B, an insulating layer 113 is formed and an opening is provided therein, so that the source electrode layer or the drain electrode layer is formed to be electrically connected to the pixel electrode layer 311. The same material used for the first electrode layer 117 can be used for the pixel electrode layer 311. When a transmissive liquid crystal display panel is manufactured, a predetermined pattern is formed with a composition including indium tin oxide (ITO), indium tin oxide containing silicon oxide (ITSO), zinc oxide (ZnO), tin oxide ($SnO_2$) or the like, and the pattern is baked to form the pixel electrode layer 311.

An insulating layer 312 called an alignment film is formed by a printing method or spin coating so as to cover the pixel electrode layer 311. The insulating layer 312 can be selectively formed with the use of a screen printing method or an offset printing method. Then, rubbing is performed. A sealant is formed in at the peripherally of the region where a pixel is formed by a droplet discharge method (not shown).

Figure 19B:
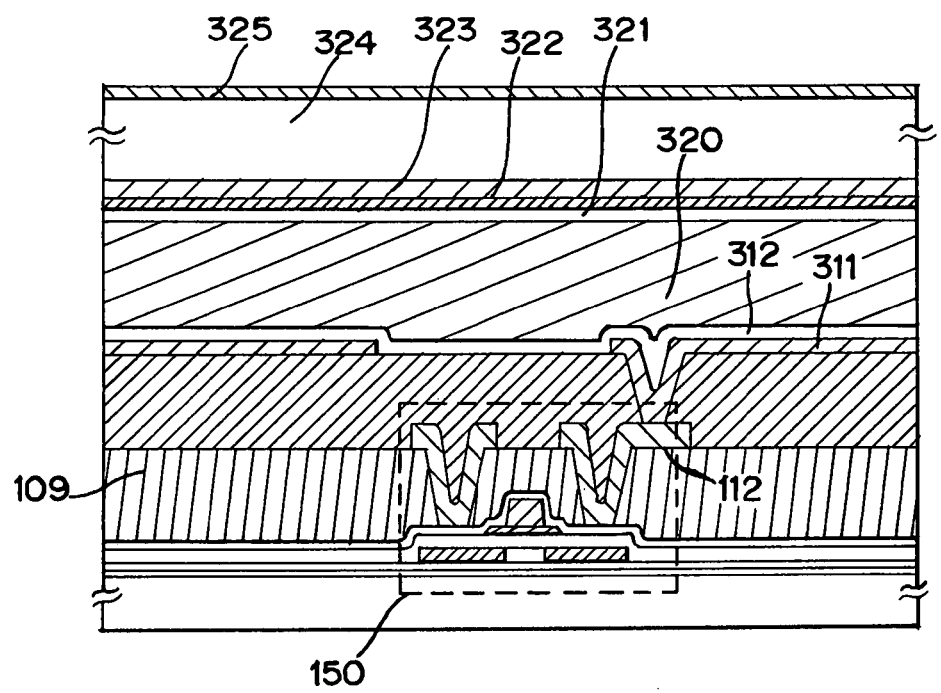

Subsequently, a liquid crystal display panel can be manufactured by attaching a counter substrate 324 provided with an insulating layer 321 functioning as an alignment film, a coloring layer 322 functions as a color filter, a conductive layer 323 functioning as a counter electrode layer, and a counter substrate 324 provided with a polarizing plate 325 to the TFT substrate 300 with a spacer therebetween, and by providing the space with a liquid crystal layer 320 (FIGS. 19A and 19B). A sealant may be mixed with a filler, and further, the counter substrate 324 may be provided with a shielding film (a black matrix), or the like. Note that a dispenser type (a dropping type) or a dip type (a pumping type) by which a liquid crystal is injected utilizing capillary phenomenon after attaching the counter substrate 324 can be used as a method for forming the liquid crystal layer.

A liquid crystal drop injection method employing a dispenser type will be described with reference to FIG. 23. A liquid crystal drop injection method shown in FIG. 23 includes a control device 40, an imaging means 42, a head 43, a liquid crystal 33, markers 35 and 45, a barrier layer 34, a sealant 32, a TFT substrate 30, and a counter substrate 20. A closed loop is formed with the sealant 32, and the liquid crystal 33 is dropped once or plural times therein from the head 43. When the liquid crystal material is highly adhesive, the liquid crystal material is continuously discharged and attached to a formation region with being interconnected. On the other hand, when the liquid crystal material is low adhesive, the liquid crystal material is intermittently discharged and a droplet is dropped as in FIG. 23. At this time, the barrier layer 34 is provided to prevent the sealant 32 and the liquid crystal 33 from reacting with each other. Subsequently, the substrates are attached in vacuum, and then, ultraviolet curing is performed to make the space filled with the liquid crystal.

A connection portion is formed to connect the pixel area formed through the above steps and an external wiring substrate. The insulating layer in the connection portion is removed by ashing treatment using an oxygen gas under the atmospheric pressure or pressure in proximity of the atmospheric pressure. This treatment is performed by using a mixture gas of an oxygen gas and one or more gases of hydrogen, $CF_4$, $NF_3$, $H_2O$ and $CHF_3$. In this step, ashing treatment is performed after sealing by using the counter substrate to prevent damage or destruction due to static, however, ashing treatment may be performed at any timing when there are few effects of static.

A connection wiring substrate is provided so as to electrically connect a wiring layer to the substrate, with an anisotropic conductive layer interposed therebetween. The wiring substrate has a function of transmitting a signal or electric potential from the external. Through the above-mentioned steps, a liquid crystal display panel including a display function can be manufactured.

In this embodiment mode, a switching TFT having a single gate structure is described, however, a multi gate structure such as a double gate structure may be employed. When a semiconductor is formed with the use of AS or SAS, a one-conductivity semiconductor layer can be formed by adding an impurity which provides one conductivity type and connected to the electrode layer. The semiconductor layer may have impurity regions having different concentrations. For example, the periphery of a channel region of a semiconductor layer, which forms a laminate with a gate electrode layer and may be a low concentration impurity region, and the outer region thereof may be a high concentration impurity region.

By applying the invention, the thickness distribution of an insulating layer constituting a display device can be uniform and the planarity is improved. Accordingly, the irregularities on the region where a liquid crystal display element will be formed can be flattened, and display unevenness in image display can be reduced. Thus, a high-definition and high-quality display device can be manufactured with high yield at low cost according to the invention.

EMBODIMENT MODE 5

A display device having a light emitting element can be manufactured by applying the invention. Light is emitted from the light emitting element in bottom emission, top emission, or dual emission. In this embodiment mode, examples of a dual emission type and a top emission type will be described with reference to FIG. 6 and FIG. 7.

Figure 6:
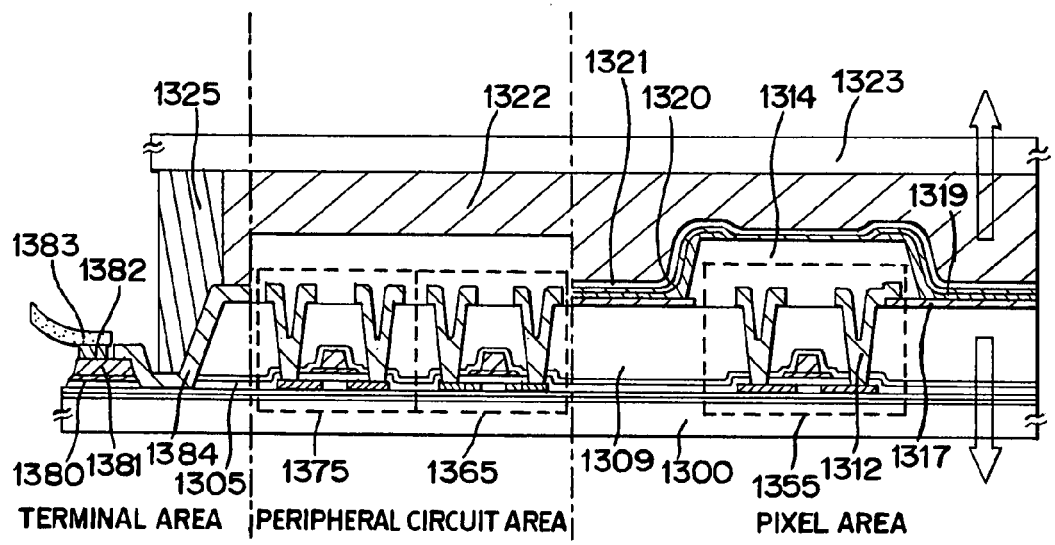
FIG. 6 is a cross-sectional view of a display device of the invention.

A display device shown in FIG. 6 includes an element substrate 1300; TFTs 1355, 1365 and 1375; a first electrode layer 1317; an electroluminescent layer 1319; a second electrode layer 1320; a transparent conductive film 1321; a filler 1322; a sealant 1325; a gate insulating layer 1305; an insulating layer 1309; a partition wall 1314; a sealing substrate 1323; a wiring layer 1384; terminal electrodes 1380 and 1381; an anisotropic conductive layer 1382; and an FPC 1383. The present invention is applied to the insulating layer 1309 and the partition wall 1314. Accordingly, the light emitting element is capable of high definition display without display unevenness owing to the high planarity and uniform thickness distribution of the insulating layer 1309. The filler 1322 can be formed by a drop method with a composition in liquid form as in the case of the liquid crystal drop method in FIG. 23. The light emitting display device is sealed by attaching the element substrate to the sealing substrate provided with the filler by a drop method.

A display device shown in FIG. 6 is a dual emission type, and has a structure in which light is emitted in directions indicated by arrows, namely, to the both sides of the element substrate 1300 and the sealing substrate 1323. In this embodiment mode, a transparent conductive film is formed and etched to have a desired shape to form the first electrode layer 1317. The transparent conductive film can be used as the first electrode layer 1317. In addition to the above-mentioned transparent conductive film, a titanium nitride film or a titanium film may be used as the first electrode layer 1317. In this case, a titanium nitride film or a titanium film is formed to have a film thickness which can transmit light (preferably, approximately from 5 nm to 30 nm) after forming the transparent conductive film. In this embodiment mode, ITSO is used as the first electrode layer 1317.

Then, a second electrode layer 1320 formed with a conductive film is formed over the electroluminescent layer

1319. As the second electrode layer 1320, a material having a low work function (Al, Ag, Li, Ca, or an alloy or a compound thereof; MgAg, MgIn, AlLi, CaF$_2$, or CaN) may be used. In the display device shown in FIG. 6, a laminate of a metal thin film in with a thinned film thickness (MgAg: a film thickness of 10 nm) as the second electrode layer 1320, and ITSO having a film thickness of 100 nm as the transparent conductive film 1321 is used so as to transmit light. As the transparent conductive film 1321, a film similar to the above-mentioned first electrode layer 1317 can be used.

As to the display device shown in FIG. 6, the first electrode layer 1317 can be selectively formed over the insulating layer 1309 before forming the source electrode layer or drain electrode layer which are connected to the thin film transistor 1355. In this case, a source/drain layer 1312 is connected to the first electrode layer 1317 by forming the source/drain layer 1312 over the first electrode layer. If the first electrode layer 1317 is formed before forming the source/drain layer 1312, the first electrode layer 1317 can be formed over a flat region; therefore, there are advantages of good coverage, good film formation conditions, and capability of a polishing treatment such as CMP.

Figure 7:
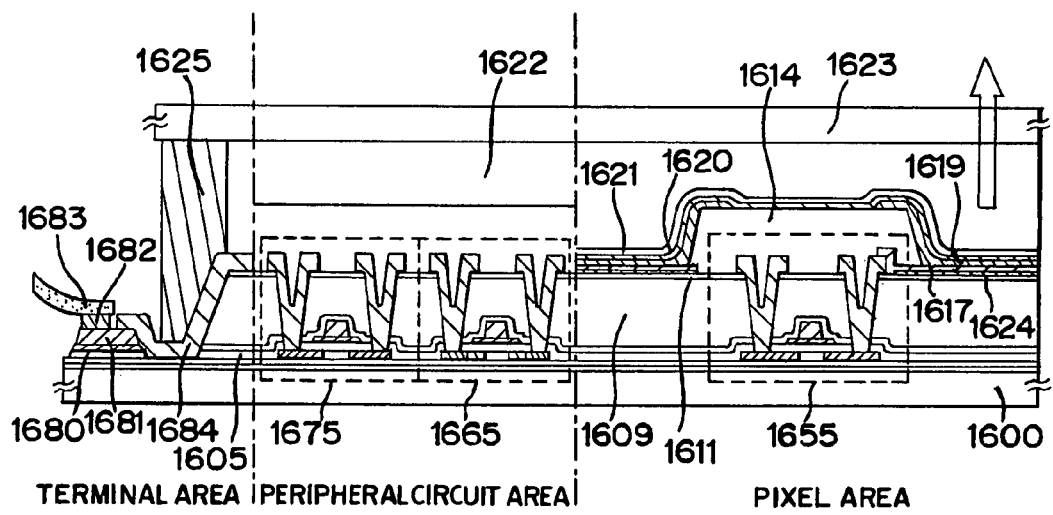
FIG. 7 is a cross-sectional view of a display device of the invention.

A display device shown in FIG. 7 is a one-side emission type, and has a structure in which top emission is performed in a direction indicated by an arrow. The display device shown in FIG. 7 includes an element substrate 1600, TFTs 1655, 1665 and 1675, a reflective metal layer 1624, an insulating layer 1611, a first electrode layer 1617, an electroluminescent layer 1619, a second electrode layer 1620, a transparent conductive film 1621, a filler 1622, a sealant 1625, a gate insulating layer 1605, an insulating layer 1609, a partition wall 1614, a sealing substrate 1623, a wiring layer 1684, terminal electrodes 1680 and 1681, an anisotropic conductive film 1682, and an FPC 1683. In this case, in the dual emission type display device shown in FIG. 6, the reflective metal layer 1624 is formed under the first electrode layer 1617. The first electrode layer 1617 which is transparent conductive film functioning as an anode is formed over the reflective metal layer 1624. As the metal layer 1624, it may be at least reflective; therefore, Ta, W, Ti, Mo, Al, Cu or the like may be used. It is preferable to use a substance having high reflectivity in a visible light range, and in this embodiment mode, a TiN film is used. The invention is applied to the insulating layer 1609 and the partition wall 1614; thus, the display device capable of high definition display without display unevenness owing to uniform thickness distribution and high planarity of the insulating 1609.

The display device shown in FIG. 7 is a top emission type display device in which light is extracted from the side of the sealing substrate 1623. Therefore, light extraction efficiency is not deteriorated even when the insulating layer 1611 is formed. Accordingly, in this embodiment mode, the insulating layer 1611 is formed over the insulating layer 1609 to be used as a base film of the first electrode layer 1617. The insulating layer 1611 functions as an etching stopper in patterning the electrode layer. When materials for the electrode layer and the insulating layer 1611 are selected to have high selectivity, no residue is on the surface of the insulating layer 1611 and a good planarity can be obtained even after etching the electrode. When the insulating layer 1611 has good planarity, disconnection, short circuit of an electrode or the like can be prevented even when the first electrode layer 1617 is formed as a pixel electrode over the insulating layer 1611, thereby enhancing the reliability of the display device.

The second electrode layer 1620 formed with a conductive film is provided over the electroluminescent layer 1619. As the second electrode layer 1620, a material having a low work function (Al, Ag, Li, Ca, or an alloy or a compound thereof: MgAg, MgIn, AlLi, CaF$_2$, or CaN) may be used so as to be used as a cathode. In this embodiment mode, a laminate of a metal thin film with thinned film thickness as the second electrode layer 1620 (MgAg: a film thickness of 10 nm) so as to transmit light, and ITSO having a film thickness of 110 nm as the transparent conductive film 1621 is used.

A mode of a light emitting element which can be applied in this embodiment mode is shown in FIG. 24A to 24D. The light emitting element has a structure in which an electroluminescent layer 860 is interposed between a first electrode layer 870 and a second electrode layer 850. The materials of the first electrode layer and the second electrode layer are required to be selected considering the work functions. The first electrode layer and the second electrode layer can be either an anode or a cathode depending on the pixel structure. In this embodiment mode, in the case where a driving TFT has p-channel conductivity, the first electrode layer may preferably serve as an anode and the second electrode layer may serve as a cathode. Since the driving TFT has n-channel conductivity, the first electrode layer may preferably be used as a cathode and the second electrode layer may be used as an anode.

Figure 24A:
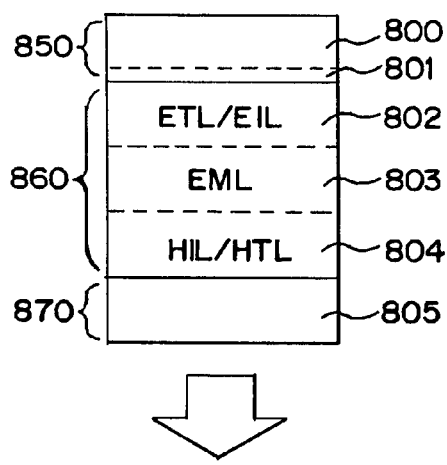
FIGS. 24A to 24D are figures showing structures of a light emitting element which are applicable to the invention.
Figure 24B:
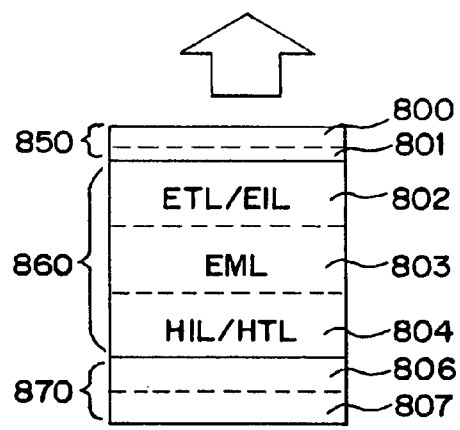

FIGS. 24A and 24B show the case where the first electrode layer 870 is an anode and the second electrode layer 850 is a cathode. The electroluminescent layer 860 preferably has a structure in which an HIL (hole injection layer) \HTL (hole transport layer) 804, an EML (light emitting layer) 803, an ETL (electron transport layer)\EIL (electron injection layer) 802, and a second electrode layer 850 are stacked in order from the side of the first electrode layer 870. FIG. 24A shows a structure in which light is emitted from the first electrode layer 870 which is constituted by an electrode layer 804 having a light-transmitting conductive oxide material, and the second electrode layer has a structure in which an electrode layer 801 containing an alkali metal or an alkaline earth metal such as LiF or MgAg and an electrode layer 800 made of a metal material such as aluminum are stacked in order from the side of the electroluminescent layer 860. FIG. 24B shows a structure in which the first electrode layer is constituted by an electrode layer 807 made of a metal such as aluminum or titanium, or a metal material containing such metal and nitrogen of concentration in stoichiometric proportion or less, and the second electrode layer 806 made of a conductive oxide material containing silicon oxide at a concentration of 1 to 15 atomic %. The second electrode layer is constituted by an electrode layer 801 containing an alkali metal or an alkaline earth metal such as LiF or MgAg and an electrode layer 800 made of a metal material such as aluminum from the side of the electroluminescent layer 860; each layer is formed to a thickness of 100 nm or less from the side of the electroluminescent layer 860 to transmit light; thus, the light can be emitted from the second electrode layer 850.

Figure 24C:
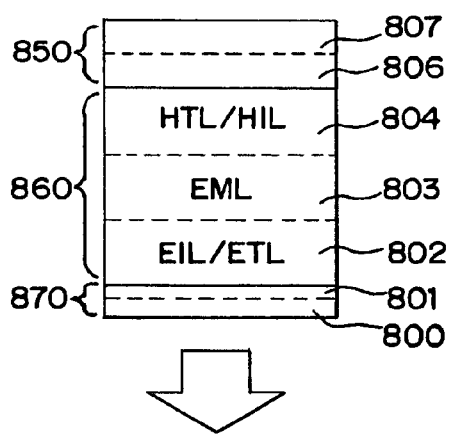
Figure 24D:
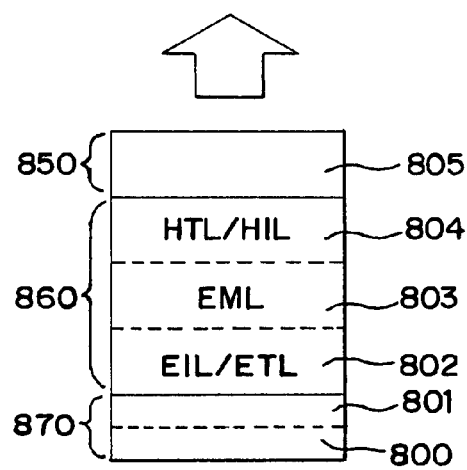

FIGS. 24C and 24D show the case where the first electrode layer 870 is a cathode and the second electrode layer 850 is an anode. The electroluminescent layer 860 preferably has a structure in which an EIL (electron injection layer)\an ETL (electron transport layer) 802, an EML (light emitting layer) 803, an HTL (hole transport layer)\HIL (hole injection layer) 804, and the second electrode layer 850 which is an anode are stacked in order from the cathode side. FIG. 24C shows a structure in which light is emitted from the first electrode layer 870. The first electrode layer 870 is constituted by an electrode layer 801 containing an alkali metal or an alkaline earth metal such as LiF or MgAg and an electrode layer 800 made of a metal material such as aluminum from the side of the electroluminescent layer 860; each layer is formed to a thickness of 100 nm or less to transmit light; thus, the light can be emitted from the first electrode layer 870. The second electrode layer is constituted by the second electrode layer 806 made of a conductive oxide material containing silicon oxide at a concentration of 1 to 15 atomic % and an electrode layer 807 made of a metal such as aluminum or titanium, or a metal material containing such metal and nitrogen of concentration in stoichiometric proportion or less, from the side of the electroluminescent layer 860. FIG. 24D shows a structure in which light is emitted from the second electrode layer 850. The first electrode layer 870 is constituted by an electrode layer 801 containing an alkali metal or an alkaline earth metal such as LiF or MgAg and an electrode layer 800 made of a metal material such as aluminum from the side of the electroluminescent layer 860; the first electrode layer 870 is formed thick enough to reflect the light produced in the electroluminescent layer 860. The second electrode layer 850 is constituted by an electrode layer 805 made of a light-transmitting conductive oxide material. The electroluminescent layer may have a single layer structure or a mixed structure instead of a layered structure.

As the electroluminescent layer, materials each displaying luminescence of red (R), green (G), and blue (B) are selectively formed by an evaporation method using respective evaporation masks or the like for each. The materials (low molecular weight materials or high molecular weight materials or the like) each displaying luminescence of red (R), green (G), and blue (B) can be formed by a droplet discharge method in the same manner as a color filter. This case is preferable since RGB can be separately colored without using masks.

In the case of the above top emission type, when ITSO or ITSO having light-transmitting properties is used as the second electrode layer, BzOs-Li in which Li is added to benzoxazole derivatives (BzOs) or the like can be used. $Alq_3$ doped with a dopant corresponding to respective luminescent colors of R, G, and B (DCM or the like for R, and DMQD or the like for G) may be used for the EML, for example.

Note that the electroluminescent layer is not limited to the above-mentioned material. For example, hole injection properties can be enhanced by co-evaporating an oxide such as molybdenum oxide ($MoO_X$: X=2 to 3) and α-NPD or rubrene instead of using CuPc or PEDOT. An organic material (including a low molecular weight material or a high molecular weight material) or a composite material of an organic material and an inorganic material can be used as the material of the electroluminescent layer. A material forming a light emitting element will be described below in detail.

As a substance having high electron transport properties among charge injection transport materials, for example, a metal complex having a quinoline skeleton or a benzoquinoline skeleton such as tris(8-quinolinolato) aluminum (abbreviation: $Alq_3$), tris (4-methyl-8-quinolinolato) aluminum (abbreviation: $Almq_3$), bis (10-hydroxybenzo[h]-quinolinato) beryllium (abbreviation: $BeBq_2$), bis (2-methyl-8-quinolinolato)-4-phenylphenolato-aluminum (abbreviation: BAlq), and the like can be given. As a substance having high hole transport properties, for example, an aromatic amine compound (in other words, a compound having the bond of benzene ring-nitrogen) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), or 4,4',4"-tris [N-(3-methylphenyl)-N-phenyl-amino]-triphenylamine (abbreviation: MTDATA) can be used.

As a substance having high electron injection properties among charge injection transport materials, a compound of an alkali metal or an alkaline earth metal such as lithium fluoride (LiF), cesium fluoride (CsF), or calcium fluoride ($CaF_2$) can be given. In addition to this, it may be a compound of a substance having high electron transport properties such as $Alq_3$ and an alkaline earth metal such as magnesium (Mg).

As a substance having high hole injection properties among charge injection transport materials, for example, metal oxide such as molybdenum oxide (MoOx), vanadium oxide (VOx), a ruthenium oxide (RuOx), tungsten oxide (WOx), or manganese oxide (MnOx) is used. In addition, phthalocyanine (abbreviation: $H_2Pc$) or a phthalocyanine compound such as copper phthalocyanine (CuPc) can be used.

The light emitting layer may have a structure to perform color display by providing each pixel with light emitting layers having different emission wavelength ranges. Typically, a light emitting layer corresponding to each color of R (red), G (green), or B (blue) is formed. On this occasion, color purity can be improved and a pixel area can be prevented from having a mirror surface (reflection) by providing the light emission side of the pixel with a filter which transmits light of an emission wavelength range. By providing a filter, a circularly polarizing plate or the like that is conventionally required can be omitted, and further, the loss of light emitted from the light emitting layer can be eliminated. Further, change in hue, which occurs when a pixel area (display screen) is obliquely seen, can be reduced.

Various materials can be used for a light emitting material. As a low molecular weight organic light emitting material, 4-dicyanomethylene-2-methyl-6-[2-(1,1,7,7-tetramethyl-9-julolidyl)ethenyl]-4H-pyran; (abbreviation: DCJT); 44-dicyanomethylene-2-t-butyl-6-[2-(1,1,7,7-tetramethyljulolidine-9-yl-ethenyl)]-4H-pyran; (abbreviation: DCJTB); periflanthene; 2,5-dicyano-1,4-bis[2-(10-methoxy-1,1,7,7-tetramethyljulolidine-9-yl)ethenyl]benzene; N,N'-dimethylquinacridon (abbreviation: DMQd); coumarin 6; coumarin 545T; tris(8-quinolinolato)aluminum (abbreviation: $Alq_3$); 9,9'-bianthryl; 9,10-diphenylanthracene (abbreviation: DPA); 9,10-bis(2-naphthyl)anthracene (abbreviation: DNA); and the like can be used. Another substance can also be used.

On the other hand, a high molecular weight organic light emitting material is physically stronger than a low molecular weight material and is superior in durability of the element. In addition, a high molecular weight organic light emitting material can be formed by coating; therefore, the element can be relatively manufactured easily. The structure of a light emitting element using a high molecular weight organic light emitting material basically has the same structure as in the case of using a low molecular weight organic light emitting material, that is, a cathode, an organic light emitting layer, and an anode are stacked in order. However, a two-layer structure is employed in many cases when a light emitting layer using a high molecular weight organic light emitting material is formed. This is because it is difficult to form such a layered structure as in the case of using a low molecular weight organic light emitting material. Specifically, the light emitting element using a high molecular weight organic light emitting material has a structure of a cathode, a light emitting layer, a hole transport layer, and an anode in order.

The emission color is determined depending on a material forming the light emitting layer; therefore, a light emitting element which displays desired luminescence can be formed by selecting an appropriate material for the light emitting layer. As a high molecular weight electroluminescent material which can be used for forming a light emitting layer, a polyparaphenylene-vinylene-based material, a polyparaphenylene-based material, a polythiophene-based material, or a polyfluorene-based material can be used.

As the polyparaphenylene vinylene-based material, a derivative of poly(paraphenylenevinylene) [PPV], for example, poly(2,5-dialkoxy1,4-phenylenevinylene) [RO-PPV]; poly(2-(2'-ethyl-hexoxy)-5-methoxy-1,4-phenylenevinylene) [MEH-PPV]; poly(2-(dialkoxyphenyl)-1,4-phenylenevinylene) [ROPh-PPV]; and the like can be used. As the polyparaphenylene-based material, a derivative of poly-paraphenylene [PPP], for example, poly(2,5-dialkoxy-1,4-phenylene) [RO-PPP]; poly(2,5-dihexoxy-1,4-phenylene); and the like can be used. As the polythiophene-based material, a derivative of a derivative of polythiophene [PT], for example, poly(3-alkylthiophene) [PAT]; poly(3-hexylthiophen) [PHT]; poly(3-cyclohexylthiophen) [PCHT]; poly (3-cyclohexyl-4-methylthiophene) [PCHMT]; poly(3,4-dicyclohexylthiophene) [PDCHT]; poly[3-(4-octylphenyl)-thiophene] [POPT]; poly[3-(4-octylphenyl)-2,2bithiophene] [PTOPT]; and the like can be used. As the polyfluorene-based material, a derivative of polyfluorene [PF], for example, poly(9,9-dialkylfluorene) [PDAF]; poly(9,9-dioctylfluorene) [PDOF]; and the like can be used.

When a high molecular weight organic light emitting material having hole transport properties is formed between an anode and a high molecular weight organic light emitting material having light emitting properties, hole injection properties from the anode can be enhanced. Generally, a high molecular weight organic light emitting material having hole transport properties which is dissolved in water with an acceptor material is applied by spin coating or the like. In addition, the high molecular weight light emitting material having hole injection properties is insoluble in an organic solvent; therefore, it can be formed over the above-mentioned high molecular weight organic light emitting material having light emitting properties. As the high molecular weight organic light emitting material having hole transportability, a mixture of PEDOT and camphor-10-sulfonic acid (CSA) that serves as an acceptor material, a mixture of polyaniline [PANI] and polystyrene sulfonic acid [PSS] that serves as an acceptor material, or the like can be used.

The light emitting layer can be made to emit single color or white light. When a white light emitting material is used, color display can be made possible by applying a structure in which a filter (a coloring layer) which transmits light having a specific wavelength to the light emitting side of a pixel is provided.

In order to form a light emitting layer that emits white light, for example, $Alq_3$, $Alq_3$ partially doped with Nile red that is a red light emitting colorant, $Alq_3$, p-EtTAZ, TPD (aromatic diamine) are stacked in order by a vapor deposition method (to obtain white light). In the case where the light emitting layer is formed by an application method using spin coating, the layer formed by spin coating is preferably baked by vacuum heating. For example, an aqueous solution of poly(ethylene dioxythiophene)\poly (styrene sulfonic acid) solution (PEDOT\PSS) may be entirely applied and baked to form a film that functions as a hole injection layer. Then, a polyvinyl carbazole (PVK) solution doped with a luminescent center colorant (1,1,4,4-tetraphenyl-1,3-butadiene (TPB); 4-dicyanomethylene-2-methyl-6-(p-dimethylamino-styryl)-4H-pyran (DCM1); Nile red; coumarin 6; or the like) may be entirely applied and baked to form a film that functions as a light emitting layer.

The light emitting layer may be formed to be a single layer. For example, a 1,3,4-oxadiazole derivative (PBD) having electron transport properties may be dispersed in polyvinyl carbazole (PVK) having hole transportability. Further, white light emission can be obtained by dispersing PBD of 30 wt % as an electron transporting agent and dispersing an appropriate amount of four kinds of colorants (TPB, coumarin 6, DCM1, and Nile red). In addition to the light emitting element from which white light emission can be obtained as shown here, a light emitting element which can provide red light emission, green light emission, or blue light emission can be manufactured by appropriately selecting materials of the light emitting layer.

Further, a triplet light emitting material containing a metal complex or the like as well as a singlet light emitting material may be used for the light emitting layer. For example, among pixels emitting red, green, and blue light, a pixel emitting red light whose luminance is reduced by half in a relatively short time is formed of a triplet light emitting material and the rest are formed of a singlet light emitting material. A triplet light emitting material has a feature of good luminous efficiency and less power consumption to obtain the same luminance. When a triplet light emitting material is used for a red pixel, only small amount of current needs to be supplied to a light emitting element. Thus, reliability can be improved. A pixel emitting red light and a pixel emitting green light may be formed of a triplet light emitting material and a pixel emitting blue light may be formed of a singlet light emitting material to achieve low power consumption. Low power consumption can be further achieved by forming a light emitting element which emits green light that has high visibility with a triplet light emitting material.

A metal complex used as a dopant is an example of a triplet light emitting material, and a metal complex having platinum that is a third transition series element as a central metal, a metal complex having iridium as a central metal, and the like are known. A triplet light emitting material is not limited to the compounds. A compound having the above described structure and an element belonging to any of the Groups 8 to 10 of the periodic table as a central metal can also be used.

The above described materials for forming the light emitting layer are just examples. A light emitting element can be formed by appropriately stacking functional layers such as a hole injection transport layer, a hole transport layer, an electron injection transport layer, an electron transport layer, a light emitting layer, an electron blocking layer, and a hole blocking layer. Further, a mixed layer or a mixed junction may be formed by combining these layers. The layer structure of the light emitting layer can be varied. Instead of providing a specific electron injection region or light emitting region, modification such as providing an electrode for the purpose or providing a dispersed light emitting material is acceptable as long as it does not deviate from the scope of the invention.

A light emitting element formed with the above described materials emits light by being forward biased. A pixel of a display device formed with a light emitting element can be driven by a simple matrix mode or an active matrix mode. In any event, each pixel emits light by applying a forward bias thereto at a specific timing; however, the pixel is in a non-light-emitting state for a certain period. Reliability of a light emitting element can be improved by applying a reverse bias in the non-light-emitting time. In a light emitting element, there is a deterioration mode in which emission intensity is decreased under specific driving conditions or a deterioration mode in which a non-light-emitting region is enlarged in the pixel and luminance is apparently decreased. However, progression of deterioration can be slowed down by alternating current driving where bias is applied forward and reversely. Thus, reliability of a light emitting device can be improved. Additionally, either of digital driving and analog driving can be applied.

A color filter (coloring layer) may be formed over the sealing substrate. The color filter (coloring layer) can be formed by a deposition method or a droplet discharge method. With the use of the color filter (coloring layer), high-definition display can also be performed. This is because a broad peak can be modified to be sharp in light emission spectrum of each RGB.

The case of forming a material displaying luminescence of R, G, and B is shown above; however, full color display can be performed by forming a material displaying a single color and combining a color filter and a color conversion layer. The color filter (coloring layer) or the color conversion layer is formed over, for example, a second substrate (a sealing substrate) and may be attached to a substrate.

Naturally, display may be performed in monochrome. For example, an area color type display device may be manufactured by using single color emission. The area color type is suitable for a passive matrix type display area, and characters and symbols can be mainly displayed.

In the above-mentioned structure, it is possible to use a low work function material as a cathode, for example, Ca, Al, CaF, MgAg, AlLi, or the like is desirable. Any of a single layer type, a layered type, a mixed type having no interface between layers can be used for the electroluminescent layer. The electroluminescent layer may be formed by a singlet material, a triplet material, or a mixture of the materials; or a charge injection transport material and a light emitting material including an organic compound or an inorganic compound, which includes one layer or plural layers of a low molecular weight organic compound material, an intermediate molecular weight organic compound (which means an organic compound having no sublimation properties, and the number of molecules is 20 or less or the length of linked molecules is 10 μm or less), and a high molecular weight organic compound, which are defined by the number of molecules, and may be combined with an electron injection transport inorganic compound or a hole injection transport inorganic compound. The first electrode layer is formed with a transparent conductive film which transmits light, and for example, a transparent conductive film in which zinc oxide (ZnO) of 2% to 20% is mixed in indium oxide is used in addition to ITSO or ITSO. Plasma treatment or heat treatment in vacuum atmosphere may be preferably performed before forming the first electrode. The partition wall (also referred to as a bank) is formed with a material containing silicon, an organic material or a compound material. Additionally, a porous film may be used. However, when a photosensitive material or a non-photosensitive material such as acrylic or polyimide is used to form the bank, the side face thereof has a shape in which a radius curvature changes continuously, and an upper layer thin film is formed without disconnection due to a step, which is preferable. This embodiment mode can be freely combined with the above-mentioned embodiment modes.

By applying the invention, the thickness distribution of an insulating layer constituting a display device can be uniform and the planarity is improved. Accordingly, by using such an insulating layer, a high-definition and high-quality display device can be manufactured with high yield at low cost.

EMBODIMENT MODE 6

In this embodiment mode, other examples of a display device according to the invention will be described with reference to FIG. 8 and FIG. 9. Display devices shown in this embodiment mode use an inverted staggered thin film transistor for a transistor in the display device manufactured in Embodiment Mode 2. Accordingly, descriptions on the same components or the components having similar functions will not be repeated.

Figure 9:
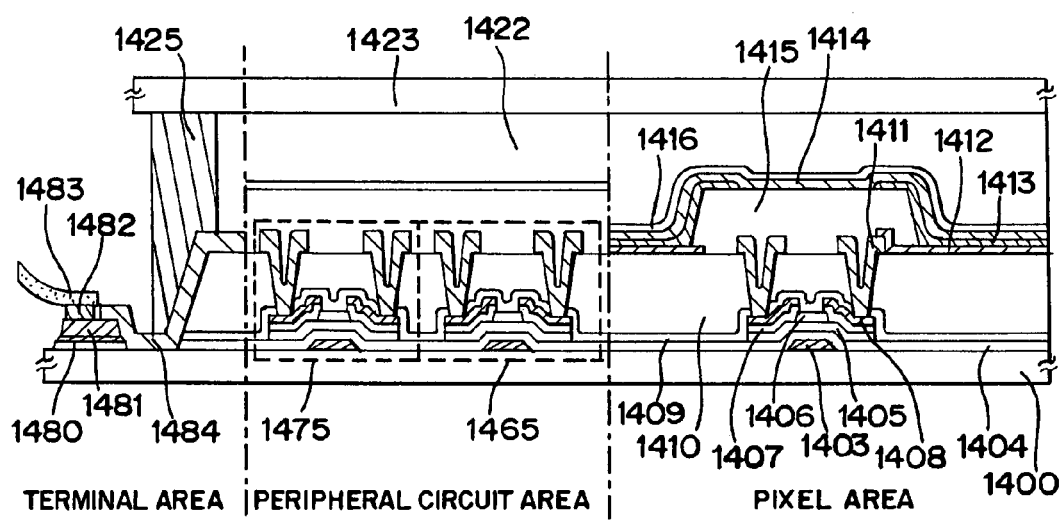
FIG. 9 is a cross-sectional view of a semiconductor device of the invention.

A TFT shown in FIG. 9 is a channel protective type. Thin film transistors 1465 and 1475 provided over an element substrate 1400 are in a driver circuit area, and a gate insulating film 1404, a semiconductor layer 1405, and an n-type semiconductor layer 1407 as a semiconductor layer having one conductivity type, and a metal layer 1408 are stacked over a gate electrode layer 1403, and a channel protective layer 1406 and an electrode layer 1411 are formed over a portion to be a channel region of the semiconductor layer 1405. An electroluminescent layer 1413 and a second electrode layer 1414 are formed over the first electrode layer 1412 to form a light emitting element, and a passivation film 1416 is formed over the light emitting element. The element substrate 1400 is adhered (fixed) to a sealing substrate 1423 with a sealant 1425. Since an insulating layer 1409 and a partition wall 1410 are formed by spin coating with optimized viscosity according to the invention, it has high planarity. A wiring layer 1484 is electrically connected to the outside through terminal electrode layers 1480 and 1481, an anisotropic conductive layer 1482, and an FPC 1483. A display device according to this embodiment mode is filled with a resinous filler 1422. Alternatively, the display device may be filled with nitrogen by conducting a sealing process under a nitrogen atmosphere.

Figure 8:
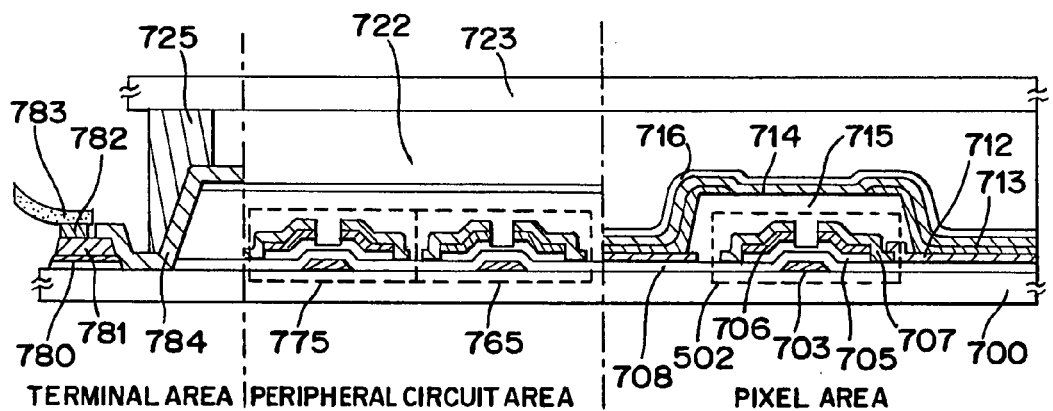
FIG. 8 is a cross-sectional view of a display device of the invention.

A TFT shown in FIG. 8 is a channel etch type. In the display device shown in FIG. 8, thin film transistors 765 and 775 provided over an element substrate 700 are in a driving circuit area; a gate insulating film 708, a semiconductor layer 705, an n-type semiconductor layer 706 as a semiconductor layer having one conductivity type, and an electrode layer 707 which is a source electrode layer or a drain electrode layer are stacked over a gate electrode layer 703; and a portion to be a channel region of the semiconductor layer 705 is etched to be thin. An electroluminescent layer 713 and a second electrode layer 714 are stacked over a first electrode layer 712 to form a light emitting element, and a passivation film 716 is formed over the light emitting element. The element substrate 700 is adhered (fixed) to a sealing substrate 723 with a sealant 725. Since an insulating layer 715 is formed by spin coating with optimized viscosity according to the invention, it has high planarity. A wiring layer 784 is electrically connected to the outside through terminal electrode layers 780 and 781, an anisotropic conductive film 782, and an FPC 783. The display device shown in FIG. 8 has a structure in which the insulating layer 715 has function of both an interlayer insulating layer and an insulating layer to be a partition wall in the display device in Embodiment Mode 2.

Both display devices having inverted staggered TFTs in FIG. 8 and FIG. 9 are bottom emission type display devices in which light is emitted from the element substrate side, and a conductive film having light-transmitting properties is used for each first electrode layer.

The above-mentioned semi-amorphous semiconductor film can be used as the semiconductor layer. The semiconductor layer having one conductivity type may be formed, as necessary. Further, an organic semiconductor of such as pentacene can be formed.

By applying the invention, the thickness distribution of an insulating layer constituting a display device can be uniform and the planarity is improved. Accordingly, by using such an insulating layer, a high-definition and high-quality display device can be manufactured with high yield at low cost.

EMBODIMENT MODE 7

Figure 21:
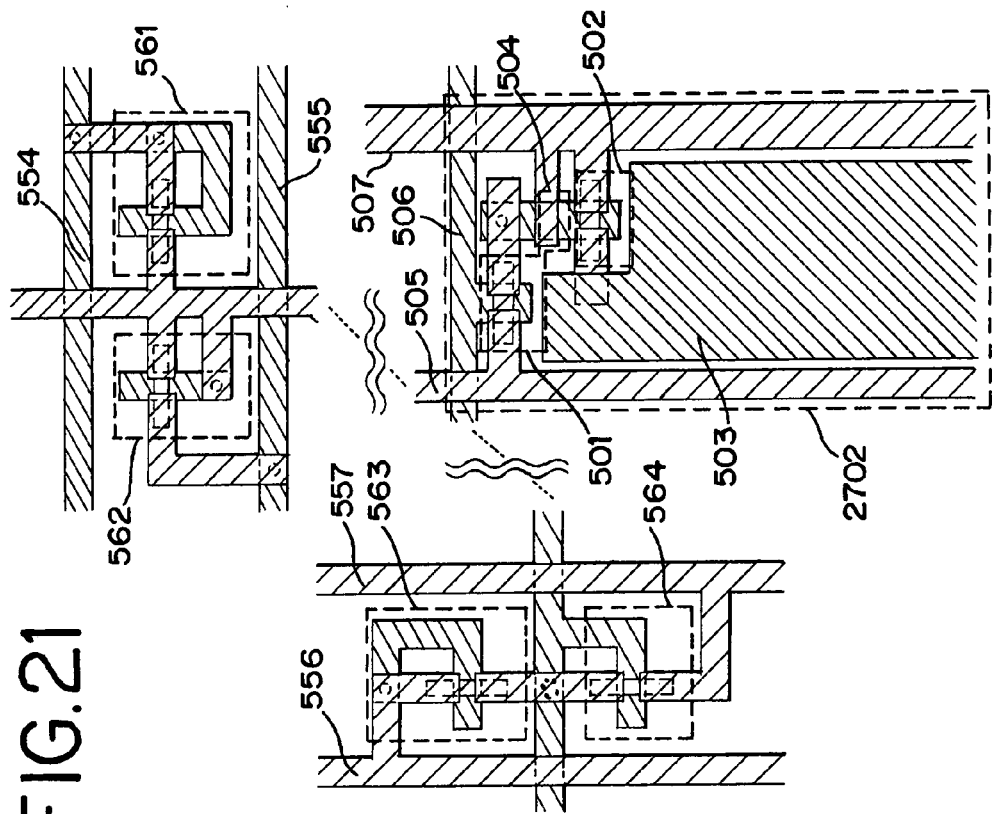
FIG. 21 is a top view of an electroluminescent display panel of the invention.

One mode in which protective diodes are provided for a scan line input terminal area and a signal line input terminal area is explained with reference to FIG. 21. TFTs 501 and 502, a capacitor 504, and a light emitting element 503 are provided for a pixel 2702 in FIG. 21. This TFT has the same structure as that in Embodiment Mode 6.

Figure 20:
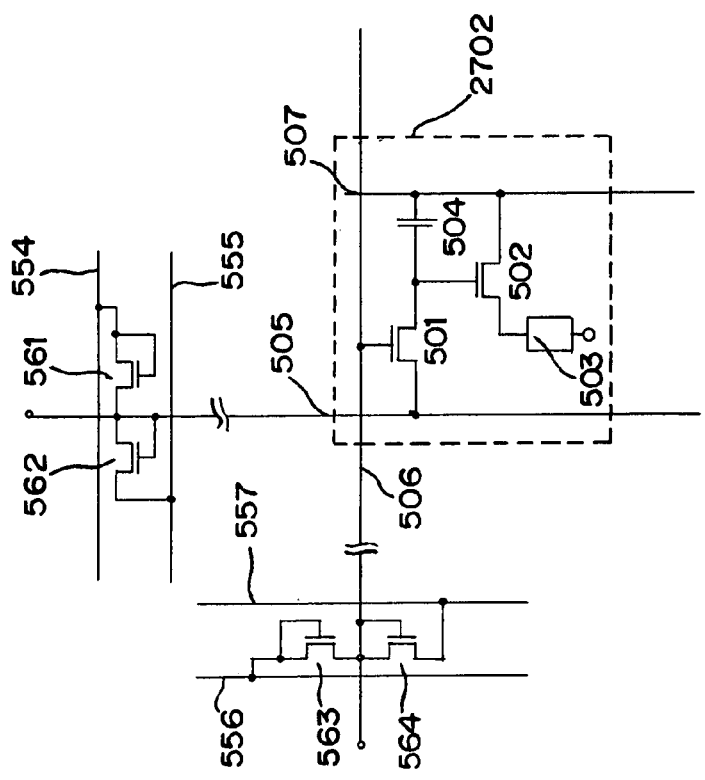
FIG. 20 is an equivalent circuit diagram of an electroluminescent display panel shown in FIG. 21.

Protective diodes 561 and 562 are provided for the signal line input terminal area. These protective diodes are manufactured in the same step as that of the TFT 501 or 502 and being operated as diodes by being each connected to a gate and one of a drain and a source. FIG. 20 shows an equivalent circuit diagram of what is shown in a top view shown in FIG. 21.

The protective diode 561 includes a gate electrode layer, a semiconductor layer, a wiring layer. The protective diode 562 has the similar structure. Wirings 554 and 555 connecting to the protective diode are formed in the same layer as that of the gate electrode layer. Therefore, it is necessary to form a contact hole in the insulating layer to electrically connect the wirings to the wiring layer.

A mask layer may be formed and etching-processed to form a contact hole in the insulating layer. In this case, when etching at atmospheric pressure discharge is applied, electric discharging process can be locally performed, and the mask layer is not necessarily formed over the entire surface.

A signal wiring layer is formed in the same layer as that of a source/drain wiring layer 505 in the TFT 501 and has a structure in which the signal wiring layer connected thereto is connected to the source or drain side.

The input terminal area of the scanning signal line side also has the same structure. The protective diodes provided in an input stage can be formed at the same time. Note that the position of disposing a protective diode is not limited to this embodiment mode and can also be provided between a driver circuit and a pixel.

As described above, according to the invention, a pattern of a wiring or the like can be stably formed with good control without causing a formation defect. Therefore, even when a wiring or the like is complex and formed densely by forming a protective circuit, a short circuit or the like due to the bad disposition at the time of formation is not caused. As a result, a display device having preferable electric characteristics and high reliability can be manufactured.

EMBODIMENT MODE 8

FIG. 12 shows an example where a TFT substrate constitutes an EL display module having a TFT substrate 2800 manufactured according to the present invention. A pixel area including pixels is formed over the TFT substrate 2800.

In FIG. 12, a TFT which is the same as that formed in a pixel or a protective circuit area 2801 operated in the same manner as a diode by being connected to a gate and one of a source or a drain of the TFT is provided between a driver circuit and the pixel outside of the pixel area. A driver IC formed from a single crystal semiconductor, a stick driver IC formed from a polycrystalline semiconductor film over a glass substrate, or a driver circuit formed of SAS is applied to a driver circuit 2809.

The TFT substrate 2800 is fixed to a sealing substrate 2820 with interposing spacers 2806a and 2806b therebetween. The spacer is preferably provided to keep the space between two substrates constant even when a substrate is thin and area of a pixel area is enlarged. A space between the TFT substrate 2800 and the sealing substrate 2820 over light emitting elements 2804 and 2805 respectively connected to TFTs 2802 and 2803 may be filled with a light-transmitting resin material and solidified, or may be filled with dehydrated nitrogen or an inert gas.

FIG. 12 shows the case where the light emitting elements 2804 and 2805 have a structure of a top emission type and has a structure in which light is emitted in the direction of the arrow shown in the figure. Multicolor display can be carried out in each pixel by having different luminescent colors of red, green, and blue. In addition, at this time, color purity of the luminescence emitted outside can be enhanced by forming coloring layers 2807a, 2807b and 2807c corresponding to each color on the side of the sealing substrate 2820. Moreover, the coloring layers 2807a, 2807b and 2807c may be combined with a pixel using a white light emitting element.

The driver circuit 2809 which is an external circuit is connected to a scan line or signal line connection terminal provided over one end of an external circuit substrate 2811 through a wiring substrate 2810. In addition, a heat pipe 2813 and a heat sink 2812 may be provided to be in contact with or close to the TFT substrate 2800 to improve a radiating function.

FIG. 12 shows the top emission type EL module, however, it may be a bottom emission structure by changing the structure of the light emitting element or the disposition of the external circuit substrate. Naturally, a dual emission structure in which light is emitted from both sides of the top and bottom surfaces may be used. In the case of the top emission structure, the insulating layer which is to be a partition wall may be colored to be used as a black matrix. This partition wall can be formed by a droplet discharge method or the like and it may be formed by mixing a black resin pigment, carbon black, or the like into a resin material such as polyimide, or a laminate thereof may also be used.

Sealing may be performed by attaching a resin film with the use of a sealant or an adhesive resin to the side of the TFT substrate 2800 where the pixel area is formed. In this embodiment mode, glass sealing using a glass substrate is shown, however, various sealing methods such as resin sealing using a resin, plastic sealing using plastic, and film sealing using a film can be used. A gas barrier film which prevents moisture from penetrating is preferably provided on the surface of a resin film. By applying a film sealing structure, thinness and lightweight can be further realized.

EMBODIMENT MODE 9

A television device can be completed with a display device formed according to the present invention. A display panel can be formed in any manner as follows: as the structure shown in FIG. 14A, only a pixel area is formed, and a scan line driver circuit and a signal line driver circuit are mounted by a TAB method as shown in FIG. 15B; as the structure shown in FIG. 14A, only a pixel area is formed, and a scan line driver circuit and a signal line driver circuit are mounted by a COG method as shown in FIG. 15A; a TFT is formed of a SAS, a pixel area and a scan line driver circuit are integrally formed over a substrate, and a signal line driver circuit is separately mounted as a driver IC as shown in FIG. 14B; a pixel area, a signal line driver circuit, and a scan line driver circuit are integrally formed over the substrate as shown in FIG. 14C; or the like.

Another structure of an external circuit includes a video signal amplifier circuit which amplifies a video signal received by a tuner; a video signal processing circuit which converts the video signal output therefrom into a chrominance signal corresponding to each color of red, green, and blue; a control circuit which converts the video signal into an input specification of a driver IC; and the like on input side of the video signal. The control circuit outputs the signal into the scan line side and the signal line side, respectively. In the case of digital driving, a signal dividing circuit may be provided on the signal line side, so that an input digital signal is provided by dividing into m-pieces.

Among signals received from the tuner, an audio signal is transmitted to an audio signal amplifier circuit, and the output thereof is supplied for a speaker through an audio signal processing circuit. A control circuit receives control information on a receiving station (a receiving frequency) or sound volume from an input portion and transmits the signal to the tuner or the audio signal processing circuit.

FIG. 13 shows an example of a liquid crystal display module, and a TFT 2600 and a counter substrate 2601 are fixed with a sealant 2602, with a pixel area 2603 and a liquid crystal layer 2604 interposed therebetween to form a display region. Coloring layer 2605 is required in the case of performing a color display. In the case of an RGB method, coloring layers corresponding to red, green, and blue are provided for each pixel. Polarizing plates 2606 and 2607, an optical film 2613 are provided outside the TFT substrate 2600 and the counter substrate 2601. A light source includes a cold cathode tube 2610 and reflector plate 2611, and a circuit substrate 2612 is connected to the TFT substrate 2600 through a driver circuit 2608 and a flexible wiring substrate 2609 and an external circuit such as a control circuit or a power supply circuit is incorporated.

Figure 10A:
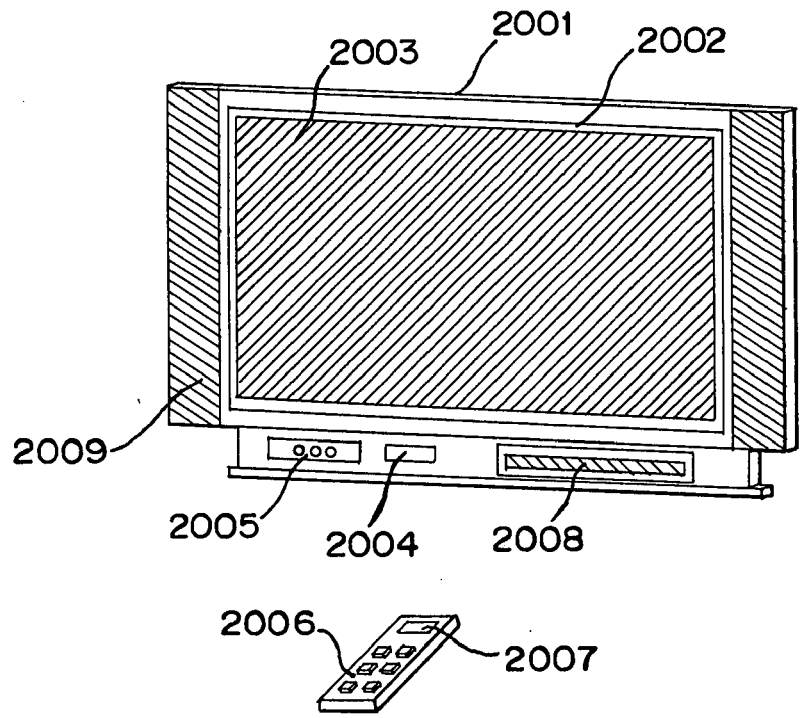
FIGS. 10A and 10B are figures which show electronic devices to which the invention is applied.
Figure 10B:
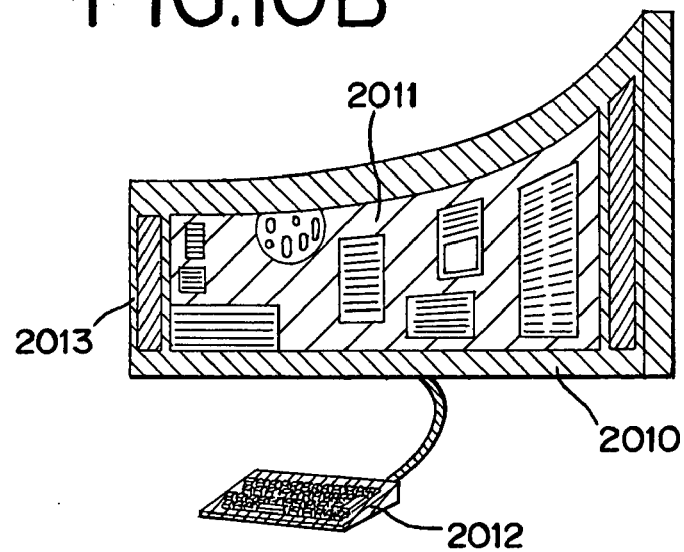

As shown in FIGS. 10A and 10B, a television device can be completed by incorporating a display module into a chassis. An EL television device can be completed when an EL display module as in FIG. 12 is used, and a liquid crystal television device can be completed when a liquid crystal module as in FIG. 13 is used. A main screen 2003 is formed by using the display module, and a speaker unit 2009, operation switches, and the like are provided as other attached equipments. In such a manner, the television device can be completed according to the invention.

In addition, reflected light of light entered from exterior may be shielded by using a wave plate and a polarizing plate. In the case of top emission display device, an insulating layer which is to be a partition wall may be colored to be used as a black matrix. The partition wall can be formed by a droplet discharge method or the like, and a black resin pigment, a resin material such as polyimide, which is mixed with carbon black, or the like may be used, or a laminate thereof may also be used. Depending on a droplet discharge method, different materials may be discharged on the same region plural times to form the partition wall. A quarter/half wave plates may be used as wave plates and may be designed to be able to control light. As the structure, a TFT element substrate, a light emitting element, a sealing substrate (sealant), wave plates (quarter wave/half wave plates), a polarizing plate are stacked in order, in which light emitted from the light emitting element is emitted outside from the polarizing plate side through the above components. The wave plate or polarizing plate may be provided on a side where light is emitted or may be provided on the both sides in the case of a dual emission type display device in which light is emitted from the both faces. In addition, an anti-reflective film may be provided on the outer side of the polarizing plate. Consequently, higher definition and more with higher definitionaccurate image can be displayed.

As shown in FIG. 10A, a display panel 2002 using a display element is incorporated into a chassis 2001. By using a receiver 2005, in addition to receiving general TV broadcast, information communication can also be carried out in one direction (from a transmitter to a receiver) or in the both directions (between a transmitter and a receiver or between receivers) by connecting to a communication network by a fixed line or wirelessly through a modem 2004. The operation of the television device can be carried out by switches incorporated in the chassis or by a remote control device 2006, which is separated from the main body. A display area 2007 that displays information to be output may be also provided for this remote control device.

In addition, in the television device, a structure for displaying a channel, sound volume, or the like may be additionally provided by forming a sub-screen 2008 for a second display panel in addition to the main screen 2003. In this structure, the main screen 2003 is formed of an EL display panel superior in a viewing angle, and the sub-screen may be formed of a liquid crystal display panel capable of displaying the sub-screen with low power consumption. In order to prioritize low power consumption, a structure in which the main screen 2003 is formed of a liquid crystal display panel, the sub-screen is formed of an EL display panel, and the sub-screen is able to flash on and off may be also applied. According to the invention, a display device with high reliability can be manufactured by using such a large substrate even when many TFTs and electronic parts are used.

FIG. 10B shows a television device having a large display area of, for example, 20 inches to 80 inches, which includes a chassis 2010, a keyboard 2012 which is an operation portion, a display area 2011, a speaker unit 2013, and the like. The invention is applied to manufacturing the display area 2011. FIG. 10B shows a television device having a curved display area since a bendable material is used for the display area. Thus, a television device having a desired shape can be manufactured since the shape of the display area can be freely designed.

According to the invention, an insulating layer can be formed with high planarity. Further, the insulating layer can be formed through a simple process, so that costs can be reduced. Hence, a television device even with a large screen display area can be formed with low cost by applying the invention. Accordingly, a high-performance and highly reliable television device can be manufactured with high yield.

Naturally, the invention is not limited to the television device and is applicable to various usages especially to the display mediums having a large area such as an information display board at a station, an airport, or the like, or an advertisement display board on the street as well as a monitor of a personal computer.

EMBODIMENT MODE 10

Various display devices can be manufactured by applying the present invention. In other words, the invention can be applied to various electronic devices in which these display devices are incorporated into display areas.

The electronic devices include a camera such as a video camera or a digital camera, a projector, a head mounted display (a goggle type display), a car navigation system, a car stereo, a personal computer, a game machine, a portable information terminal (a mobile computer, a cellular phone, an electronic book, or the like), an image reproducing device provided with a recording medium (specifically a device that is capable of playing a recording medium such as a Digital Versatile Disc (DVD) and that has a display device that can display the image) or the like. FIGS. 11A to 11D show the examples thereof.

Figure 11A:
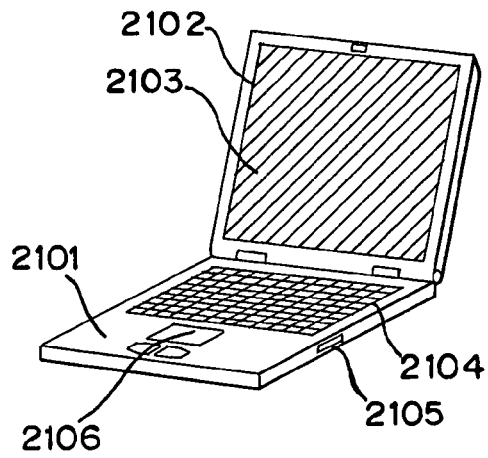
FIGS. 11A to 11D are figures which show electronic devices to which the invention is applied.

FIG. 11A shows a computer, which includes a main body 2101, a chassis 2102, a display area 2103, a keyboard 2104, an external connection port 2105, a pointing mouse 2106 and the like. According to the invention, a computer by which an image with high reliability and high resolution can be displayed can be completed even if the computer is miniaturized and a pixel is minute.

Figure 11B:
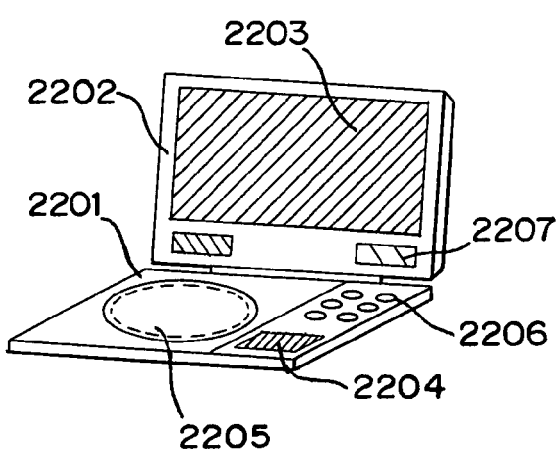

FIG. 11B shows an image reproducing device provided with a recording medium (specifically a DVD reproducing device), which includes a main body 2201, a chassis 2202, a display area A 2203, a display area B 2204, a recording medium (such as a DVD) reading portion 2205, operation keys 2206, a speaker portion 2207 and the like. The display area A 2203 mainly displays image information and the display area B 2204 mainly displays character information. According to the invention, an image producing device by which an image with high reliability and high resolution can be displayed can be completed even when the image reproducing device is miniaturized and a pixel is minute.

Figure 11C:
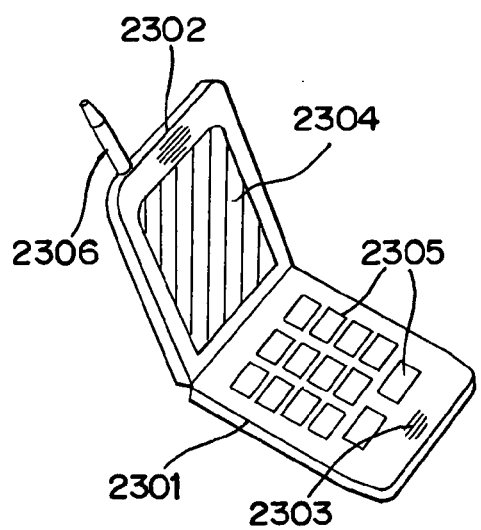

FIG. 11C shows a cellular phone, which includes a main body 2301, an audio output portion 2302, an audio input portion 2303, a display area 2304, operation switches 2305, an antenna 2306, and the like. According to the invention, a cellular phone by which an image with high reliability and high resolution can be displayed can be completed even when the cellular phone is miniaturized and a pixel is minute.

Figure 11D:
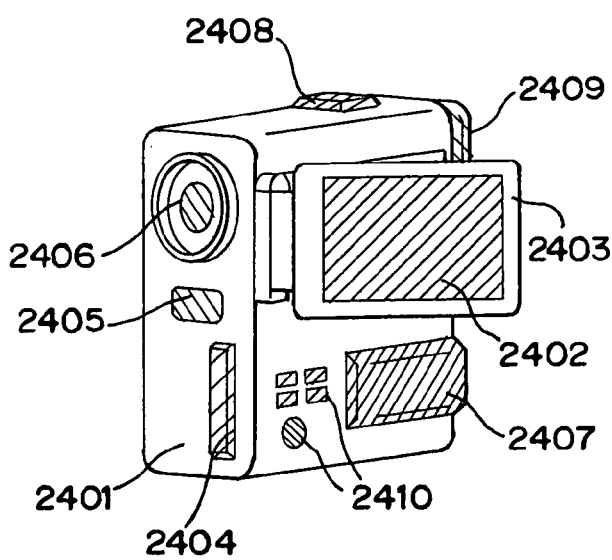

FIG. 11D shows a video camera, which includes a main body 2401, a display area 2402, a chassis 2403, an external connection port 2404, a remote control receiving portion 2405, an image receiving portion 2406, a battery 2407, an audio input portion 2408, an eyepiece 2409, operation keys 2410, and the like. According to the invention, a video camera by which an image with high reliability and high resolution can be displayed can be completed even when the video camera is miniaturized and a pixel is minute. This embodiment mode can be freely combined with the above embodiment modes.

EMBODIMENT MODE 11

In this embodiment mode, an ID chip according to the invention will be described. One of semiconductor devices which can be manufactured according to a manufacturing method of the invention is an ID chip. An ID chip is a semiconductor device which can wirelessly transmit/receive data such as identifying information, and is developed for practical use. An ID chip is also referred to as a wireless tag, an RFID (radio frequency identification) tag, an IC tag, or the like. Further, an ID chip using a glass substrate can be referred to as an IDG chip (identification glass chip), and an ID chip using a flexible substrate can be referred to as an IDF (identification flexible chip). The present invention can be applied to either of them; however, the IDF chip will be described in this embodiment mode.

Figure 31A:
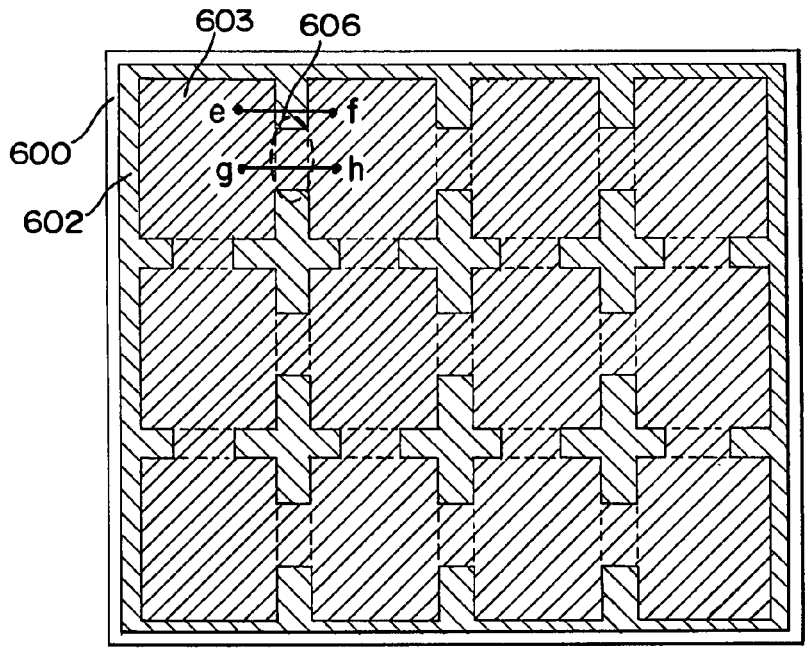
FIGS. 31A to 31C are figures showing a manufacturing method of a semiconductor device of the invention.
Figure 31B:
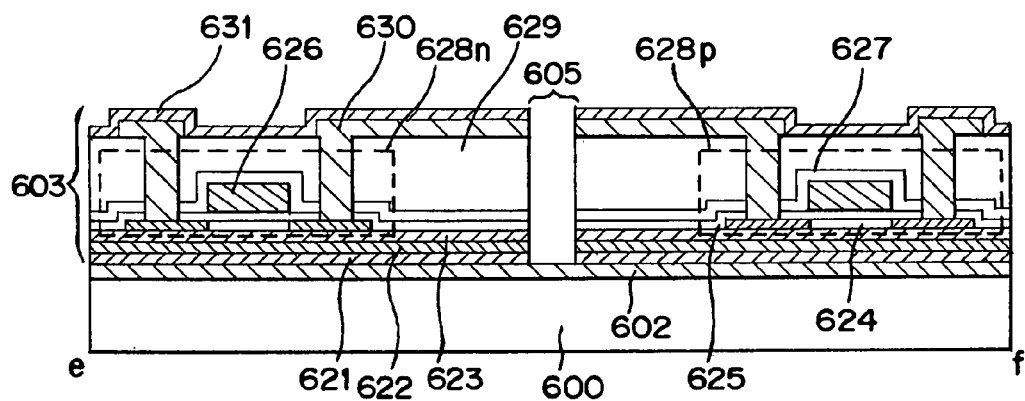
Figure 31C:
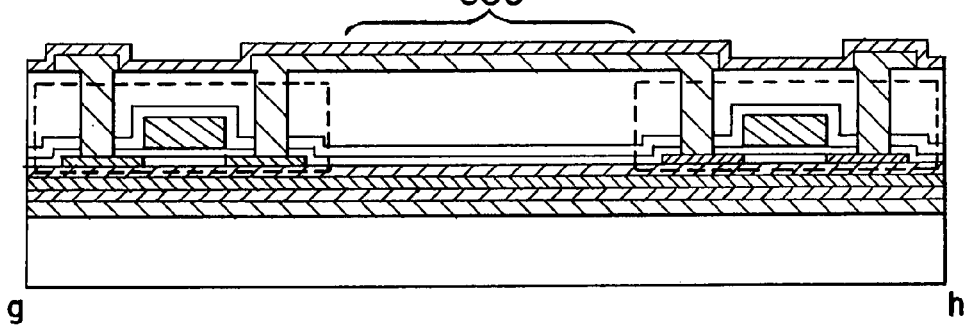

FIG. 31A is a top view of the case where 12 IDF chips 603 are formed over an insulating substrate 600. FIG. 31B is a cross-sectional view taken along line e-f in FIG. 31A. FIG. 31C is a cross-sectional view of a connection area 606 taken along line g-h. Note that, in this embodiment mode, SAS is used for a separation layer.

As shown in FIG. 31B, thin film transistors 628n and 628p including an insulating layer, a semiconductor layer 624 patterned to a desired shape, a gate electrode layer 626 provided over a gate insulation layer 625 are provided over an insulating substrate 600 with a separation layer 602 therebetween. Further, a wiring layer 630 is provided so as to connect to an impurity region in the semiconductor layer.

The insulating layer may have a layered structure. Here, the insulating layer has a first insulating film 621, a second insulating film 622, and a third insulating film 623.

The semiconductor layer can be formed to contain hydrogen of $1\times10^{19}$ atoms/cm$^3$ to $1\times10^{22}$ atoms/cm$^3$, preferably, $1\times10^{19}$ atoms/cm$^3$ to $5\times10^{20}$ atoms/cm$^3$ unlike a chip formed with a silicon wafer. Hydrogen can provide a so-called dangling-bond termination effect, which reduces dangling bonds in the semiconductor film. Further, the hydrogen can increase flexibility of the IDF chip 603.

Further, damage or separation due to bending stress of the thin film transistor can be prevented by making the patterned semiconductor layer occupy 1% to 30% of the area of the IDF chip 603.

It is preferable to provide an interlayer insulating layer 627 and a second interlayer insulating layer 629. In this embodiment mode, the interlayer insulating layer 627 and the second interlayer insulating layer 629 are formed according to the invention. As shown in Embodiment Mode 2 a composition containing an insulating material, which is a coating material solution is applied by an application apparatus. The viscosity of the composition containing an insulating material shall be 10 mPa·s (cP) to 50 mPa·s (cP), preferably, 20 mPa·s (cP) to 35 mPa·s (cP). As the coating material solution, a composition containing an insulating material is made with the above viscosity to form an insulating layer using an application apparatus; thus, the first interlayer insulating layer 627 and the second interlayer insulating layer having a highly planar surface with uniform thickness distribution, where even minute irregularities on the surface are reduced, can be formed. More preferably, a fourth insulating film 631 may be provided to cover the wiring layer 630.

Thereafter, a groove 605 is selectively formed to leave a connection region 606 in this embodiment mode. The groove can be formed by dicing, scribing, etching with the use of a mask, or the like. In the case of selectively forming the groove 605 to leave the connection region 606 as shown in FIG. 31C, the groove can be formed by dry etching, wet etching, or the like, after forming a mask pattern by a light exposure step and a development step. In dry etching, an atmospheric plasma method may be used.

Subsequently, the separation layer is removed by introducing an etchant into the groove. A gas or liquid containing a halogen fluoride can be used as an etchant. Specifically, $ClF_3$ (chlorine trifluoride) can be used as the halogen fluoride.

The separation layer of SAS is made gradually recede by introducing the etchant. Then, the insulating substrate can be removed as indicated by the arrow.

Even when the insulating substrate is removed, the IDF chips 603 are integrated by the connection region. Therefore, the IDF chips 603 are not separated from each other.

Thereafter, the IDF chips 603 are cut by a dicing, scribing, or laser cutting method. Then, the IDF chip 603 may be mounted on an article.

Figure 32A:
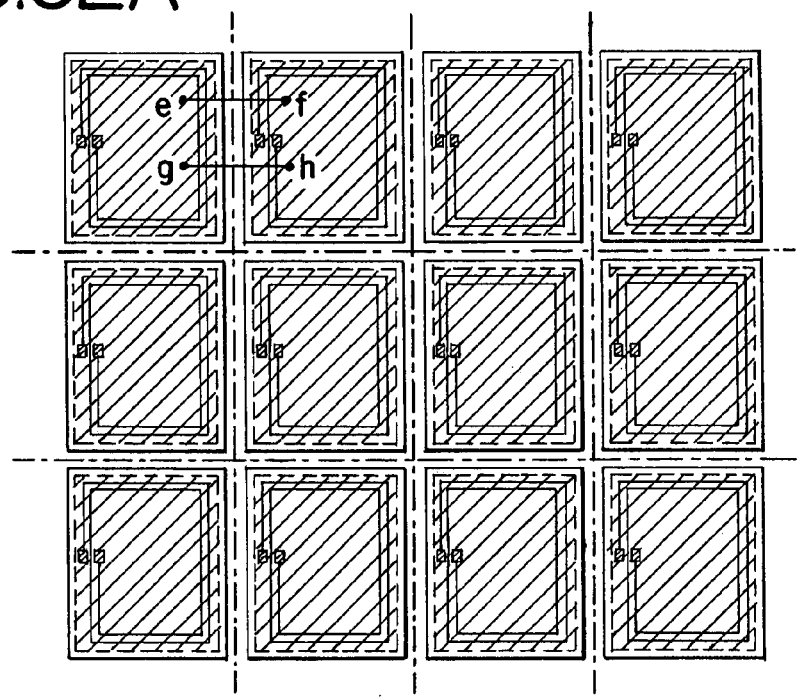
FIGS. 32A to 32C are figures showing a manufacturing method of a semiconductor device of the invention.
Figure 32B:
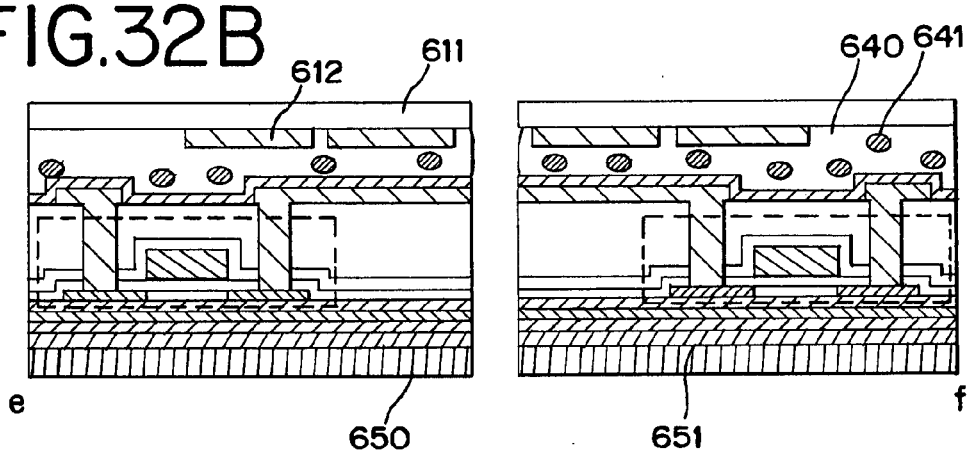
Figure 32C:
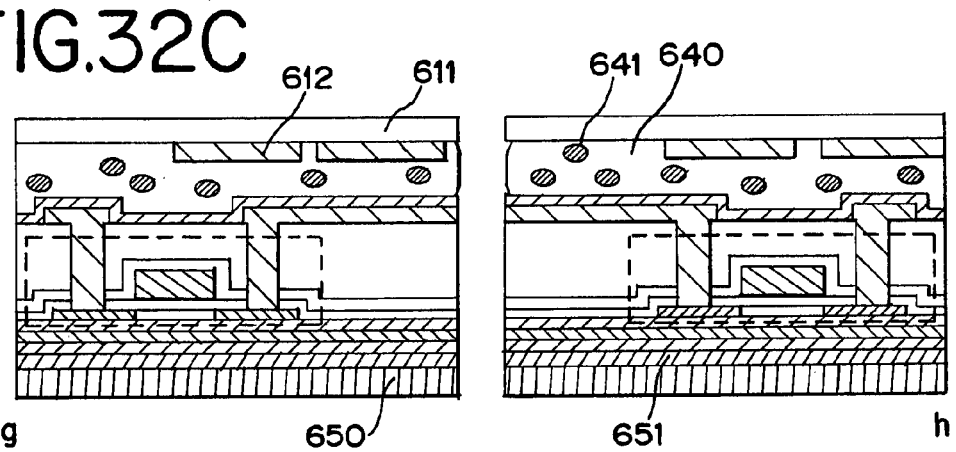

Although the IDF chip 603 can be completed through the above-described steps, a flexible substrate may be attached thereto, as shown in FIGS. 32A to 32C. FIG. 32A is a top view showing a state where a flexible substrate 650 is attached using an adhesive 651, FIG. 32B is a cross-sectional view taken along line e-f in FIG. 32A, and FIG. 32C is a cross-sectional view taken along line g-h crossing the connection region 606 in FIG. 32A.

A substrate made of plastics as described above or a synthetic resin such as acrylic can be used for the flexible substrate. In this embodiment mode, a substrate made of plastic is used.

A thermosetting resin, an ultraviolet curable resin, an epoxy resin, a resin additive, two-sided tape, or the like can be used as the adhesive.

The breaking strength of the IDF chip 603 can be increased by transferring the IDF chip 603 to the flexible substrate.

Subsequently, an antenna substrate 611 is attached thereto. The antenna substrate 611 is provided with an antenna 612 in a position corresponding to the IDF chip 603.

At this time, the IDF chip 603 and the antenna 612 are attached to each other with an anisotropic conductor 640 in which conductors 641 are dispersed. Instead of using the anisotropic conductor, the IDF chip 603 and the antenna may be attached with the use of an ultrasonic adhesive, an ultraviolet curable resin, two-sided tape, or the like.

Thereafter, the IDF chips 603 are cut by a dicing, scribing, or laser cutting method, thereby completing the IDF chip 603 formed over the flexible substrate.

The thus formed IDF chip 603 may be mounted on an article. A thermosetting resin, an ultraviolet curable resin, an epoxy resin, a resin additive, two-sided tape, or the like can be used as an adhesive for the mounting.

Although not shown, the IDF chip 603 may be covered with a resin or an insulating film containing nitrogen for protection. In particular, the side face of the IDF chip 603 is preferably covered therewith. The resin or the insulating film containing nitrogen can be made of the same material as an article to be mounted with the IDF chip 603.

In this embodiment mode, the IDF chip 603 is mounted with the use of an anisotropic conductor in a "face-down" manner, where the connection terminal of the IDF chip 603 faces the antenna, as described; however, the IDF chip 603 may also be mounted in a "face-up" manner, where the connection terminal faces in the opposite direction to the antenna.

As described above, a thin film transistor is formed over the insulating substrate 600, and the insulating substrate 600 is then separated. Preferably, the thin film transistor is further transferred to a flexible substrate. However, the timing of or the number of separations is not limited to this embodiment mode. In addition, the thin film transistor may be mounted on an article (mount article) without transferring the thin film transistor to the flexible substrate. Whether the IDF chip 603 is mounted in a "face-up" or "face-down" manner is determined in accordance with the number of transfers.

The case of attaching the antenna to the IDF chip 603 is described in this embodiment mode; however, the antenna may be directly formed over the IDF chip 603. For example, the antenna can be formed in the same layer as the wiring layer 630.

The contactless IDF chip is described in this embodiment mode; however, it may be either a contact IDF chip or a hybrid IDF chip.

The IDF chip and the antenna substrate are described as thick in this embodiment mode to make the description easy to understand. However, they are actually very thin1.

EXAMPLE 1

In this example, effect of the invention will be described based on an experimental result.

An insulating layer is formed over a substrate by an application method, and the plurality of the surface is evaluated.

A chromium (Cr) film is formed by sputtering over a substrate. Here, a 5 inch square Corning 1737 glass substrate is used. Thereafter, 3 ml of a composition containing an insulating material, which is a coating material solution is discharged, and is spread at 200 rpm for 3 seconds, and applied at each rotation rate for 20 seconds. A VSC8000 spin coater from Emsetech is used. The chromium film is formed so that the unevenness (interference fringes) due to light interference can be easily observed in evaluating the shape of the insulating layer surface. During the application, the composition containing an insulating material that extends to the side of the substrate opposite to the side where the insulating layer is formed is removed by discharging (spraying) a thinner liquid with the spin coater spun at 500 rpm. Thereafter, heating (prebake) is performed at 85° C. for 180 seconds, and bake is performed at 350° C. for an hour to form the insulating layer. Film thickness of each sample is measured with a film thickness measuring device (Nano Spec 6100 from NANO Metrics), the thicknesses of 25 points in each sample are measured and the average is defined as the thickness of each sample. The thicknesses of the samples are all from 1.0 μm to 1.8 μm. Such range of thickness is suitable for a planarization film of a semiconductor device.

The obtained insulating layer is irradiated with light, and unevenness (interference fringes) due to the irregularities on the surface, which reflects light reflection or interference; thus, the planarity is evaluated. In this specification, such unevenness (interference fringes) with which defect shape is judged is referred to as light interference unevenness (interference fringes) and the degree is evaluated with standard 1 (parameter 1), standard 2 (parameter 2), and standard 3 (parameter 3). The results of the standards (parameters) 1, 2, and 3 of the respective samples are shown in Charts 1 to 6. A fluorescent lamp with a photocatalyst which is three wave daylight lamp FL20SS-EX-D/18-C-A (produced by Toshiba) and a sodium lamp (D line 589 nm) are used for the light sources. The degree of the interference unevenness (interference fringes) is divided into three levels and arbitrary values 1, 2, 3 are given from high level (with prominent irregularities on the surface and not planarized) to low level (with little irregularities and well planarized) for the standard 1 (parameter 1). Specifically, one with unevenness (interference fringes) which is not observed even with the sodium lamp shall be 3, one with unevenness (interference fringes) that can be slightly observed with the sodium lamp but cannot be observed with the three wave lamp shall be 2, and one with unevenness (interference fringes) that can be easily observed with a three wave lamp shall be 1.

The averages of the standard 1 (parameter 1) of all the samples are obtained to be defined as standard 2 (parameter 2) for respective viscosities A to E. Further, three samples with thicknesses of 1.7, 1.3, 1.17 μm are selected from those of the respective viscosities A to E, and the totals of the standard 1 (parameter 1) thereof are defined as standard 3 (parameter 3). Standards (parameters) with higher values indicate to have preferable shapes where the surfaces are highly planarized; and standards (parameters) with low values indicate to have rough irregularities where the surfaces are not planarized well.

Samples that are compositions containing an insulating material and have the viscosities of (A) 32 mPa·s (cP), (B) 28 mPa·s (cP), (C) 16.7 mPa·s (cP), (D) 14 mPa·s (cP), and (E) 8.3 mPa·s (cP) are prepared. The concentrations of nonvolatile solute in the compositions are (A) 27.5%, (B) 30.0%, (C) 22.0%, (D) 28.0%, and (E) 22.0%.

The viscosities are measured at a liquid temperature of 25° C. with an E type viscometer which is a rotational viscometer. 1 g of the sample composition including an insulating material is put onto an aluminum pan, and is baked at 290° C. to measure the concentration of nonvolatile solute. Residue is weighed and the weight of the residue is divided by the weight of the sample before the baking, and multiplied by 100 so that the concentration of nonvolatile solute is expressed as a percentage.

A composition containing a siloxane polymer as a solvent and MMB (boiling point: 174° C.) is used for the samples (A) of the composition containing an insulating material. The rotation rate of the application apparatus is set at (A-1) 1650 rpm, (A-2) 1850 rpm, (A-3) 2050 rpm, (A-4) 2250 rpm, (A-5) 2450 rpm, (A-6) 2650 rpm, (A-7) 2850 rpm, and (A-8) 3050 rpm. The experiment result of (A-1) to (A-8) of the samples (A) is shown in Chart 1. Further, as shown in Chart 6, three points of A-1, A-4, and A-6 of the samples (A) are selected and the total point is defined as a standard 3 (parameter 3).

CHART I

| Sample (A) | | | |
|---|---|---|---|
| Sample | Rotation rate (rpm) | Film thickness (μm) | Parameter 1 |
| A-1 | 1650 | 1.78 | 2 |
| A-2 | 1850 | 1.58 | 2 |
| A-3 | 2050 | 1.48 | 2 |
| A-4 | 2250 | 1.35 | 2 |
| A-5 | 2450 | 1.26 | 3 |
| A-6 | 2650 | 1.19 | 3 |
| A-7 | 2850 | 1.13 | 3 |
| A-8 | 3050 | 1.08 | 3 |
| Viscosity (mPa·s) | 32 | Parameter 2 | 2.5 |

A composition containing a siloxane polymer and MMB (boiling point: 174° C.) as a solvent is used for the composition containing an insulating material of the samples (B). The rotation rate of the application apparatus is set at (B-1) 1650 rpm, (B-2) 1850 rpm, (B-3) 2050 rpm, (B-4) 2250 rpm, (B-5) 2450 rpm, (B-6) 2650 rpm, (B-7) 2850 rpm, and (B-8) 3050 rpm. The experiment result of (B-1) to (B-8) of the samples (B) is shown in Chart 2. Further, as shown in the Chart 6, three points of B-1, B-4, and B-6 of the samples (B) are selected and the total point is defined as a standard 3 (parameter 3).

CHART 2

| Sample (B) | | | |
|---|---|---|---|
| Sample | Rotation rate (rpm) | Film thickness (μm) | Parameter 1 |
| B-1 | 1650 | 1.69 | 3 |
| B-2 | 1850 | 1.54 | 3 |
| B-3 | 2050 | 1.42 | 3 |
| B-4 | 2250 | 1.32 | 3 |
| B-5 | 2450 | 1.24 | 3 |
| B-6 | 2650 | 1.17 | 3 |
| B-7 | 2850 | 1.11 | 3 |
| B-8 | 3050 | 1.07 | 3 |
| Viscosity (mPa·s) | 28 | Parameter 2 | 3 |

A composition containing a siloxane polymer and MMB (boiling point: 174° C.) as a solvent is used as the composition containing an insulating material of the samples (C). The rotation rate of the application apparatus is set at (C-1) 650 rpm, (C-2) 850 rpm, (C-3) 1050 rpm, (C-4) 1250 rpm, and (C-5) 1450 rpm. The experiment result of (C-1) to (C-5) of the samples (C) is shown in Chart 3. Further, as shown in the Chart 6, three points of C-1, C-4, and C-6 of the samples (C) are selected and the total point is defined as a standard 3 (parameter 3).

CHART 3

| Sample (C) | | | |
|---|---|---|---|
| Sample | Rotation rate (rpm) | Film thickness (μm) | Parameter 1 |
| C-1 | 650 | 1.74 | 3 |
| C-2 | 850 | 1.49 | 3 |
| C-3 | 1050 | 1.3 | 1 |
| C-4 | 1250 | 1.14 | 3 |
| C-5 | 1450 | 1.02 | 2 |
| Viscosity (mPa·s) | 16.7 | Parameter 2 | 2.4 |

A siloxane polymer and a mixture of MMB 70% and PGMEA 30% by weight as a solvent are used for the composition containing an insulating material of the samples (D). The rotation rate of the application apparatus is set at (D-1) 1250 rpm, (D-2) 1450 rpm, (D-3) 1650 rpm, (D-4) 1850 rpm, (D-5) 2050 rpm, (D-6) 2250 rpm, (D-7) 2450 rpm, (D-8) 2650 rpm, (D-9) 2850 rpm, and (D-10) 3050 rpm. The experimental results of (D-1) to (D-10) of the samples (D) are shown in Chart 4. Further, as shown in the Chart 6, three points of D-1, D-4, and D-7 of the samples (D) are selected and the total point is defined as a standard 3 (parameter 3).

CHART 4

| Sample (D) | | | |
|---|---|---|---|
| Sample | Rotation rate (rpm) | Film thickness (μm) | Parameter 1 |
| D-1 | 1250 | 1.73 | 1 |
| D-2 | 1450 | 1.57 | 1 |
| D-3 | 1650 | 1.44 | 2 |
| D-4 | 1850 | 1.35 | 2 |
| D-5 | 2050 | 1.29 | 2 |
| D-6 | 2250 | 1.23 | 2 |
| D-7 | 2450 | 1.19 | 3 |
| D-8 | 2650 | 1.14 | 3 |
| D-9 | 2850 | 1.10 | 2 |

CHART 4-continued

Sample (D)

| Sample | Rotation rate (rpm) | Film thickness (μm) | Parameter 1 |
|---|---|---|---|
| D-10 | 3050 | 1.07 | 2 |
| Viscosity (mPa·s) | 14 | Parameter 2 | 2 |

A siloxane polymer and a mixture of MMB 70% and PGMEA (boiling point: 146° C.) 30% by weight as a solvent are used for the composition containing an insulating material of the sample (E). The rotation rate of the application apparatus is set at (E-1) 650 rpm, (E-2) 850 rpm, (E-3) 1050 rpm, and (E-4) 1250 rpm. The experiment result of (E-1) to (E-4) of the is shown in Chart 5. Further, as shown in the Chart 6, three points of E-1, E-4, and E-6 of the are selected and the total point is defined as a standard 3 (parameter 3).

CHART 5

Sample (E)

| Sample | Rotation rate (rpm) | Film thickness (μm) | Parameter 1 |
|---|---|---|---|
| E-1 | 650 | 1.65 | 1 |
| E-2 | 850 | 1.36 | 1 |
| E-3 | 1050 | 1.17 | 1 |
| E-4 | 1250 | 1.05 | 1 |
| Viscosity (mPa·s) | 8.3 | Parameter 2 | 1 |

Figure 25:
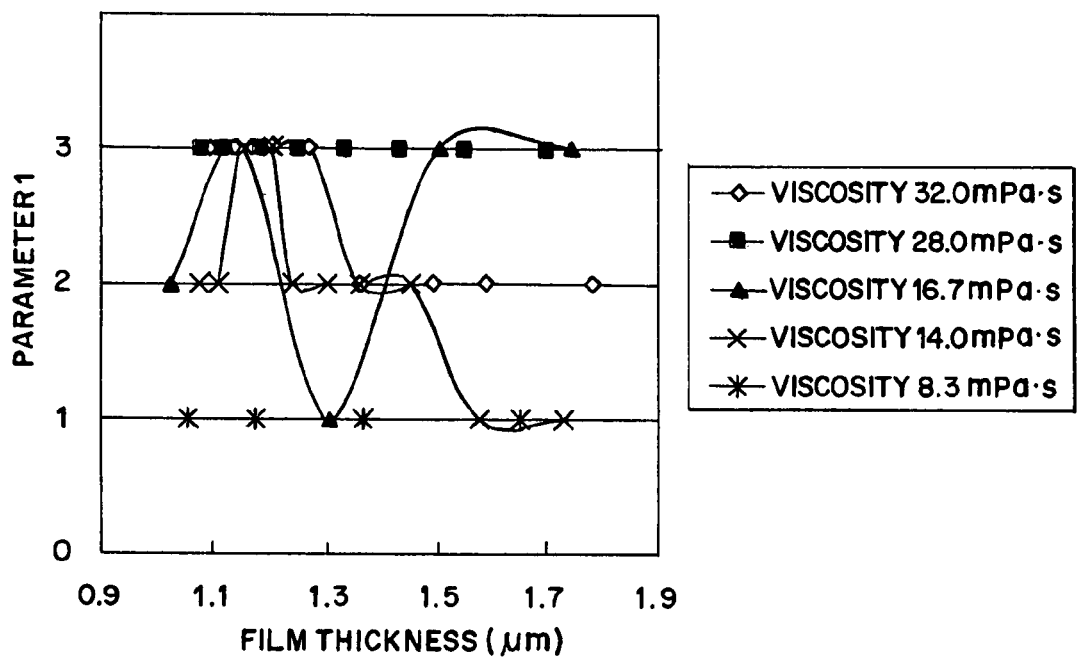
FIG. 25 is a graph showing the relation between the film thickness of a sample made in Example 1 and standard 1 (parameter 1).

In FIG. 25, the relation between the thickness and the degree of the light interference unevenness (interference fringes) of standard 1 (parameter 1) which can be seen by eyes in the viscosities (A) to (E). In FIG. 25, the samples (A) (viscosity: 32 mPa·s) is shown by outline diamond dots, the samples (B) (viscosity: 28 mPa·s) is shown with black square dots, the samples (C) (viscosity: 16.7 mPa·s) is shown with black triangle dots, the samples (D) (viscosity: 32 mPa·s) is shown with cross dots, and the (viscosity: 8.3 mPa·s) is shown with asterisk dots.

Figure 28:
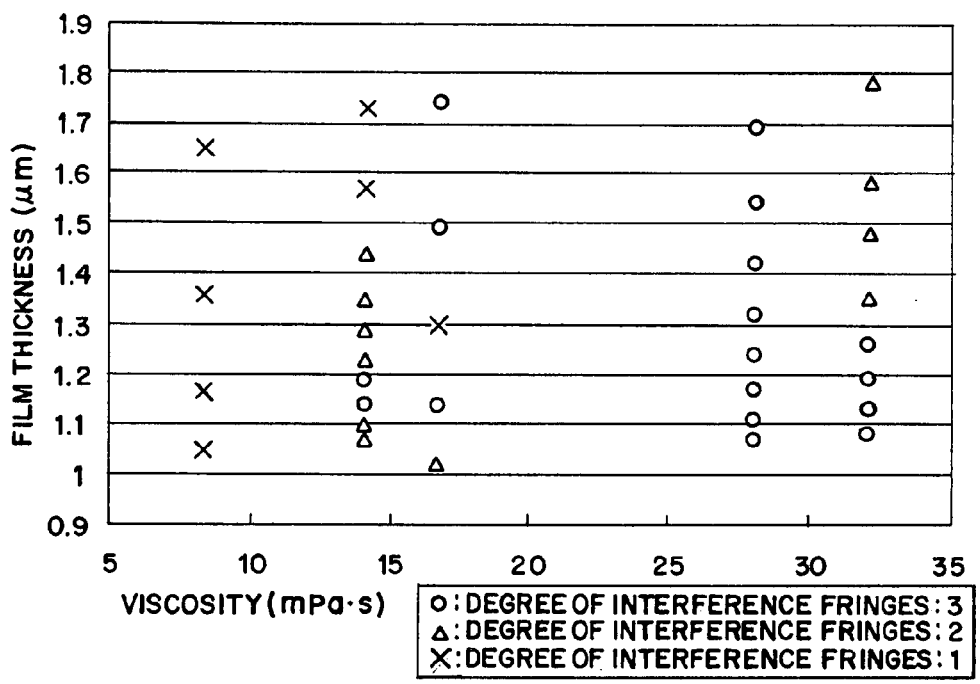
FIG. 28 is a graph showing the relation between the film thickness of a sample made in Example 1 and standard 4.

In FIG. 28, the relation between the viscosity and the thickness of each sample. In FIG. 28, as to the samples, cross dots show the case when the degree of light interference unevenness (interference fringes) is "1" with respect to the standard 1 (parameter 1), outline triangle dots show the case when the degree of light interference unevenness (interference fringes) is "2", and outline circle dots show the case when the degree of light interference unevenness (interference fringes) is "3". As to the samples (D) and (A), the thicker the film thickness is, the larger the degree of the light interference unevenness (interference fringes) tends to be.

Unevenness (interference fringes) is not observed in all the samples (B) with the viscosity of 28 mPa·s. On the other hand, unevenness (interference fringes) is observed in all the samples (E) with the viscosity of 8.3 mPa·s using a three wave lamp.

Next, the results of the standard 2 (parameter 2) and the standard 3 (parameter 3) with respect to the viscosities (A) to (E) are shown in the Chart 6. Further, the relation between the viscosity and the standard 2 (parameter 2) is shown in FIG. 26, and the relation between the viscosity and the standard 3 (parameter 3) is shown in FIG. 27.

CHART 6

| Sample | | Viscosity (mPa·s) | Parameter 1 | Parameter 3 |
|---|---|---|---|---|
| A | A-1 | 32 | 2 | 7 |
|   | A-4 |    | 2 |   |
|   | A-6 |    | 3 |   |
| B | B-1 | 28 | 3 | 9 |
|   | B-4 |    | 3 |   |
|   | B-6 |    | 3 |   |
| C | C-1 | 16.7 | 3 | 7 |
|   | C-3 |    | 1 |   |
|   | C-4 |    | 3 |   |
| D | D-1 | 14 | 1 | 6 |
|   | D-4 |    | 2 |   |
|   | D-7 |    | 3 |   |
| E | E-1 | 8.3 | 1 | 3 |
|   | E-2 |    | 1 |   |
|   | E-3 |    | 1 |   |

Figure 26:
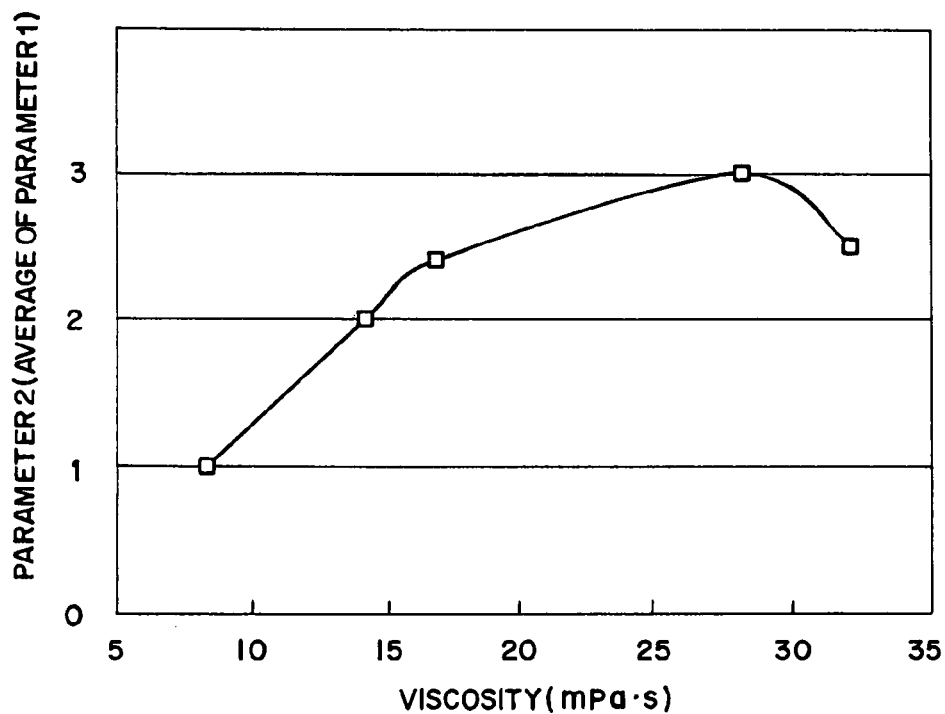
FIG. 26 is a graph showing the relation between the viscosity of a sample made in Example 1 and standard 2 (parameter 2).
Figure 27:
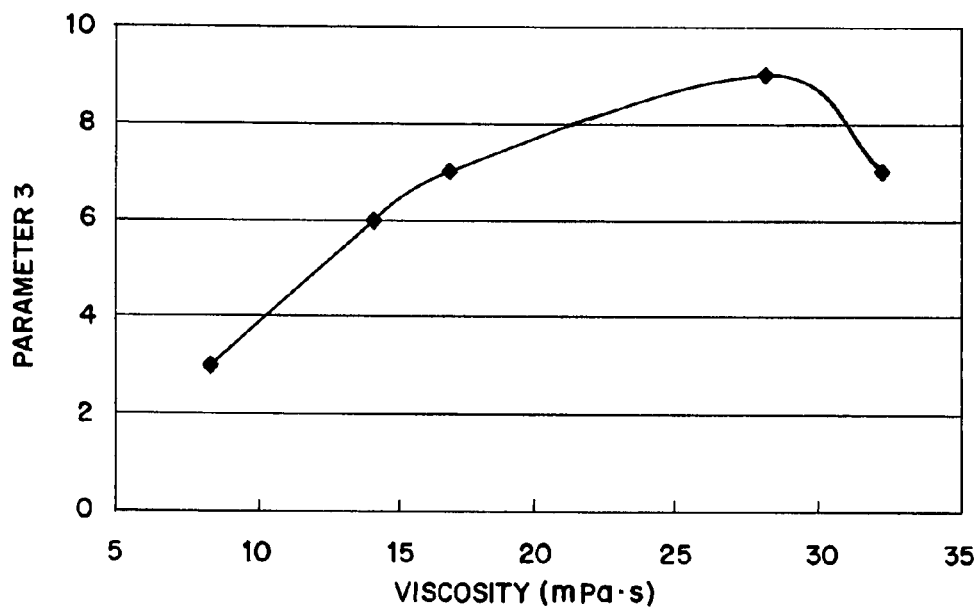
FIG. 27 is a graph showing the relation between the viscosity of a sample made in Example 1 and standard 3 (parameter 3).

As shown in FIG. 26 and FIG. 27, the change of the standard 2 (parameter 2) and the standard 3 (parameter 3) with respect to the viscosity is observed. In the case of the with the viscosity of 8.3 mPa·s, the standards (parameters) indicates the minimum points, and the standard 2 (parameter 2) and the standard 3 (parameter 3) get higher as the viscosity is increased as from the samples (D) with the viscosity of 14 mPa·s, the samples (C) with the viscosity of 16.7 mPa·s. The standard 2 (parameter 2) and the standard 3 (parameter 3) indicates the maximum in the case of the samples (B) with the viscosity of 28 mPa·s, and the standard 2 (parameter 2) and the standard 3 (parameter 3) reduces in the case of the samples (A) with the viscosity of 32 mPa·s.

Figure 29A:
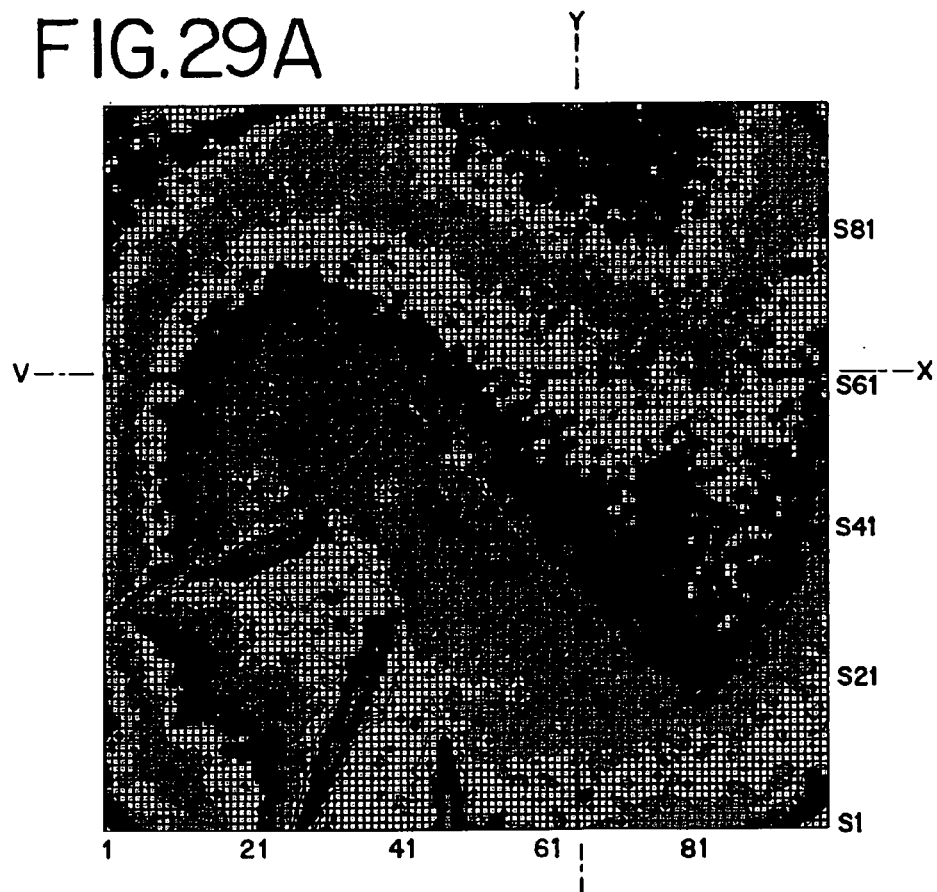
FIGS. 29A to 29C are figures showing the film thickness distributions of a sample to which the invention is applied.
Figure 29B:
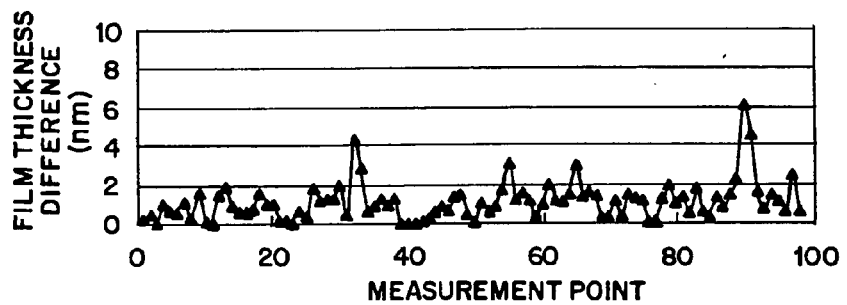
Figure 29C:
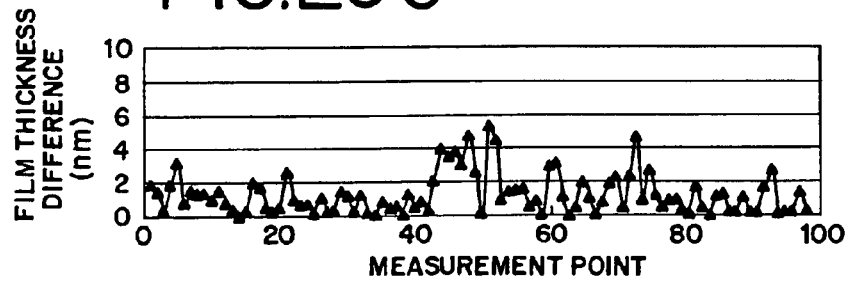

Further, the thickness distribution of the sample (B-8) according to the invention is measured more precisely, and shown in a two dimension conceptual drawing in which the thickness distribution is separated by colors. The conceptual drawing is shown in FIG. 29A, the film thickness distribution on line V-X in FIG. 29A is shown in FIG. 29B, and the thickness distribution on line Y-Z is shown in FIG. 29C. The sample is made in a similar manner as the other samples made in this example. A Cr film is formed over a 5 inch square glass substrate by sputtering to form an insulating film. The sample is divided into 99×99 (9801) measurement points, and the film thickness is measured at each measurement point. FIGS. 29B and 29C show the distribution of the difference between the thicknesses of adjacent measurement points.

Figure 33:
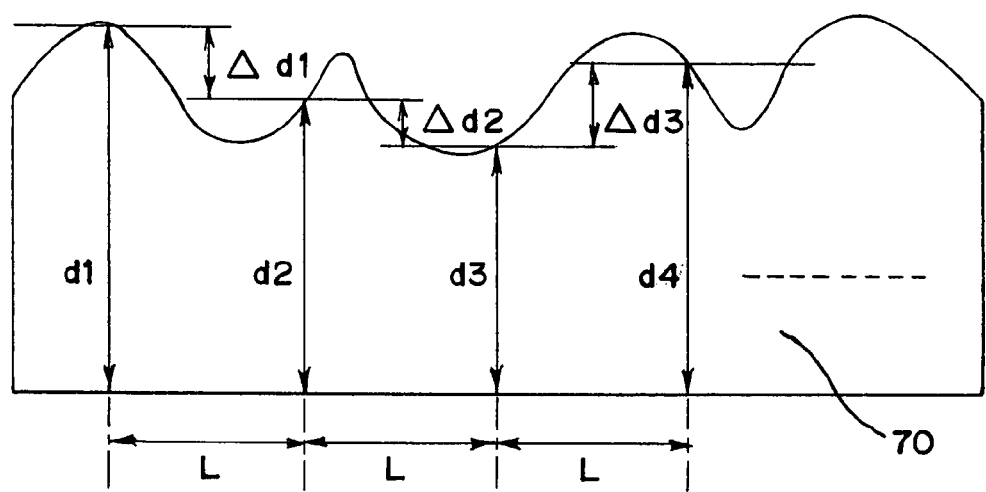
FIG. 33 is a figure showing a method for measuring an average value of a film thickness difference.

FIG. 33 shows a method for measuring the thickness difference. The film thicknesses of d1, d2, d3, and d4 of n points in the sample 70 are measured every L spacing, and the thickness difference between the adjacent measurement points d1 and d2 is Δd1. In the same manner, the thickness difference between d2 and d3 is Δd2, and the thickness difference between d3 and d4 is Δd3. The average of the thickness differences between respective measurement points shall be Δd. Since the sample has 5 inch square size, a side thereof is 127 mm long when 1 inch is defined as 25.4 mm. Since 99 measurement points are in a side, the spacing L is to be about 1 mm. The thickness d (1 to 99), the thickness differences between measurement points Δd (1 to 98), and the average of the thickness differences of measurement points GV 1 to GV 99 on line V-X are shown in Chart 7, and of measurement points GY 1 to GY 99 on line Y-Z are shown in Chart 8.

CHART 7

| measurement point | d(nm) | Δd(nm) |
|---|---|---|
| GV1 | 1055.4 | |
| | | 0.4 |
| GV2 | 1055.8 | |
| | | 0.5 |
| GV3 | 1055.3 | |
| | | 0.1 |
| GV4 | 1055.2 | |
| | | 1.1 |
| GV5 | 1054.1 | |
| | | 0.8 |
| GV6 | 1054.9 | |
| | | 0.7 |
| GV7 | 1055.6 | |
| | | 1.2 |
| GV8 | 1056.8 | |
| | | 0.4 |
| GV9 | 1057.2 | |
| | | 1.6 |
| GV10 | 1055.6 | |
| | | 0.2 |
| GV11 | 1055.4 | |
| | | 0.1 |
| GV12 | 1055.3 | |
| | | 1.6 |
| GV13 | 1053.7 | |
| | | 2 |
| GV14 | 1051.7 | |
| | | 1 |
| GV15 | 1052.7 | |
| | | 0.7 |
| GV16 | 1053.4 | |
| | | 0.7 |
| GV17 | 1052.7 | |
| | | 0.8 |
| GV18 | 1051.9 | |
| | | 1.6 |
| GV19 | 1053.5 | |
| | | 1.1 |
| GV20 | 1054.6 | |
| | | 1.1 |
| GV21 | 1053.5 | |
| | | 0.2 |
| GV22 | 1053.7 | |
| | | 0.2 |
| GV23 | 1053.5 | |
| | | 0.1 |
| GV24 | 1053.6 | |
| | | 0.7 |
| GV25 | 1054.3 | |
| | | 0.4 |
| GV26 | 1053.9 | |
| | | 1.9 |
| GV27 | 1052 | |
| | | 1.2 |
| GV28 | 1050.8 | |
| | | 1.3 |
| GV29 | 1052.1 | |
| | | 1.3 |
| GV30 | 1050.8 | |
| | | 2.1 |
| GV31 | 1052.9 | |
| | | 0.5 |
| GV32 | 1053.4 | |
| | | 4.3 |
| GV33 | 1049.1 | |
| | | 2.9 |
| GV34 | 1052 | |
| | | 0.7 |
| GV35 | 1051.3 | |
| | | 1 |
| GV36 | 1052.3 | |
| | | 1.3 |
| GV37 | 1051 | |
| | | 1 |
| GV38 | 1052 | |
| | | 1.3 |

CHART 7-continued

| measurement point | d(nm) | Δd(nm) |
|---|---|---|
| GV39 | 1050.7 | |
| | | 0 |
| GV40 | 1050.7 | |
| | | 0 |
| GV41 | 1050.7 | |
| | | 0 |
| GV42 | 1050.7 | |
| | | 0.1 |
| GV43 | 1050.6 | |
| | | 0.3 |
| GV44 | 1050.9 | |
| | | 0.6 |
| GV45 | 1050.3 | |
| | | 0.9 |
| GV46 | 1051.2 | |
| | | 0.7 |
| GV47 | 1051.9 | |
| | | 1.4 |
| GV48 | 1050.5 | |
| | | 1.5 |
| GV49 | 1049 | |
| | | 0.5 |
| GV50 | 1048.5 | |
| | | 0.1 |
| GV51 | 1048.6 | |
| | | 1.1 |
| GV52 | 1049.7 | |
| | | 0.6 |
| GV53 | 1049.1 | |
| | | 0.9 |
| GV54 | 1048.2 | |
| | | 1.7 |
| GV55 | 1046.5 | |
| | | 3.1 |
| GV56 | 1049.6 | |
| | | 1.2 |
| GV57 | 1048.4 | |
| | | 1.6 |
| GV58 | 1050 | |
| | | 1.2 |
| GV59 | 1048.8 | |
| | | 0.4 |
| GV60 | 1049.2 | |
| | | 1 |
| GV61 | 1050.2 | |
| | | 2.1 |
| GV62 | 1048.1 | |
| | | 1.2 |
| GV63 | 1046.9 | |
| | | 1.1 |
| GV64 | 1048 | |
| | | 1.5 |
| GV65 | 1049.5 | |
| | | 3 |
| GV66 | 1046.5 | |
| | | 1.4 |
| GV67 | 1047.9 | |
| | | 1.6 |
| GV68 | 1046.3 | |
| | | 1.4 |
| GV69 | 1047.7 | |
| | | 0.3 |
| GV70 | 1047.4 | |
| | | 0.3 |
| GV71 | 1047.7 | |
| | | 1.2 |
| GV72 | 1046.5 | |
| | | 0.4 |
| GV73 | 1046.1 | |
| | | 1.5 |
| GV74 | 1044.6 | |
| | | 1.3 |
| GV75 | 1045.9 | |
| | | 1.2 |
| GV76 | 1044.7 | |
| | | 0.1 |

CHART 7-continued

| measurement point | d(nm) | Δd(nm) |
|---|---|---|
| GV77 | 1044.8 | |
| | | 0.1 |
| GV78 | 1044.9 | |
| | | 1.3 |
| GV79 | 1043.6 | |
| | | 2 |
| GV80 | 1041.6 | |
| | | 1 |
| GV81 | 1042.6 | |
| | | 1.4 |
| GV82 | 1041.2 | |
| | | 0.5 |
| GV83 | 1041.7 | |
| | | 1.8 |
| GV84 | 1043.5 | |
| | | 0.6 |
| GV85 | 1042.9 | |
| | | 0.4 |
| GV86 | 1043.3 | |
| | | 1.3 |
| GV87 | 1042 | |
| | | 0.8 |
| GV88 | 1041.2 | |
| | | 1.5 |
| GV89 | 1042.7 | |
| | | 2.3 |
| GV90 | 1040.4 | |
| | | 6.2 |
| GV91 | 1046.6 | |
| | | 4.5 |
| GV92 | 1042.1 | |
| | | 1.6 |
| GV93 | 1040.5 | |
| | | 0.7 |
| GV94 | 1041.2 | |
| | | 1.5 |
| GV95 | 1042.7 | |
| | | 1.1 |
| GV96 | 1041.6 | |
| | | 0.6 |
| GV97 | 1042.2 | |
| | | 2.5 |
| GV98 | 1039.7 | |
| | | 0.6 |
| GV99 | 1040.3 | |
| average | | 1.2 |

CHART 8

| measurement point | d(nm) | Δd(nm) |
|---|---|---|
| GY1 | 1042.5 | |
| | | 1.9 |
| GY2 | 1044.4 | |
| | | 1.5 |
| GY3 | 1045.9 | |
| | | 0.4 |
| GY4 | 1046.3 | |
| | | 1.9 |
| GY5 | 1044.4 | |
| | | 3.3 |
| GY6 | 1047.7 | |
| | | 0.9 |
| GY7 | 1046.8 | |
| | | 1.6 |
| GY8 | 1048.4 | |
| | | 1.4 |
| GY9 | 1047 | |
| | | 1.4 |
| GY10 | 1048.4 | |
| | | 1 |
| GY11 | 1047.4 | |

CHART 8-continued

| measurement point | d(nm) | Δd(nm) |
|---|---|---|
| | | 1.6 |
| GY12 | 1049 | |
| | | 0.9 |
| GY13 | 1049.9 | |
| | | 0.5 |
| GY14 | 1050.4 | |
| | | 0 |
| GY15 | 1050.4 | |
| | | 0.4 |
| GY16 | 1050.8 | |
| | | 2.2 |
| GY17 | 1053 | |
| | | 1.8 |
| GY18 | 1051.2 | |
| | | 0.6 |
| GY19 | 1050.6 | |
| | | 0.3 |
| GY20 | 1050.9 | |
| | | 0.5 |
| GY21 | 1051.4 | |
| | | 2.6 |
| GY22 | 1054 | |
| | | 1 |
| GY23 | 1053 | |
| | | 0.7 |
| GY24 | 1052.3 | |
| | | 0.7 |
| GY25 | 1053 | |
| | | 0.2 |
| GY26 | 1052.8 | |
| | | 1.1 |
| GY27 | 1051.7 | |
| | | 0.4 |
| GY28 | 1052.1 | |
| | | 0.4 |
| GY29 | 1052.5 | |
| | | 1.5 |
| GY30 | 1051 | |
| | | 1.2 |
| GY31 | 1052.2 | |
| | | 0.3 |
| GY32 | 1052.5 | |
| | | 1.3 |
| GY33 | 1053.8 | |
| | | 0.2 |
| GY34 | 1053.6 | |
| | | 0 |
| GY35 | 1053.6 | |
| | | 0.8 |
| GY36 | 1052.8 | |
| | | 0.4 |
| GY37 | 1052.4 | |
| | | 0.6 |
| GY38 | 1051.8 | |
| | | 0.1 |
| GY39 | 1051.7 | |
| | | 1.2 |
| GY40 | 1052.9 | |
| | | 0.5 |
| GY41 | 1052.4 | |
| | | 0.8 |
| GY42 | 1051.6 | |
| | | 0.3 |
| GY43 | 1051.9 | |
| | | 2.2 |
| GY44 | 1054.1 | |
| | | 3.9 |
| GY45 | 1050.2 | |
| | | 3.5 |
| GY46 | 1053.7 | |
| | | 3.8 |
| GY47 | 1049.9 | |
| | | 3.1 |
| GY48 | 1046.8 | |
| | | 4.8 |
| GY49 | 1051.6 | |

CHART 8-continued

| measurement point | d(nm) | Δd(nm) |
|---|---|---|
| GY50 | 1049 | |
| | | 2.6 |
| GY51 | 1048.8 | |
| | | 0.2 |
| GY52 | 1043.4 | |
| | | 5.4 |
| GY53 | 1047.9 | |
| | | 4.5 |
| GY54 | 1048.9 | |
| | | 1 |
| GY55 | 1047.4 | |
| | | 1.5 |
| GY56 | 1049 | |
| | | 1.6 |
| GY57 | 1047.4 | |
| | | 1.6 |
| GY58 | 1047.9 | |
| | | 0.5 |
| GY59 | 1048.8 | |
| | | 0.9 |
| GY60 | 1048.9 | |
| | | 0.1 |
| GY61 | 1045.9 | |
| | | 3 |
| GY62 | 1049.1 | |
| | | 3.2 |
| GY63 | 1047.9 | |
| | | 1.2 |
| GY64 | 1047.9 | |
| | | 0 |
| GY65 | 1048.5 | |
| | | 0.6 |
| GY66 | 1046.5 | |
| | | 2 |
| GY67 | 1047.6 | |
| | | 1.1 |
| GY68 | 1047.5 | |
| | | 0.1 |
| GY69 | 1046.6 | |
| | | 0.9 |
| GY70 | 1044.7 | |
| | | 1.9 |
| GY71 | 1047 | |
| | | 2.3 |
| GY72 | 1046.5 | |
| | | 0.5 |
| GY73 | 1048.9 | |
| | | 2.4 |
| GY74 | 1044.2 | |
| | | 4.7 |
| GY75 | 1045.2 | |
| | | 1 |
| GY76 | 1047.9 | |
| | | 2.7 |
| GY77 | 1046.7 | |
| | | 1.2 |
| GY78 | 1047.2 | |
| | | 0.5 |
| GY79 | 1046.2 | |
| | | 1 |
| GY80 | 1047.2 | |
| | | 1 |
| GY81 | 1046.8 | |
| | | 0.4 |
| GY82 | 1046.9 | |
| | | 0.1 |
| GY83 | 1045.1 | |
| | | 1.8 |
| GY84 | 1045.6 | |
| | | 0.5 |
| GY85 | 1045.6 | |
| | | 0 |
| GY86 | 1046.8 | |
| | | 1.2 |
| GY87 | 1048.1 | |
| | | 1.3 |

CHART 8-continued

| measurement point | d(nm) | Δd(nm) |
|---|---|---|
| GY88 | 1047.8 | |
| | | 0.3 |
| GY89 | 1048.1 | |
| | | 0.3 |
| GY90 | 1047 | |
| | | 1.1 |
| GY91 | 1047.3 | |
| | | 0.3 |
| GY92 | 1047.7 | |
| | | 0.4 |
| GY93 | 1046 | |
| | | 1.7 |
| GY94 | 1048.7 | |
| | | 2.7 |
| GY95 | 1048.9 | |
| | | 0.2 |
| GY96 | 1049.2 | |
| | | 0.3 |
| GY97 | 1048.8 | |
| | | 0.4 |
| GY98 | 1050.2 | |
| | | 1.4 |
| GY99 | 1050.5 | |
| average | | 1.3 |

As shown in FIG. 29A, significant radial unevenness (interference fringes) is not shown in the conceptual drawing reflecting the thickness distribution. Further, as shown in FIGS. 29B and 29C, the thickness difference between the measurement points is about 6 nm or less. The average of the thickness difference between adjacent measurement points on line V-X is 1.2 nm, the average of the thickness difference between adjacent measurement points on line Y-Z is 1.3; therefore, the average thereof is about 1.3.

Figure 30A:
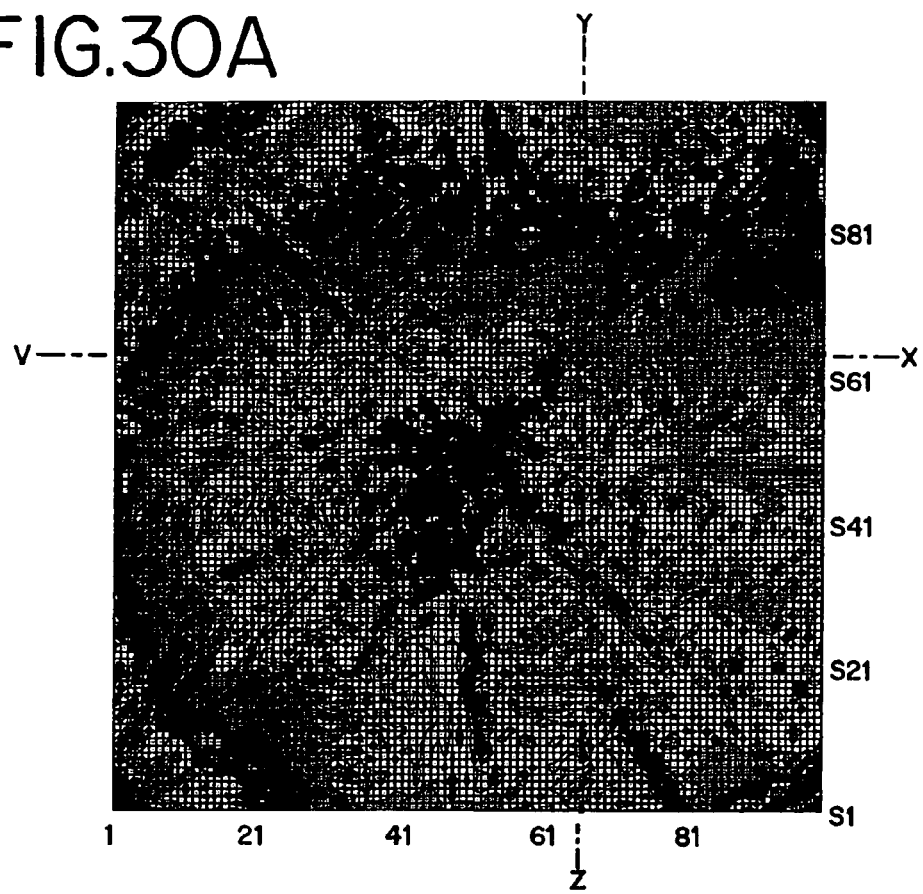
FIGS. 30A to 30C are figures showing the film thickness distribution of a sample of a comparative example.
Figure 30B:
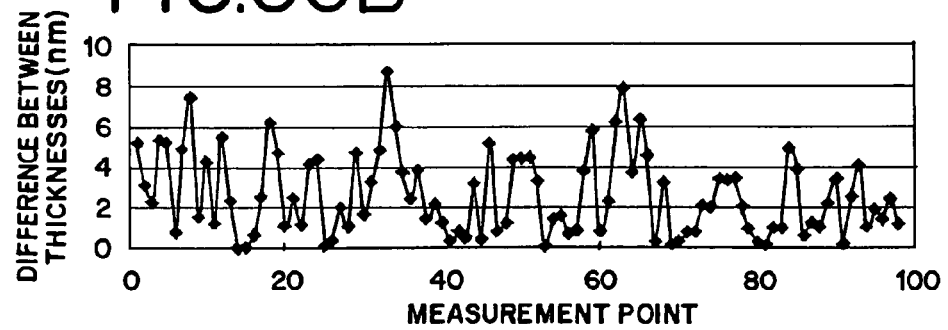
Figure 30C:
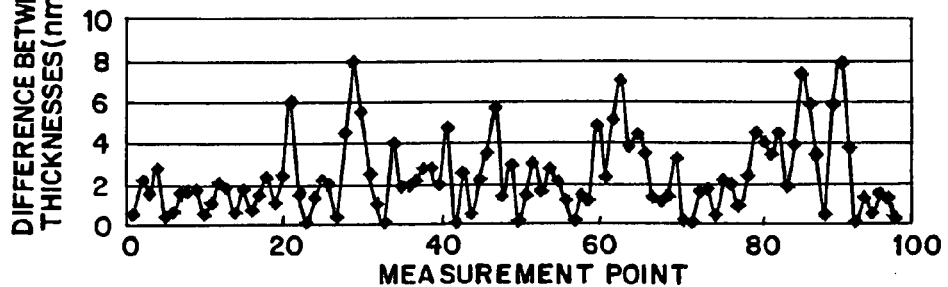

An insulating film where light interference unevenness (interference fringes) is seen by eyes is shown in FIGS. 30A to 30C as a comparative example. FIG. 30A shows a conceptual drawing reflecting the thickness distribution. FIG. 30B shows the thickness distribution on line V-X in FIG. 30A, and FIG. 30C shows the thickness distribution on line Y-Z. The sample of the comparative example is made with the same material as that formed at a rotation rate of 1950 rpm. As to the sample of the comparative example, the thickness d (1 to 99), the thickness difference between measurement points Δd (1 to 98), and the average of the thickness difference of measurement points MV 1 to MV 99 on line V-X are shown in Chart 9, and of measurement points MY 1 to MY 99 are shown in Chart 10.

CHART 9

| measurement point | d(nm) | Δd(nm) |
|---|---|---|
| MV1 | 888 | |
| | | 5.2 |
| MV2 | 893 | |
| | | 3.1 |
| MV3 | 896 | |
| | | 2.3 |
| MV4 | 894 | |
| | | 5.4 |
| MV5 | 888 | |
| | | 5.2 |
| MV6 | 893 | |
| | | 0.8 |
| MV7 | 893 | |
| | | 4.9 |

CHART 9-continued

| measurement point | d(nm) | Δd(nm) |
|---|---|---|
| MV8 | 888 | |
| | | 7.4 |
| MV9 | 895 | |
| | | 1.5 |
| MV10 | 894 | |
| | | 4.3 |
| MV11 | 889 | |
| | | 1.2 |
| MV12 | 888 | |
| | | 5.5 |
| MV13 | 894 | |
| | | 2.3 |
| MV14 | 891 | |
| | | 0.1 |
| MV15 | 891 | |
| | | 0 |
| MV16 | 891 | |
| | | 0.6 |
| MV17 | 892 | |
| | | 2.5 |
| MV18 | 890 | |
| | | 6.2 |
| MV19 | 896 | |
| | | 4.7 |
| MV20 | 891 | |
| | | 1.1 |
| MV21 | 890 | |
| | | 2.4 |
| MV22 | 892 | |
| | | 1.1 |
| MV23 | 891 | |
| | | 4.1 |
| MV24 | 887 | |
| | | 4.4 |
| MV25 | 892 | |
| | | 0.1 |
| MV26 | 891 | |
| | | 0.4 |
| MV27 | 891 | |
| | | 2 |
| MV28 | 889 | |
| | | 1 |
| MV29 | 888 | |
| | | 4.7 |
| MV30 | 893 | |
| | | 1.6 |
| MV31 | 894 | |
| | | 3.2 |
| MV32 | 891 | |
| | | 4.8 |
| MV33 | 886 | |
| | | 8.7 |
| MV34 | 895 | |
| | | 6 |
| MV35 | 889 | |
| | | 3.7 |
| MV36 | 892.7 | |
| | | 2.4 |
| MV37 | 890.3 | |
| | | 3.8 |
| MV38 | 894.1 | |
| | | 1.4 |
| MV39 | 892.7 | |
| | | 2.1 |
| MV40 | 890.6 | |
| | | 1.1 |
| MV41 | 891.7 | |
| | | 0.3 |
| MV42 | 891.4 | |
| | | 0.8 |
| MV43 | 892.2 | |
| | | 0.4 |
| MV44 | 892.6 | |
| | | 3.1 |
| MV45 | 895.7 | |
| | | 0.4 |
| MV46 | 895.3 | |
| | | 5.1 |
| MV47 | 890.2 | |
| | | 0.7 |
| MV48 | 890.9 | |
| | | 1.1 |
| MV49 | 889.8 | |
| | | 4.3 |
| MV50 | 894.1 | |
| | | 4.3 |
| MV51 | 889.8 | |
| | | 4.4 |
| MV52 | 894.2 | |
| | | 3.2 |
| MV53 | 891 | |
| | | 0 |
| MV54 | 891 | |
| | | 1.3 |
| MV55 | 889.7 | |
| | | 1.5 |
| MV56 | 891.2 | |
| | | 0.6 |
| MV57 | 890.6 | |
| | | 0.8 |
| MV58 | 889.8 | |
| | | 3.7 |
| MV59 | 886.1 | |
| | | 5.7 |
| MV60 | 891.8 | |
| | | 0.7 |
| MV61 | 892.5 | |
| | | 2.2 |
| MV62 | 890.3 | |
| | | 6.1 |
| MV63 | 896.4 | |
| | | 7.8 |
| MV64 | 888.6 | |
| | | 3.6 |
| MV65 | 892.2 | |
| | | 6.3 |
| MV66 | 885.9 | |
| | | 4.5 |
| MV67 | 890.4 | |
| | | 0.2 |
| MV68 | 890.2 | |
| | | 3.1 |
| MV69 | 887.1 | |
| | | 0.1 |
| MV70 | 887 | |
| | | 0.3 |
| MV71 | 887.3 | |
| | | 0.7 |
| MV72 | 888 | |
| | | 0.6 |
| MV73 | 887.4 | |
| | | 2 |
| MV74 | 889.4 | |
| | | 1.9 |
| MV75 | 891.3 | |
| | | 3.3 |
| MV76 | 888 | |
| | | 3.2 |
| MV77 | 884.8 | |
| | | 3.3 |
| MV78 | 888.1 | |
| | | 1.9 |
| MV79 | 886.2 | |
| | | 0.8 |
| MV80 | 885.4 | |
| | | 0.2 |
| MV81 | 885.6 | |
| | | 0 |
| MV82 | 885.6 | |
| | | 0.9 |
| MV83 | 884.7 | |
| | | 0.9 |

CHART 9-continued

| measurement point | d(nm) | Δd(nm) |
|---|---|---|
| MV84 | 885.6 | |
| | | 4.8 |
| MV85 | 880.8 | |
| | | 3.8 |
| MV86 | 884.6 | |
| | | 0.5 |
| MV87 | 884.1 | |
| | | 1.2 |
| MV88 | 882.9 | |
| | | 0.9 |
| MV89 | 882 | |
| | | 2.1 |
| MV90 | 884.1 | |
| | | 3.3 |
| MV91 | 880.8 | |
| | | 0.1 |
| MV92 | 880.9 | |
| | | 2.4 |
| MV93 | 883.3 | |
| | | 4 |
| MV94 | 879.3 | |
| | | 0.9 |
| MV95 | 880.2 | |
| | | 1.8 |
| MV96 | 882 | |
| | | 1.3 |
| MV97 | 880.7 | |
| | | 2.3 |
| MV98 | 878.4 | |
| | | 1.1 |
| MV99 | 879.5 | |
| average | | 2.6 |

CHART 10

| measurement point | d(nm) | Δd(nm) |
|---|---|---|
| MY1 | 883.8 | |
| | | 0.6 |
| MY2 | 883.2 | |
| | | 2.2 |
| MY3 | 881 | |
| | | 1.6 |
| MY4 | 882.6 | |
| | | 2.8 |
| MY5 | 885.4 | |
| | | 0.4 |
| MY6 | 885 | |
| | | 0.7 |
| MY7 | 884.3 | |
| | | 1.6 |
| MY8 | 885.9 | |
| | | 1.7 |
| MY9 | 887.6 | |
| | | 1.8 |
| MY10 | 885.8 | |
| | | 0.6 |
| MY11 | 885.2 | |
| | | 1.1 |
| MY12 | 884.1 | |
| | | 2.1 |
| MY13 | 886.2 | |
| | | 1.8 |
| MY14 | 888 | |
| | | 0.6 |
| MY15 | 888.6 | |
| | | 1.7 |
| MY16 | 890.3 | |
| | | 0.7 |
| MY17 | 889.6 | |
| | | 1.5 |
| MY18 | 891.1 | |

CHART 10-continued

| measurement point | d(nm) | Δd(nm) |
|---|---|---|
| | | 2.3 |
| MY19 | 888.8 | |
| | | 1.1 |
| MY20 | 887.7 | |
| | | 2.4 |
| MY21 | 885.3 | |
| | | 6 |
| MY22 | 891.3 | |
| | | 1.5 |
| MY23 | 889.8 | |
| | | 0.1 |
| MY24 | 889.7 | |
| | | 1.3 |
| MY25 | 891 | |
| | | 2.2 |
| MY26 | 888.8 | |
| | | 2 |
| MY27 | 890.8 | |
| | | 0.4 |
| MY28 | 890.4 | |
| | | 4.5 |
| MY29 | 885.9 | |
| | | 8 |
| MY30 | 893.9 | |
| | | 5.5 |
| MY31 | 888.4 | |
| | | 2.5 |
| MY32 | 890.9 | |
| | | 1.1 |
| MY33 | 889.8 | |
| | | 0.1 |
| MY34 | 889.9 | |
| | | 4 |
| MY35 | 893.9 | |
| | | 1.9 |
| MY36 | 892 | |
| | | 1.9 |
| MY37 | 890.1 | |
| | | 2.2 |
| MY38 | 887.9 | |
| | | 2.8 |
| MY39 | 890.7 | |
| | | 2.7 |
| MY40 | 893.4 | |
| | | 1.9 |
| MY41 | 891.5 | |
| | | 4.7 |
| MY42 | 886.8 | |
| | | 0.1 |
| MY43 | 886.9 | |
| | | 2.5 |
| MY44 | 889.4 | |
| | | 0.5 |
| MY45 | 889.9 | |
| | | 2.2 |
| MY46 | 892.1 | |
| | | 3.5 |
| MY47 | 888.6 | |
| | | 5.7 |
| MY48 | 894.3 | |
| | | 1.4 |
| MY49 | 892.9 | |
| | | 2.9 |
| MY50 | 890 | |
| | | 0.2 |
| MY51 | 890.2 | |
| | | 1.5 |
| MY52 | 891.7 | |
| | | 3 |
| MY53 | 888.7 | |
| | | 1.6 |
| MY54 | 890.3 | |
| | | 2.8 |
| MY55 | 887.5 | |
| | | 2.1 |
| MY56 | 889.6 | |

CHART 10-continued

| measurement point | d(nm) | Δd(nm) |
|---|---|---|
| MY57 | 890.8 | |
| | | 1.2 |
| MY58 | 890.6 | |
| | | 0.2 |
| MY59 | 892 | |
| | | 1.4 |
| MY60 | 890.9 | |
| | | 1.1 |
| MY61 | 886.1 | |
| | | 4.8 |
| MY62 | 888.4 | |
| | | 2.3 |
| MY63 | 893.5 | |
| | | 5.1 |
| MY64 | 886.5 | |
| | | 7 |
| MY65 | 890.3 | |
| | | 3.8 |
| MY66 | 885.9 | |
| | | 4.4 |
| MY67 | 889.4 | |
| | | 3.5 |
| MY68 | 888.1 | |
| | | 1.3 |
| MY69 | 889.2 | |
| | | 1.1 |
| MY70 | 890.6 | |
| | | 1.4 |
| MY71 | 887.4 | |
| | | 3.2 |
| MY72 | 887.2 | |
| | | 0.2 |
| MY73 | 887.3 | |
| | | 0.1 |
| MY74 | 888.9 | |
| | | 1.6 |
| MY75 | 887.2 | |
| | | 1.7 |
| MY76 | 887.6 | |
| | | 0.4 |
| MY77 | 889.8 | |
| | | 2.2 |
| MY78 | 887.9 | |
| | | 1.9 |
| MY79 | 887 | |
| | | 0.9 |
| MY80 | 889.3 | |
| | | 2.3 |
| MY81 | 884.9 | |
| | | 4.4 |
| MY82 | 888.9 | |
| | | 4 |
| MY83 | 885.5 | |
| | | 3.4 |
| MY84 | 889.9 | |
| | | 4.4 |
| MY85 | 888.1 | |
| | | 1.8 |
| MY86 | 884.3 | |
| | | 3.8 |
| MY87 | 891.6 | |
| | | 7.3 |
| MY88 | 885.8 | |
| | | 5.8 |
| MY89 | 889.2 | |
| | | 3.4 |
| MY90 | 888.7 | |
| | | 0.5 |
| MY91 | 882.9 | |
| | | 5.8 |
| MY92 | 890.7 | |
| | | 7.8 |
| MY93 | 887 | |
| | | 3.7 |
| MY94 | 887.1 | |
| | | 0.1 |

CHART 10-continued

| measurement point | d(nm) | Δd(nm) |
|---|---|---|
| MY95 | 888.4 | |
| | | 1.3 |
| MY96 | 887.9 | |
| | | 0.5 |
| MY97 | 886.4 | |
| | | 1.5 |
| MY98 | 887.6 | |
| | | 1.2 |
| MY99 | 887.3 | |
| | | 0.3 |
| average | | 2.4 |

As to a comparative example, significant radial unevenness (interference fringes) is shown in the conceptual drawing reflecting the thickness distribution as shown in FIG. 30A. Further, as shown in FIGS. 30B and 30C, the thickness differences between the measurement points are partially about 8 nm or more. As shown in FIGS. 30B and 30C, the average of the thickness differences between adjacent measurement points on arbitrary line V-X is 2.6 mm, the average of the thickness differences between adjacent measurement points on line Y-Z is 2.4; therefore, the average thereof is 2.5. The value is almost twice compared to the sample according to the invention. Thus, the comparative example has rough irregularities on the surface, which cause poor planarity.

As described above, it is confirmed that an insulating film with uniform distribution and high planarity can be formed by controlling the viscosity of the composition containing an insulating material, which is a coating material solution, to the viscosity range derived by the applicant.

According to the invention, in forming a liquid composition containing an insulating material as a coating solution, the viscosity can be controlled by selecting the concentration of the nonvolatile solute and the kind of the solvent. Therefore, a large vacuum apparatus or a large heating apparatus are not required; further, time and cost can be reduced. According to the invention, a highly planar film with uniform thickness distribution can be formed through a simple process with high yield.

What is claimed is:

1. A method for manufacturing a semiconductor device, comprising the steps of:
   forming a semiconductor layer;
   forming an insulating layer over the semiconductor layer;
   forming an opening in the insulating layer;
   forming a wiring layer connected to the semiconductor layer in the opening; and
   forming an electrode layer connected to the wiring layer,
   wherein the insulating layer is formed by spin coating with a composition containing an insulating material, and
   wherein the composition has a viscosity of from 10 mPa·s to 50 mPa·s.

2. A method for manufacturing a semiconductor device according to claim 1,
   wherein the insulating layer is formed by spin coating with a composition containing an insulating material, wherein the composition has a viscosity of from 20 mPa·s to 35 mPa·s.

3. A method for manufacturing a semiconductor device according to claim 1, wherein the insulating layer comprises a siloxane polymer.

4. A method for manufacturing a semiconductor device according to claim 1, the insulating layer is formed so as to have a thickness of from 0.1 µm to 10 µm.

5. A method for manufacturing a semiconductor device, comprising the steps of:
forming a semiconductor layer;
forming a first insulating layer over the semiconductor layer;
forming a first opening in the first insulating layer;
forming a wiring layer connected to the semiconductor layer in the first opening;
forming a second insulating layer over the first insulating layer and the wiring layer;
forming a second opening in the second insulating layer; and
forming an electrode layer connected to the wiring layer in the second opening,
wherein each of the first and the second insulating layers is formed by spin coating with a composition containing an insulating material, and
wherein the composition has a viscosity of from 10 mPa·s to 50 mPa·s.

6. A method for manufacturing a semiconductor device according to claim 5,
wherein each of the first and the second insulating layers is formed by spin coating with a composition containing an insulating material, and
wherein the composition has a viscosity of from 20 mPa·s to 35 mPa·s.

7. A method for manufacturing a semiconductor device according to claim 5, wherein each of the first and the second insulating layers comprises a siloxane polymer.

8. A method for manufacturing a semiconductor device according to claim 5, wherein each of the first and the second insulating layers is formed so as to have a thicknesses of from 0.1 µm to 10 µm.

9. A method for manufacturing a semiconductor device according to claim 1,
wherein the semiconductor layer is formed over a substrate having an insulating surface, the semiconductor layer has a source region and a drain region, and the wiring layer is connected to the source region or the drain region.

10. A method for manufacturing a semiconductor device according to claim 5,
wherein the semiconductor layer is formed over a substrate having an insulating surface, the semiconductor layer has a source region and a drain region, and the wiring layer is connected to the source region or the drain region.

11. A method for manufacturing a semiconductor device according to claim 9,
wherein a flexible substrate is used as the substrate having an insulating surface.

12. A method for manufacturing a semiconductor device according to claim 10,
wherein a flexible substrate is used as the substrate having an insulating surface.

13. A method for manufacturing a display device, comprising the steps of:
forming a semiconductor layer;
forming an insulating layer over the semiconductor layer;
forming an opening in the insulating layer;
forming a wiring layer connected to the semiconductor layer in the opening; and
forming an a pixel electrode over the wiring layer and connected to the wiring layer,
wherein the insulating layer is formed by spin coating with a composition containing an insulating material, and
wherein the composition has a viscosity of from 10 mPa·s to 50 mPa·s.

14. A method for manufacturing a display device according to claim 13,
wherein the insulating layer is formed by spin coating with a composition containing an insulating material, and
wherein the composition has a viscosity of from 20 mPa·s to 35 mPa·s.

15. A method for manufacturing a display device according to claim 13, wherein the insulating layer comprises a siloxane polymer.

16. A method for manufacturing a display device according to claim 13, wherein the insulating layer is formed so to have a thickness of from 0.1 µm to 10 µm.

17. A method for manufacturing a display device, comprising the steps of:
forming a semiconductor layer;
forming a first insulating layer over the semiconductor layer;
forming a first opening in the first insulating layer;
forming a wiring layer connected to the semiconductor layer in the first opening;
forming a second insulating layer over the first insulating layer and the wiring layer;
forming a second opening in the second insulating layer; and
forming a pixel electrode layer over the wiring layer and connected to the wiring layer in the second opening,
wherein each of the first and the second insulating layers is formed by spin coating with a composition containing an insulating material, and
wherein the composition has a viscosity of from 10 mPa·s to 50 mPa·s.

18. A method for manufacturing a display device according to claim 17,
wherein each of the first and the second insulating layers is formed by spin coating with a composition containing an insulating material, and
wherein the composition has a viscosity of from 20 mPa·s to 35 mPa·s.

19. A method for manufacturing a display device according to claim 17, wherein each of the first and the second insulating layers comprises a siloxane polymer.

20. A method for manufacturing a display device according to claim 17, wherein each of the first and the second insulating layers is formed so as to have a thicknesses of from 0.1 µm to 10 µm.

21. A method for manufacturing a display device according to claim 13,
wherein the semiconductor layer is formed over a substrate having an insulating surface, the semiconductor layer has a source region and a drain region, and the wiring layer is connected to the source region or the drain region.

22. A method for manufacturing a display device according to claim 17,
wherein the semiconductor layer is formed over a substrate having an insulating surface, the semiconductor layer has a source region and a drain region, and the wiring layer is connected to the source region or the drain region.

23. A method for manufacturing a display device according to claim 21,
wherein a flexible substrate is used as the substrate having an insulating surface.

24. A method for manufacturing a display device according to claim 22,
wherein a flexible substrate is used as the substrate having an insulating surface.

25. A display device according to claim 13,
wherein an electroluminescent layer is formed over the pixel electrode.

26. A display device according to claim 17,
wherein an electroluminescent layer is formed over the pixel electrode.

27. A display device according to claim 13,
wherein a liquid crystal element is formed over the pixel electrode.

28. A display device according to claim 17,
wherein a liquid crystal element is formed over the pixel electrode.

* * * * *